United States Patent
Zhang et al.

(10) Patent No.: US 11,313,876 B2
(45) Date of Patent: Apr. 26, 2022

(54) 3-AXIS ANGULAR ACCELEROMETER

(71) Applicant: Analog Devices, Inc., Norwood, MA (US)

(72) Inventors: Xin Zhang, Acton, MA (US);
Jianglong Zhang, Vienna, VA (US);
Alan O'Donnell, Castletroy (IE)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 16/775,316

(22) Filed: Jan. 29, 2020

(65) Prior Publication Data

US 2020/0241036 A1  Jul. 30, 2020

Related U.S. Application Data

(63) Continuation of application No. 15/400,109, filed on Jan. 6, 2017, now Pat. No. 10,585,111.

(51) Int. Cl.
*G01P 15/00* (2006.01)
*G01N 11/04* (2006.01)
(Continued)

(52) U.S. Cl.
CPC ............ *G01P 15/125* (2013.01); *B81B 3/001* (2013.01); *B81B 3/0051* (2013.01);
(Continued)

(58) Field of Classification Search
None
See application file for complete search history.

(56) References Cited

U.S. PATENT DOCUMENTS

| | | | |
|---|---|---|---|
| 4,448,081 A * | 5/1984 | Kolitsch | G01F 1/28 73/861.03 |
| 5,251,484 A | 10/1993 | Mastache | |

(Continued)

FOREIGN PATENT DOCUMENTS

| | | |
|---|---|---|
| CN | 1813192 A | 8/2006 |
| CN | 1813194 A | 8/2006 |

(Continued)

OTHER PUBLICATIONS

Extended European Search Report dated Jun. 9, 2017 in connection with European Application No. EP 16206408.3.

(Continued)

*Primary Examiner* — Jill E Culler
*Assistant Examiner* — Ruben C Parco, Jr.
(74) *Attorney, Agent, or Firm* — Wolf, Greenfield & Sacks, P.C.

(57) ABSTRACT

Angular accelerometers are described, as are systems employing such accelerometers. The angular accelerometers may include a proof mass and rotational acceleration detection beams directed toward the center of the proof mass. The angular accelerometers may include sensing capabilities for angular acceleration about three orthogonal axes. The sensing regions for angular acceleration about one of the three axes may be positioned radially closer to the center of the proof mass than the sensing regions for angular acceleration about the other two axes. The proof mass may be connected to the substrate though one or more anchors.

15 Claims, 35 Drawing Sheets

Related U.S. Application Data

(60) Provisional application No. 62/330,788, filed on May 2, 2016, provisional application No. 62/276,217, filed on Jan. 7, 2016.

(51) Int. Cl.
| | | |
|---|---|---|
| *G01P 15/125* | (2006.01) | |
| *G01P 15/18* | (2013.01) | |
| *G01P 15/08* | (2006.01) | |
| *B81B 3/00* | (2006.01) | |

(52) U.S. Cl.
CPC .......... *B81B 3/0062* (2013.01); *B81B 3/0072* (2013.01); *G01P 15/0888* (2013.01); *G01P 15/18* (2013.01); *B81B 2201/0235* (2013.01); *B81B 2201/033* (2013.01); *B81B 2203/0307* (2013.01); *B81B 2203/056* (2013.01); *G01P 2015/0871* (2013.01); *G01P 2015/0874* (2013.01)

(56) References Cited

U.S. PATENT DOCUMENTS

| | | | |
|---|---|---|---|
| 5,349,858 A | 9/1994 | Yagi et al. | |
| 5,415,040 A | 5/1995 | Nottmeyer | |
| 5,955,800 A | 9/1999 | Shearwood et al. | |
| 6,082,197 A | 7/2000 | Mizuno et al. | |
| 6,158,280 A | 12/2000 | Nonomura et al. | |
| 6,393,914 B1 | 5/2002 | Zarabadi et al. | |
| 6,401,536 B1 | 6/2002 | O'Brien | |
| 6,508,124 B1 | 1/2003 | Zerbini et al. | |
| 6,520,017 B1 | 2/2003 | Schoefthaler et al. | |
| 7,934,423 B2 | 5/2011 | Nasiri et al. | |
| 8,960,002 B2 | 2/2015 | Nasiri et al. | |
| 8,984,941 B2 | 3/2015 | Netzer et al. | |
| 9,601,278 B2 | 3/2017 | Jiang et al. | |
| 9,620,698 B2 | 4/2017 | Lane et al. | |
| 9,620,700 B2 | 4/2017 | Chen | |
| 10,585,111 B2 | 3/2020 | Zhang et al. | |
| 2002/0007665 A1* | 1/2002 | Miura | G01N 11/162 73/54.25 |
| 2002/0017133 A1 | 2/2002 | Cho | |
| 2002/0109207 A1 | 8/2002 | Rich et al. | |
| 2006/0037397 A1 | 2/2006 | Memishian | |
| 2008/0139951 A1* | 6/2008 | Patangay | A61B 5/02007 600/504 |
| 2009/0076665 A1* | 3/2009 | Hoisington | G05D 1/0044 701/2 |
| 2009/0241659 A1* | 10/2009 | Yoshida | G01P 7/00 73/170.07 |
| 2010/0300204 A1 | 12/2010 | Reinmuth | |
| 2012/0240679 A1 | 9/2012 | Netzer et al. | |
| 2012/0304365 A1* | 12/2012 | Howard | A42B 3/046 2/410 |
| 2013/0247666 A1 | 9/2013 | Acar | |
| 2014/0001580 A1 | 1/2014 | Bolognia et al. | |
| 2014/0190543 A1 | 7/2014 | Chen | |
| 2014/0205127 A1 | 7/2014 | Khenkin et al. | |
| 2014/0211957 A1 | 7/2014 | Bolognia et al. | |
| 2014/0246066 A1 | 9/2014 | Chen et al. | |
| 2014/0260608 A1 | 9/2014 | Lin et al. | |
| 2015/0041929 A1 | 2/2015 | Bolognia | |
| 2015/0355222 A1 | 12/2015 | Zhang et al. | |
| 2016/0064149 A1 | 3/2016 | Jiang et al. | |
| 2016/0064637 A1 | 3/2016 | Cornett et al. | |
| 2016/0099208 A1 | 4/2016 | Chen | |
| 2016/0104581 A1 | 4/2016 | Jiang et al. | |
| 2016/0133816 A1 | 5/2016 | Cornett et al. | |
| 2016/0204492 A1 | 7/2016 | Jiang et al. | |
| 2017/0025594 A1 | 1/2017 | McGuinness et al. | |
| 2017/0084888 A1 | 3/2017 | Chen | |
| 2017/0117824 A1 | 4/2017 | Jiang et al. | |
| 2017/0141668 A1 | 5/2017 | Xing et al. | |
| 2017/0290562 A1 | 10/2017 | Corl | |
| 2017/0328931 A1 | 11/2017 | Zhang et al. | |
| 2021/0330200 A1 | 10/2021 | Al-Ali et al. | |

FOREIGN PATENT DOCUMENTS

| | | |
|---|---|---|
| CN | 102597699 A | 7/2012 |
| CN | 102679969 A | 9/2012 |
| CN | 103221779 A | 7/2013 |
| CN | 106931957 A | 7/2017 |
| CN | 106950398 A | 7/2017 |
| CN | 109387668 A | 2/2019 |
| EP | 1 083 144 A1 | 3/2001 |
| EP | 1 207 371 A1 | 5/2002 |
| EP | 1 340 985 A1 | 9/2003 |
| JP | H05142249 A | 6/1993 |
| JP | H05264577 A | 10/1993 |
| JP | H07306223 A | 11/1995 |
| JP | 2003020924 A * | 1/2003 |
| JP | 2013007622 A | 1/2013 |
| JP | 2020052049 A2 | 4/2020 |
| WO | WO 01/59465 A1 | 8/2001 |

OTHER PUBLICATIONS

Extended European Search Report dated Aug. 1, 2019 in connection with European Application No. 19175388.8.

[No Author Listed], Making Sense of IoT Standards. White Paper. Redbend. Mar. 2015; 11 pages.

Burdett, Ultra-Low-Power Wireless Systems. IEEE Solid-State Circuits Magazine. Jun. 25, 2015; Spring:18-28.

* cited by examiner

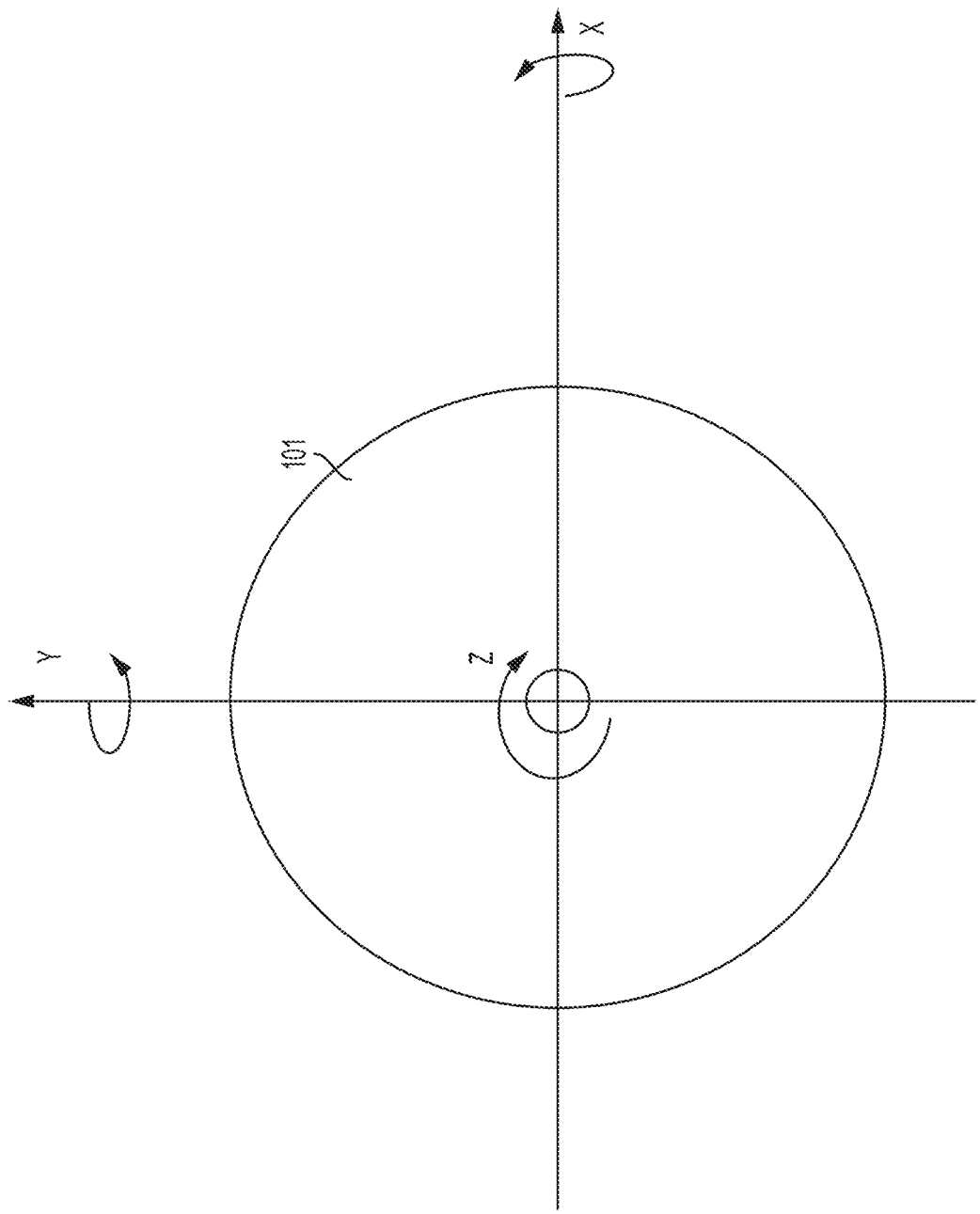

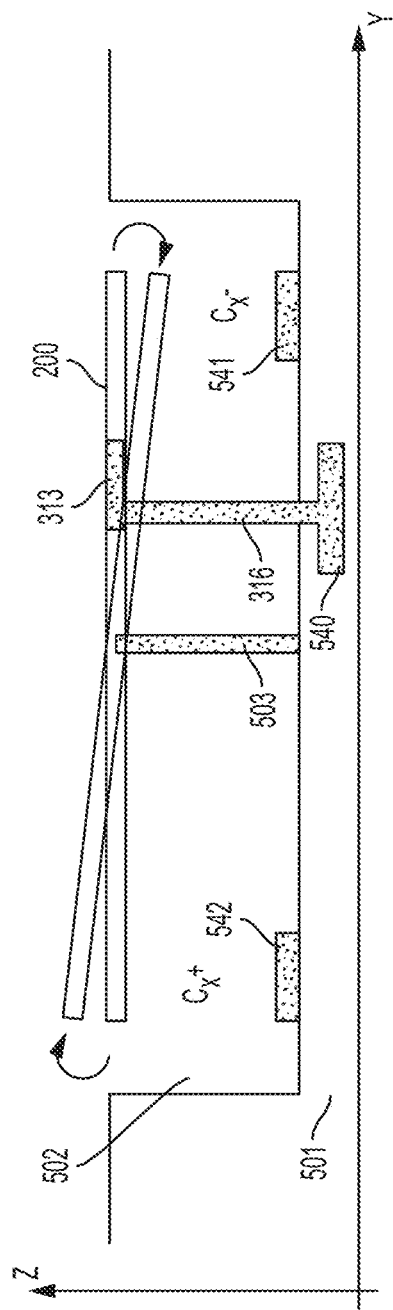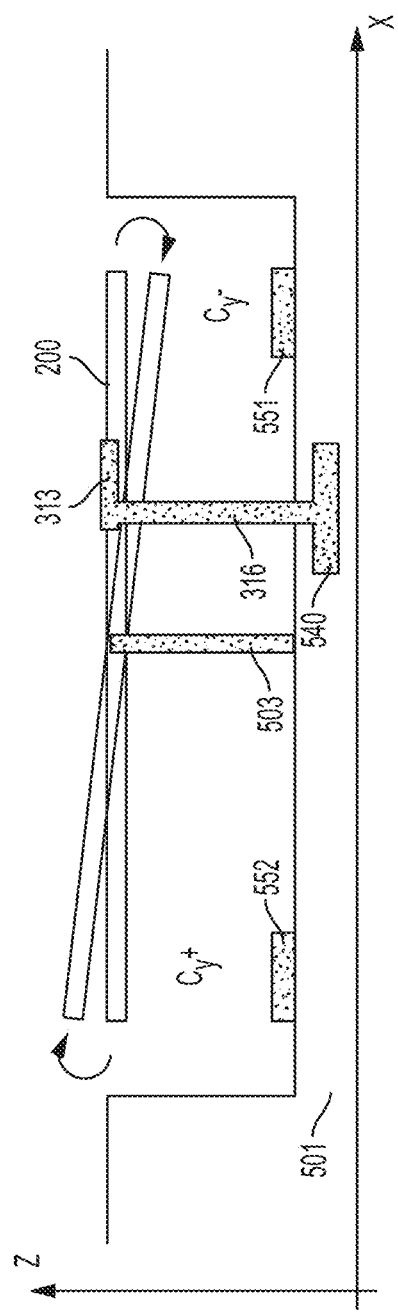
FIG. 5A
FIG. 5B

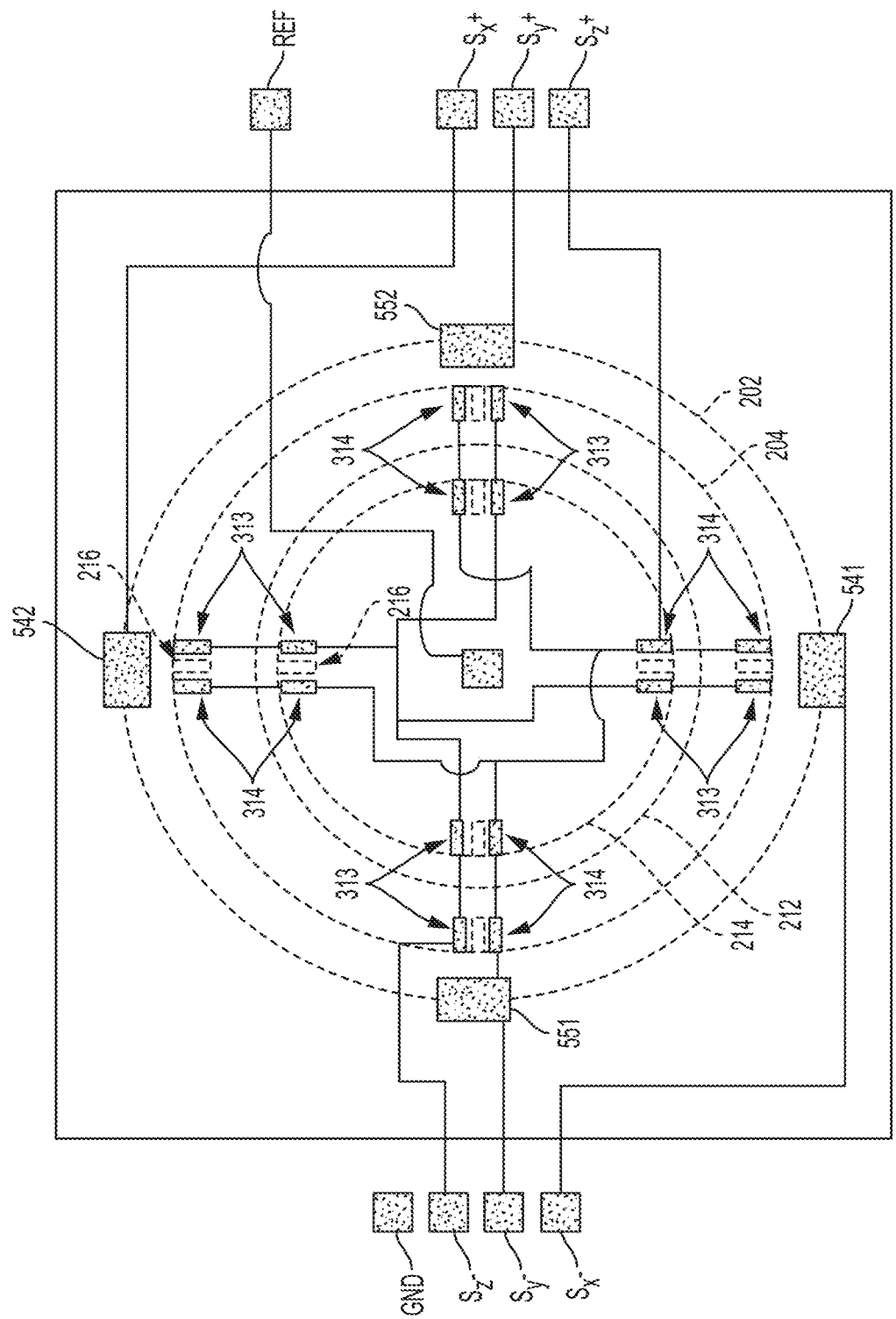

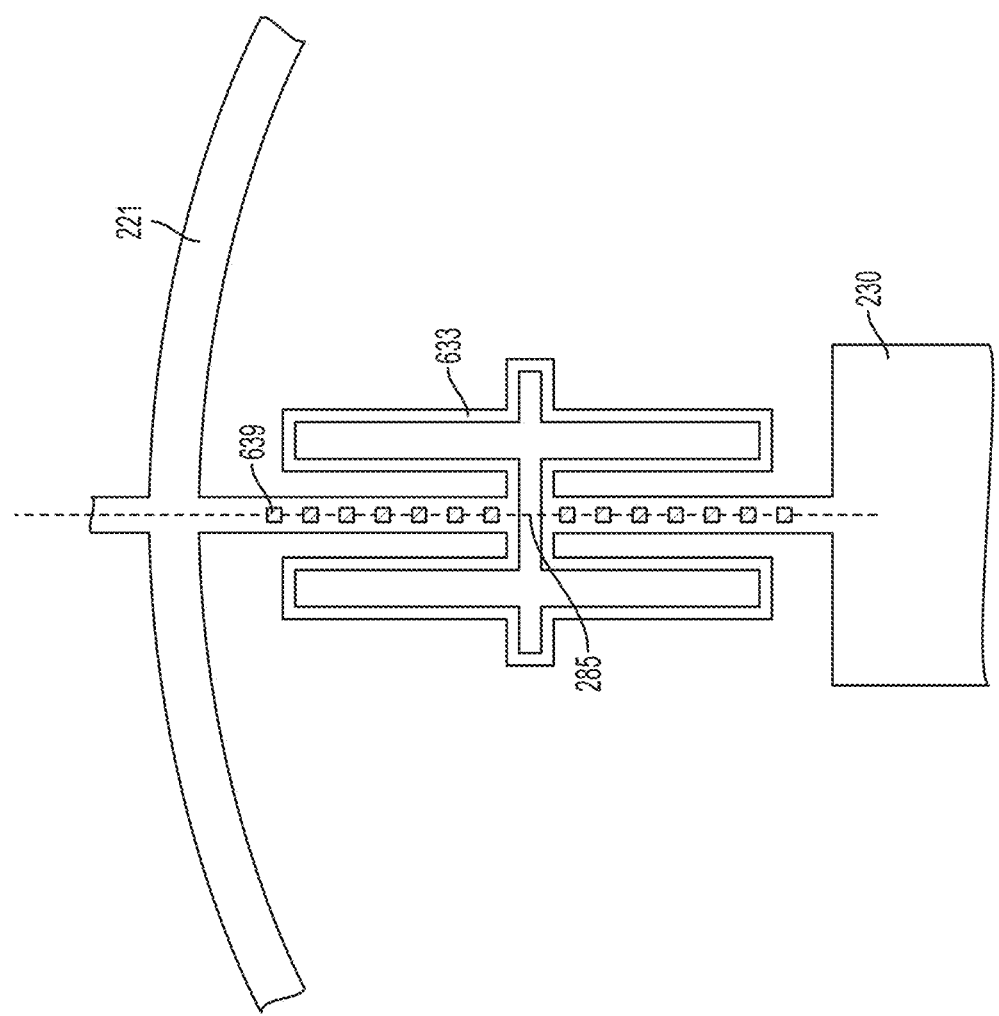

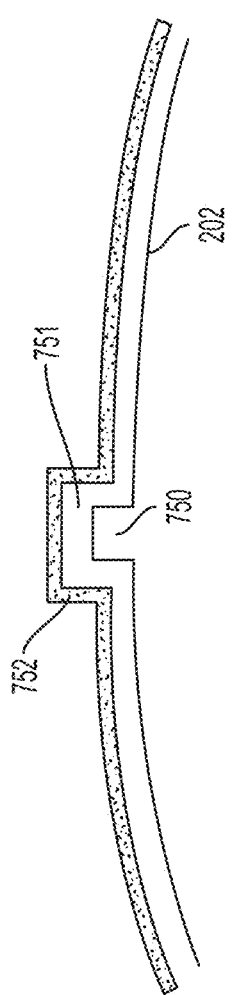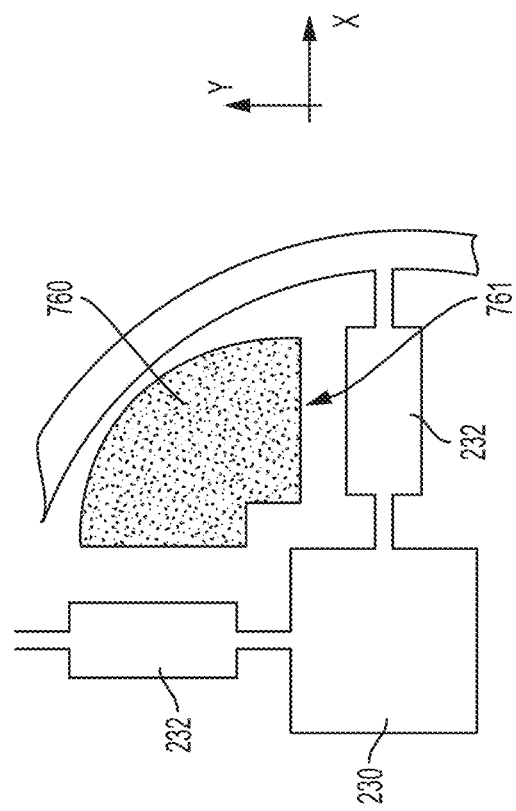
FIG. 7A
FIG. 7B

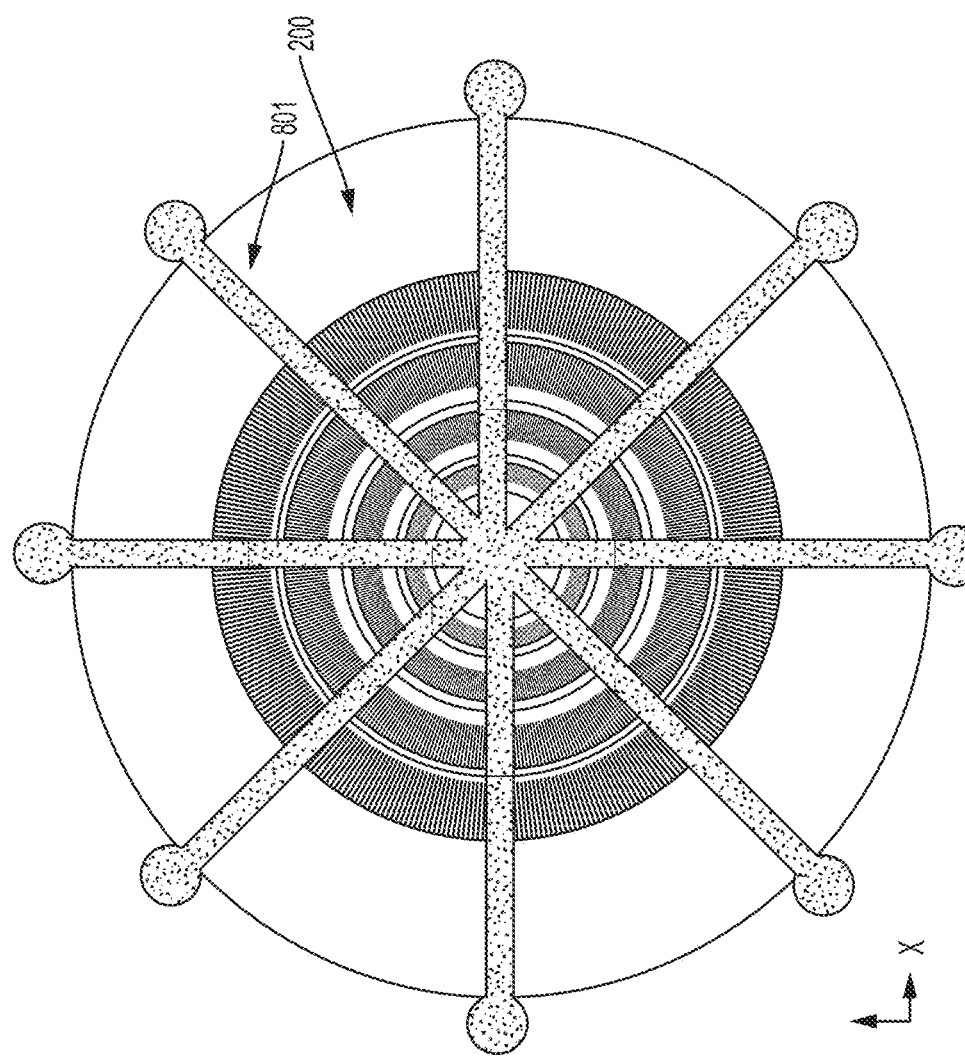

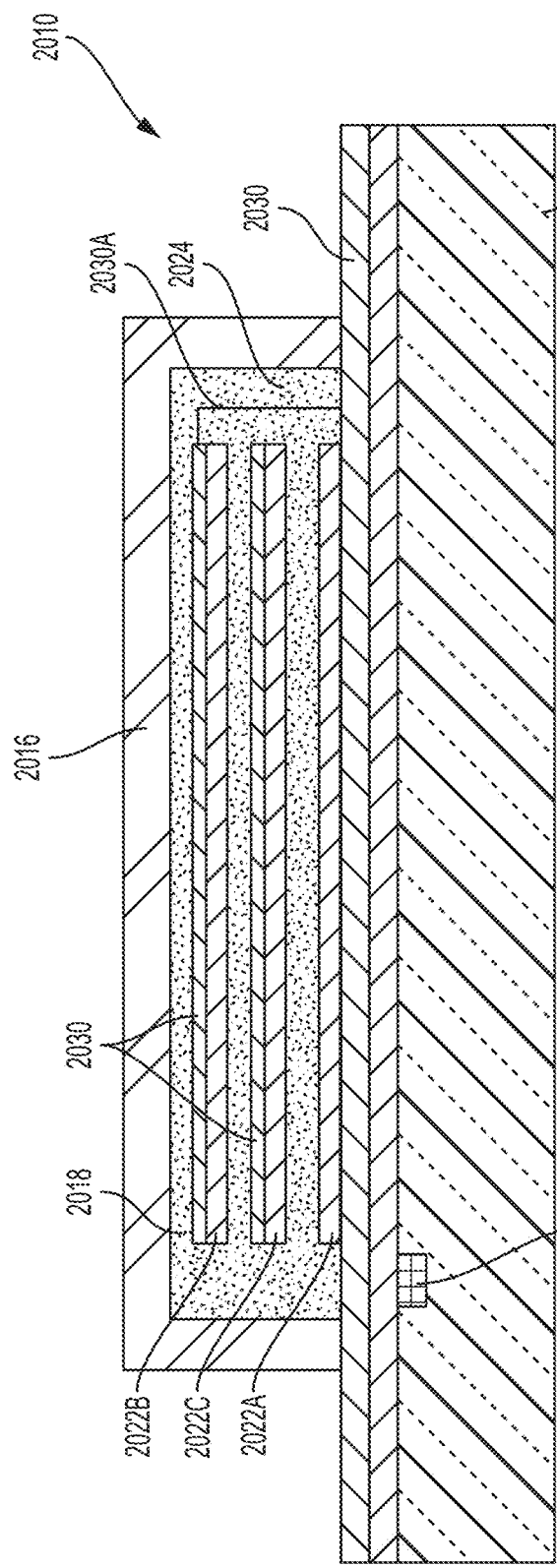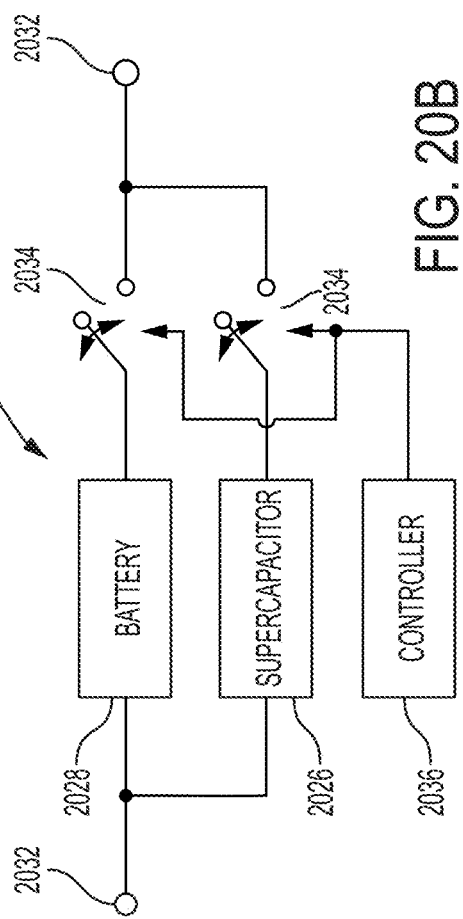
FIG. 20A
FIG. 20B

3-AXIS ANGULAR ACCELEROMETER

CROSS-REFERENCE TO RELATED APPLICATIONS

This application is a continuation claiming the benefit under 35 U.S.C. § 120 of U.S. application Ser. No. 15/400,109, entitled "3-AXIS ANGULAR ACCELEROMETER", filed Jan. 6, 2017, which is hereby incorporated herein by reference in its entirety.

U.S. application Ser. No. 15/400,109 claims priority under 35 U.S.C. § 119(e) to U.S. Provisional Application Ser. No. 62/330,788, entitled "3-AXIS ANGULAR ACCELEROMETER," filed on May 2, 2016, which is hereby incorporated herein by reference in its entirety.

U.S. application Ser. No. 15/400,109 claims priority under 35 U.S.C. § 119(e) to U.S. Provisional Application Ser. No. 62/276,217, entitled "3-AXIS ANGULAR ACCELEROMETER," filed on Jan. 7, 2016, which is hereby incorporated herein by reference in its entirety.

FIELD OF THE DISCLOSURE

The present application relates to micro-electromechanical systems (MEMS) angular accelerometers.

BACKGROUND

MEMS angular accelerometers are configured to detect angular accelerations of a proof mass about one or more axis. The proof mass is typically suspended above the substrate. In some MEMS angular accelerometers, detection of angular acceleration is achieved by using one or more capacitive sensors.

SUMMARY OF THE DISCLOSURE

Angular accelerometers are described, as are systems employing such accelerometers. The angular accelerometers may include a proof mass and rotational acceleration detection beams directed toward the center of the proof mass. The angular accelerometers may include sensing capabilities for angular acceleration about three orthogonal axes. The sensing regions for angular acceleration about one of the three axes may be positioned radially closer to the center of the proof mass than the sensing regions for angular acceleration about the other two axes. The proof mass may be connected to the substrate though one or more anchors.

In certain embodiments, an apparatus for angular acceleration detection is provided, comprising a proof mass having an outer edge bounding a first area, an inner edge disposed within the first area and bounding a second area smaller than the first area, and a center disposed within the second area. The proof mass further comprises a plurality of beams fixed to the inner edge of the proof mass and extending toward the center of the proof mass.

In certain embodiments, an angular accelerometer is provided, comprising a proof mass having an outer periphery and a center and a plurality of free-end beams having respective fixed ends proximate the periphery and respective free ends proximate the center.

In certain embodiments, a method of sensing angular acceleration is provided, comprising sensing angular acceleration of a proof mass about a rotation axis by detecting motion of a plurality of free-end beams having respective fixed ends proximate a periphery of the proof mass and respective free ends proximate a center of the proof mass.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIG. 1 illustrates schematically a proof mass of an angular accelerometer, where the proof mass may be configured to detect movements about the x-axis, the y-axis and/or the z-axis, according to a non-limiting embodiment of the present application.

FIG. 5A is the side view of a yz-plane of an angular accelerometer comprising a proof mass, an anchoring post and x-sensing electrodes, according to a non-limiting embodiment of the present application.

FIG. 5B is the side view of an xz-plane of an angular accelerometer comprising a proof mass, an anchoring post and y-sensing electrodes, according to a non-limiting embodiment of the present application.

FIG. 5C is a top view of an angular accelerometer comprising x-sensing electrodes, y-sensing electrodes and z-sensing electrodes, according to a non-limiting embodiment of the present application.

FIG. 6B is a top view of a portion of an angular accelerometer having a symmetric tether, according to a non-limiting embodiment of the present application.

FIG. 7A is a top view illustrating a movement stopper disposed alongside an outer edge of a proof mass, according to a non-limiting embodiment of the present application.

FIG. 7B is a top view illustrating a movement stopper disposed near the center of a proof mass, according to a non-limiting embodiment of the present application.

FIG. 8 is a top view of an angular accelerometer comprising a proof mass and a plurality of cap stoppers, according to a non-limiting embodiment of the present application.

FIG. 20A illustrates a cross section of a combined supercapacitor and battery device which may be used in a power unit, such as that of FIG. 12, according to a non-limiting embodiment of the present application.

FIG. 20B illustrates a circuit schematic of a combined supercapacitor and battery device.

DETAILED DESCRIPTION

Figure 2A:
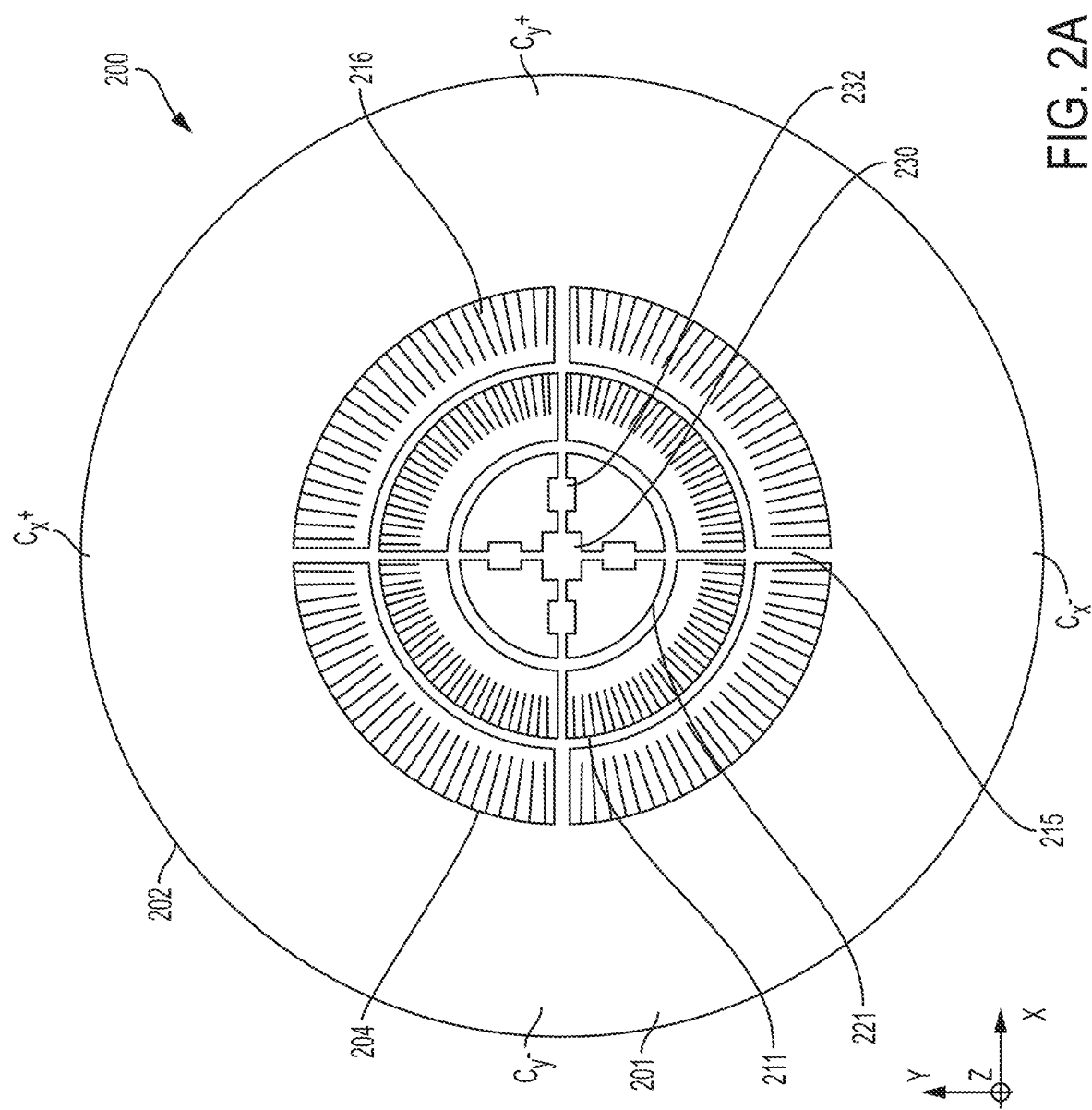
FIG. 2A is a top view of a proof mass of an angular accelerometer, the proof mass comprising a plurality of beams, according to a non-limiting embodiment of the present application.

Accelerometers that detect angular acceleration around up to three orthogonal axes are described. The accelerometer may have a single proof mass, sometimes shaped as a disc, suspended above a substrate, with the proof mass having separate sensing elements for sensing the acceleration around the three axes. The separate sensing elements may be disposed at different distances from the center of the proof mass. In some embodiments, the sensing elements for two of the three axes are disposed the same distance as each other from the center of the proof mass, with the sensing elements for the third axis being disposed closer to the center of the proof mass. When the proof mass is substantially planar, the sensing elements which detect angular acceleration around the axis perpendicular to the plane may be suspended structures having one end fixed to an inner edge of the proof mass and another, free end closer to the center of the proof mass than the fixed end. The axis perpendicular to the plane of the proof mass will be referred to hereinafter as the z-axis. The axes parallel to the plane of the proof mass will be referred to hereinafter as the x-axis and the y-axis.

Positioning the sensing elements in the manner described may reduce an undesirable offset in the accelerometer output signal and also increase sensitivity of the accelerometer. Mechanical stress can undesirably cause an offset error in the output signal of the accelerometer, and may be greater closer to the center of the proof mass when the proof mass is suspended by a central anchor. Positioning the sensing element for sensing acceleration around the z-axis in the manner described above may beneficially reduce the impact of mechanical stress on the output signal of the accelerometer. Also, positioning the sensing elements for the x and y-axes farther from the center of the proof mass may result in greater motion of the elements in response to acceleration, thus increasing the sensitivity of the accelerometer.

The accelerometer provides high sensitivity angular acceleration detection with low power operation, in at least some embodiments. The accelerometers may be differential, providing differential signals for one or more of the three axes about which angular acceleration is detected.

Aspects of the present application provide tethering structures for tethering an outer portion of a proof mass to a center portion of the proof mass. Multiple tethers may be provided. One or more of the tethers may have a serpentine structure, exhibiting rotational symmetry about a radius of the proof mass. Two or more tethers may exhibit mirror-symmetry about an axis of the proof mass. Such a configurations may reduce the impact of stresses and suppress orthogonal modes.

Accelerometers of the types described herein may be used in a variety of systems to detect angular acceleration, or the lack thereof. Devices incorporating the accelerometer may be used in an Internet of Things (IoT) network. For instance, wearable devices, including fitness sensors and healthcare monitors, industrial equipment and diagnostic tools, military equipment, and healthcare monitoring equipment may employ accelerometers of the types described herein.

The aspects and embodiments described above, as well as additional aspects and embodiments, are described further below. These aspects and/or embodiments may be used individually, all together, or in any combination of two or more, as the application is not limited in this respect.

According to aspects of the present application, an angular accelerometer may comprise a single proof mass configured to detect movements about three axes. FIG. 1 illustrates schematically a proof mass 101 of an angular accelerometer, where the proof mass may be configured to detect movements about the x-axis, the y-axis and/or the z-axis, according to a non-limiting embodiment of the present application.

In some embodiments, proof mass 101 may have a disc shape. However any other suitable shape may be used. For example, proof mass 101 may have an elliptical shape in some embodiments or a polygonal shape in other embodiments. In some embodiments, proof mass 101 may comprise a disc having a radius that is between 10 μm and 2 mm in some embodiments, between 100 μm and 1 mm in some embodiments, between 500 μm and 1 mm in some embodiments, between 700 μm and 1 mm in some embodiments, between 750 μm and 850 μm in some embodiments, between 900 μm and 1 mm in some embodiments, or between any other suitable values or range of values.

In some embodiments, the proof mass may be suspended over a substrate, and may be connected to the substrate through one or more anchoring posts. The anchoring post(s) may be connected to the center, or near the center, of the proof mass. In some embodiments, the proof mass may be connected to one anchoring post only, which may contact the proof mass substantially at its center.

According to one aspect of the present application, a proof mass may comprise a plurality of z-sensing beams, configured to detect rotation/motion about the z-axis, that extend toward the center of the proof mass to alleviate signal offset caused by mechanical stress. According to another aspect of the present application, x-sensing elements and y-sensing elements may be positioned at locations corresponding to the periphery of the proof mass to enhance detection sensitivity about the x-axis and y-axis respectively.

FIG. 2A is a top view of a proof mass 200 of an angular accelerometer, the proof mass comprising a plurality of z-sensing beams, according to a non-limiting embodiment of the present application. Proof mass 200 may serve as proof mass 101 of FIG. 1. In some embodiments, the proof mass may comprise a conductive material, such as silicon, doped silicon, polysilicon or doped polysilicon. The silicon and/or polysilicon may be n-doped and/or p-doped with a doping concentration between $10^{16}$ cm$^{-3}$ and $5 \times 10^{20}$ cm$^{-3}$ in some embodiments, between $10^{18}$ cm$^{3}$ and $10^{20}$ cm$^{-3}$ in some embodiments, between $5 \times 10^{18}$ cm$^{3}$ and $5 \times 10^{19}$ cm$^{-3}$ in some embodiments, or between any suitable values or range of values. Other values are also possible. In alternative, other conductive materials can be used. In some embodiments, proof mass 200 may be made of a conductive material, such as one of the conductive materials discussed above.

In some embodiments, proof mass 200 may comprise one or more curved beams, such as curved beams 201, 211 and 221. The curved beams may form rings in some embodiments. The curved beams may form concentric rings in some embodiments. By way of example and not limitation, FIG. 2A illustrates a proof mass 200 having three curved beams. However the application is not limited in this respect and any other suitable number of curved beam greater than zero may be used. Each curved beam may have an inner edge and an outer edge. Each outer edge may bound an area that comprises the respective inner edge. For example, curved beam 201 may have an outer edge 202, bounding an area that comprises inner edge 204. The various curved beams may be connected through one or more supporting beams, such as supporting beam 215. While FIG. 2A illustrates a proof mass having four supporting beams, any other suitable number of supporting beams may be used. The supporting beams may have a rectangular shape, as illustrated in the figure, or any other suitable shape.

In some embodiments, proof mass 200 may comprise a central portion 230. Central portion 230 may define an area that encloses the center of proof mass 200, in some embodiments. In some embodiments, central portion 230 may be connected to one or more anchoring posts (not shown in FIG. 2A). The anchoring post(s) may be connected to the substrate. In some embodiments, in response to one or more torsions about the x-axis and/or the y-axis, the anchoring post(s) may function as pivoting fulcrum(s) for proof mass 200. Central portion 230 may have any suitable shape. For example, central portion 230 may have a square shape, a rectangular shape, a circular shape, an elliptical shape, etc. Anchoring posts may also be referred to herein simply as "anchors".

The proof mass may respond to torsion(s) by pivoting about the x-axis and/or the y-axis. In response to such movements, one or more x-sensing elements and/or one or more y-sensing elements may detect a change in one or more parameters. In some embodiments, the x-sensing elements may comprise a capacitor having a first electrode disposed on a substrate and a second electrode disposed on the proof mass. In some embodiments, a portion of the proof mass facing the first electrode may serve as second electrode. In some embodiments, the y-sensing elements may comprise a capacitor having a first electrode disposed on a substrate and a second electrode disposed on the proof mass. In some embodiments, a portion of the proof mass facing the first electrode may serve as second electrode. As the proof mass pivots around the anchoring post(s) about the x-axis, or the y-axis, a change in the x-sensing element's capacitance, or the y-sensing element's capacitance, may be detected. In some embodiments, proof mass 200 may comprise two x-sensing elements. Both of the x-sensing elements may be capacitive in some embodiments. For example, proof mass 200 may comprise capacitors $C_x^-$ and $C_x^+$, disposed on opposite sides of proof mass 200 about the x-axis. In some embodiments, proof mass 200 may comprise two y-sensing elements. Both of the y-sensing elements may be capacitive in some embodiments. For example, proof mass 200 may comprise capacitors $C_y^-$ and $C_y^+$, disposed on opposite sides of proof mass 200 about the y-axis.

In some embodiments, a plurality of tethers, such as tether 232, may connect central portion 230 to the inner curved beam. In some embodiments, the tethers may serve as springs configured to provide a restoring force in response to a torsion in the xy-plane. The springs may act as to restore the proof mass to its unperturbed position in response to torsion in the xy-plane. The elastic constant of the tethers may depend on the shape of the tethers. The shape of the tethers will be discussed further below.

In some embodiments, proof mass 200 may comprise a plurality of beams such as z-sensing beam 216, to detect torsion(s) about the z-axis. In this application, the "beams" of the type illustrated in FIG. 2A may alternatively be referred to as "fingers", "clamped-free beams" or "z-sensing beams", and in some embodiments may be cantilevers. In some embodiments, the beams may be fixed to the inner edge of a curved beam, such as inner edge 204. In some embodiments, the beams may be suspended such that the regions where they contact inner edge 204 is their sole fixing point. In some embodiments, the beams may extend toward the center of proof mass 200. In some embodiments, the beams may extend radially toward the center of proof mass 200. In response to torsion(s) about the z-axis, the beams may pivot on the xy-plane about the regions where they contact inner edge 204. As will be discussed further below, as the beams move, a variation in a parameter, such as a capacitance, may be detected. Proof mass 200 may comprise any suitable number of z-sensing beams. The various z-sensing beams may contact inner edge 202 similarly to beam 216. In some embodiments, proof mass 200 may comprise a second set of beams contacting the inner edge of curved beam 211, as illustrated in FIG. 2A. While FIG. 2A illustrates proof mass 200 having two sets of beams, the application is not limited in this respect and any other suitable number of sets of beams greater than zero may be used. In some embodiments, the beams contacting curved beam 201 may be longer than the beams contacting curved beam 211. In some embodiments, the beams contacting curved beam 201 may have an angular pitch that is less than the angular pitch of the beams contacting curved beam 211.

Figure 2B:
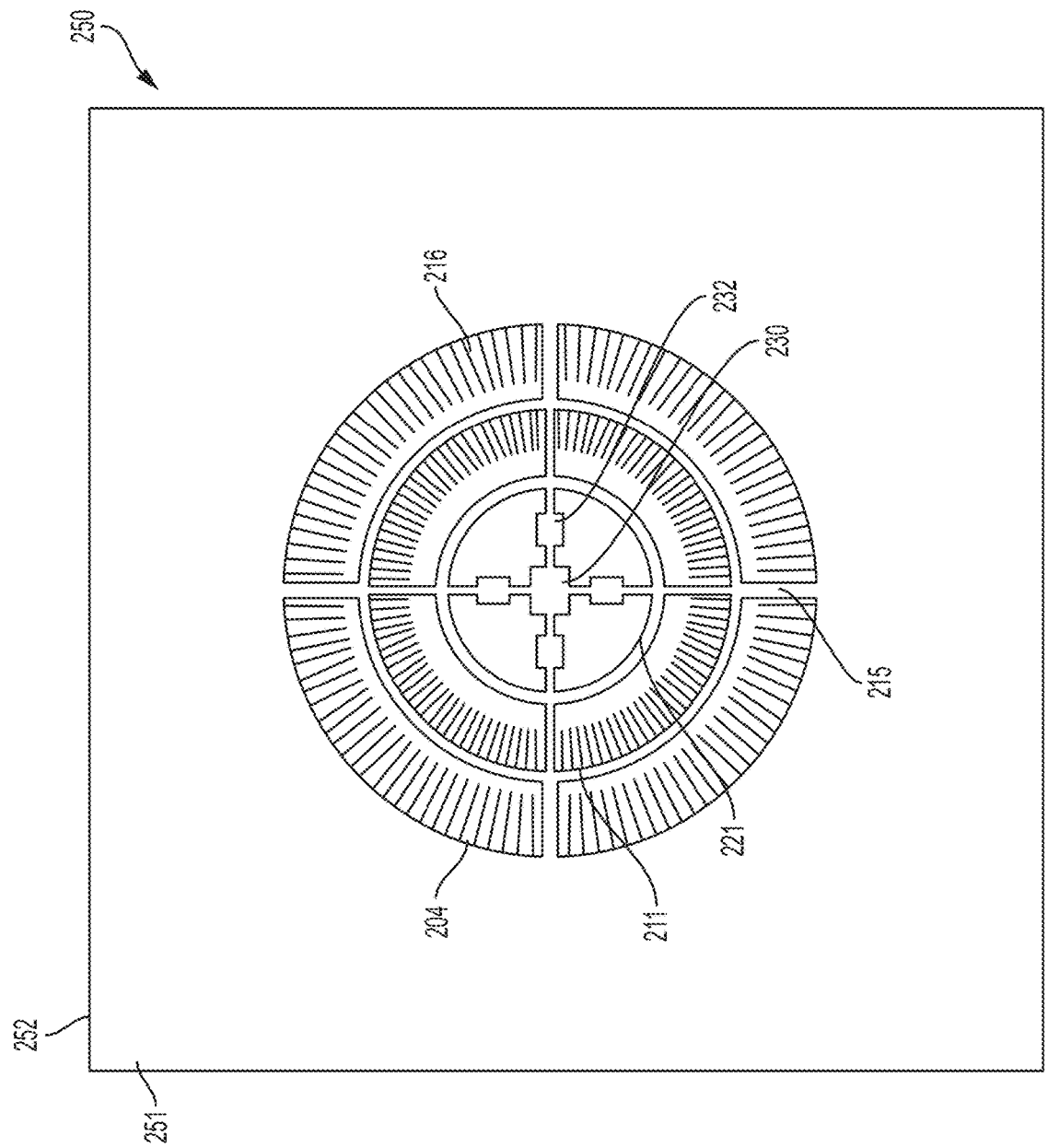
FIG. 2B is a top view of a proof mass of another angular accelerometer, according to a non-limiting embodiment of the present application.

FIG. 2B is a top view of a proof mass 250 of an angular accelerometer, according to another non-limiting embodiment. Proof mass 250 may have the same characteristics as those described in connection with proof mass 200. However, unlike proof mass 200, proof mass 250 may have a polygonal shape (e.g., square or rectangular). Accordingly, proof mass 250 may comprise outer portion 251, which may have a polygonal outer edge 252. In some embodiments, using a proof mass having a polygonal outer edge, rather than a curved outer edge, may improve the on-chip real estate utilization. That is, provided the same available space on the chip, polygonal proof masses may have larger surfaces than curved proof masses, and therefore greater masses. As a result, the sensitivity of the angular accelerometer may be improved. In the following description, reference is frequently made to proof mass 200. It should be understood that proof mass 250, or proof masses of other shapes, may alternatively be used unless stated otherwise.

Figure 3:
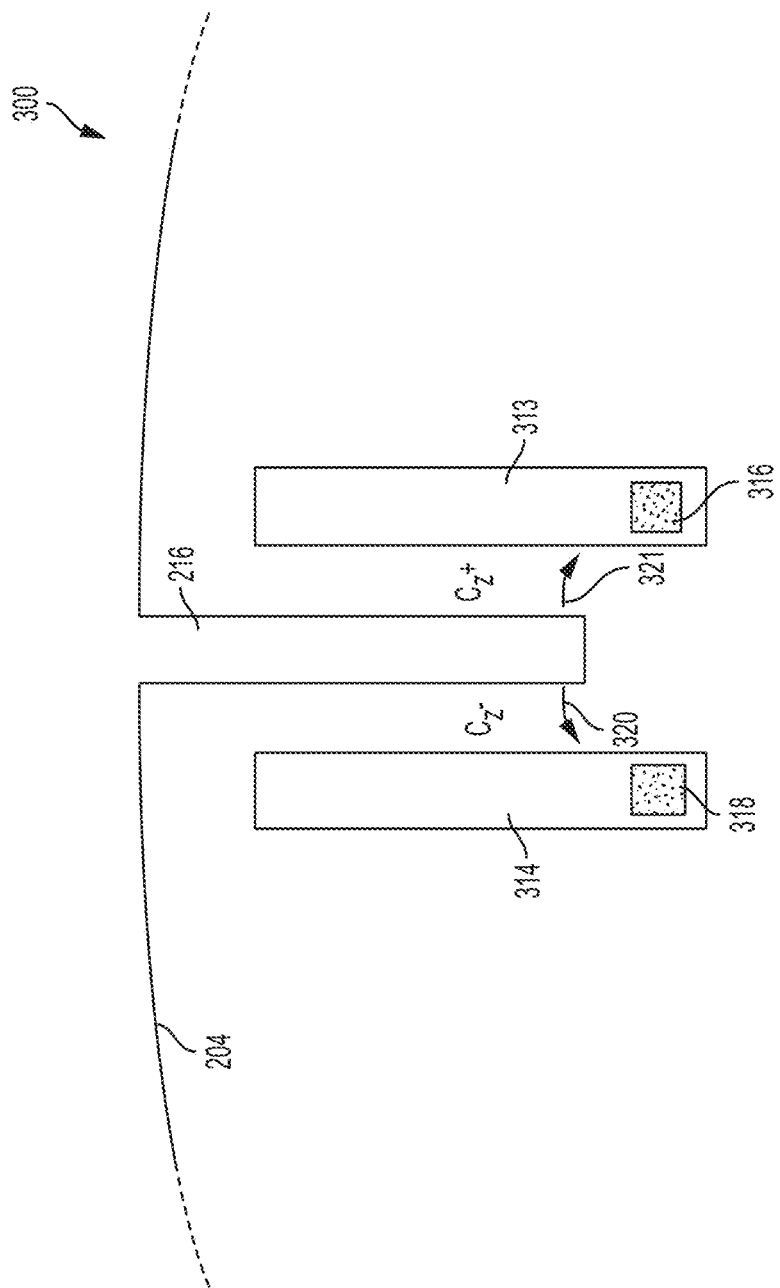
FIG. 3 is a top view of a z-sensing element comprising a beam having one end fixed to an inner edge of a proof mass, according to a non-limiting embodiment of the present application.

FIG. 3 is a top view of a z-sensing element 300 comprising a beam having one end fixed to an inner edge of a proof mass, according to a non-limiting embodiment of the present application. The z-sensing element 300 may comprise a beam 216 contacting inner edge 204. In some embodiments, beam 216 may be configured to move on the xy-plane, as illustrated by arrow 320 and arrow 321, in response to torsion(s) about the z-axis. In some embodiments, z-sensing element 300 may comprise electrode 313. Electrode 313 may be adjacent beam 216 in some embodiments. Electrode 313 may comprise a conductive material in some embodiments, such as aluminum, copper, doped silicon and/or doped polysilicon. In some embodiments, electrode 313 may be connected to post 316. Post 316 may be connected to a substrate. While FIG. 3 illustrates electrode 313 being connected to the substrate through one post, any other suitable number of posts greater than one may be used. In some embodiments, a capacitor $C_z^+$ having electrode 313 and beam 216 as electrodes may be formed. As beam 216 moves in response to torsion(s) about the z-axis, the distance between beam 216 and electrode 313 may vary, thus causing a change in the capacitance associated with capacitor $C_z^+$. The change in capacitance may be used to detect torsion(s) about the z-axis. Beam 216 may be configured to be sensitive to angular accelerations about the z-axis. In some embodiments, beam 216 may be insensitive to linear accelerations and/or angular velocities.

In some embodiments, z-sensing element 300 may comprise electrode 314. Electrode 314 may be adjacent beam 216 in some embodiments. Electrode 314 may be disposed on the opposite side of beam 216 with respect to electrode 313. Electrode 314 may comprise a conductive material in some embodiments, such as aluminum, copper, doped silicon and/or doped polysilicon. In some embodiments, electrode 314 may be connected to post 318. Post 318 may be connected to a substrate. While FIG. 3 illustrates electrode 314 being connected to the substrate through one post, any other suitable number of posts greater than one may be used. In some embodiments, a capacitor $C_z^-$ having electrode 314 and beam 216 as electrodes may be formed. As beam 216 moves in response to torsion(s) about the z-axis, the distance between beam 216 and electrode 314 may vary, thus causing a change in the capacitance associated with capacitor $C_z^-$. The change in capacitance may be used to detect torsion(s) about the z-axis.

In some embodiments, the change in the capacitance associated with capacitor $C_z^-$ may be configured to be the opposite of the change in the capacitance associated with capacitor $C_z^+$. For example, if $\Delta C_z$ is the change in capacitance associated with capacitor $C_z^-$ in response to torsion(s) about the z-axis, the change in capacitance associated with capacitor $C_x^-$ may be equal to $-\Delta C_z$. As a result, movements in the xy-plane may lead to the generation of detection signals that are differential. Z-sensing element 300 may be configured to be responsive to angular accelerations about the z-axis. In some embodiments, z-sensing element 300 may be insensitive to linear accelerations and/or angular velocities.

Figure 4:
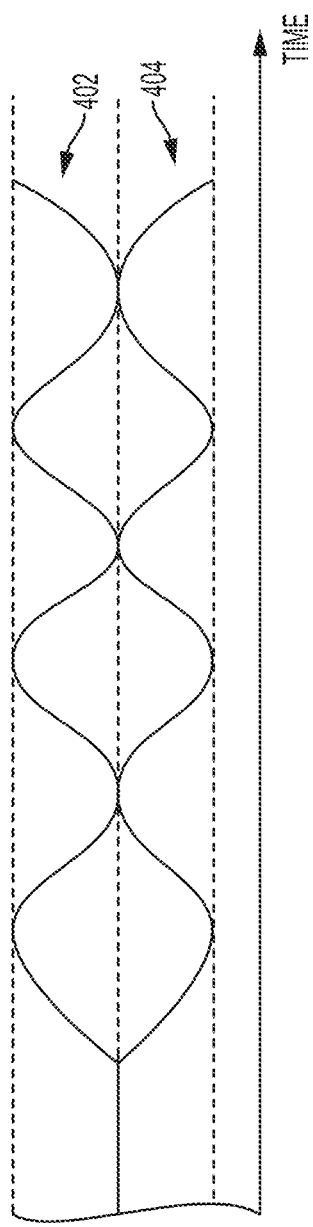
FIG. 4 illustrates an example of two differential signals generated by a z-sensing element, according to a non-limiting embodiment of the present application.

FIG. 4 illustrates an example of a differential signal generated by a z-sensing element, according to a non-limiting embodiment of the present application. In the non-limiting example of FIG. 4, a sinusoidal torsion may be applied to proof mass 200 about the z-axis. In response to such torsion, beam 216 may move over time according to arrows 320 and 321, thus causing a change over time in the capacitance associated to capacitor $C_z^+$ that is sinusoidal, and an opposite change in the capacitance associated to capacitor $C_z^-$. The change in the two capacitances may cause the generation of differential signals 402 and 404, as illustrated in FIG. 4. In some embodiments, using differential signals may be preferable over using single-ended signals to suppress common mode signals. For examples, common mode signals may be caused by linear accelerations occurring with respect to the z-axis and/or by noise. In another example, common mode signals may be caused by the cross talk occurring between two modes associated with two respective orthogonal axes.

As discussed previously, torsion(s) about the x-axis may be detected with capacitors $C_x^+$ and $C_x^-$, and torsion(s) about the y-axis may be detected with capacitors $C_y^+$ and $C_y^-$. FIG. 5A is the side view of a yz-plane of an angular accelerometer comprising a proof mass 200, an anchoring post 503 and x-sensing electrodes 541 and 542, according to a non-limiting embodiment of the present application. In some embodiments, proof mass 200 may be disposed within a cavity 502, obtained on a substrate 501. For example, cavity 502 may be obtained by etching a portion of substrate 501. Substrate 501 may be a silicon substrate in some embodiments. In some embodiments, proof mass 200 may be connected to substrate 501 through an anchoring post 503. In some embodiments, anchoring post 503 may be connected to central portion 230. In other embodiments, central element 230 may serve as anchoring post 503. The distance between the bottom surface of the proof mass and the top surface of the substrate, measured along the z-axis, may be between 1 µm and 10 µm in some embodiments, between 1.5 µm and 3 µm in some embodiments, between 1.7 µm and 1.9 µm in some embodiments, or between any suitable values or range of values. Other values are also possible. Proof mass 200 may have a thickness, measured along the z-axis, that is between 1 µm and 50 µm in some embodiments, between 10 µm and 20 µm in some embodiments, between 15 µm and 17 µm in some embodiments, or between any suitable values or range of values. Other values are also possible.

FIG. 5A illustrates x-sensing electrodes 541 and 542 disposed on substrate 501, on opposite sides of anchoring post 503. In some embodiments, x-sensing electrodes 541 and 542 may be disposed at locations corresponding to the outer edge of proof mass 200, such as outer edge 202. In some embodiments, a capacitor $C_x^+$ having x-sensing electrode 542 and proof mass 200 as electrodes may be formed. In response to one or more torsions applied to proof mass 200 about the x-axis, proof mass 200 may pivot about the x-axis using anchoring post 503 as fulcrum. Consequently the distance between proof mass 200 and x-sensing electrode 542 may vary, thus causing a change in the capacitance associated with capacitance $C_x^+$. The change in the capacitance may be used to detect torsion(s) about the x-axis.

In some embodiments, a capacitor $C_x^-$ having x-sensing electrode 541 and proof mass 200 as electrodes may be formed. In response to one or more torsions applied to proof mass 200 about the x-axis, proof mass 200 may pivot about the x-axis using anchoring post 503 as fulcrum. Consequently the distance between proof mass 200 and x-sensing electrode 541 may vary, thus causing a change in the capacitance associated with capacitance $C_x^-$. The change in the capacitance may be used to detect torsion(s) about the x-axis.

In some embodiments, the change in the capacitance associated with capacitor $C_x^-$ may be configured to be the opposite of the change in the capacitance associated with capacitor $C_x^+$. For example, if $\Delta C_x$ is the change in capacitance associated with capacitor $C_x^-$, the change in capacitance associated with capacitor $C_x^+$ may be equal to $-\Delta C_x$. As a result, movements in the yz-plane may lead to the generation of detection signals that are differential.

FIG. 5A further illustrates an electrode 313, that may be part of a z-sensing element 300 as illustrated in FIG. 3. For simplicity, only one electrode 313 is illustrated in FIG. 5A. As discussed above, electrode 313 may be connected to substrate 501 through post 316. Post 316 may be made of a conductive material in some embodiments. In some embodiments, z-sensing electrode 540 may be disposed on substrate 501, and may be in electrical contact with electrode 313 via post 316. In some embodiments, electrode 540 may be disposed under the top surface of substrate 501. In some embodiments, electrode 501 may comprise polysilicon or doped polysilicon.

In some embodiments, x-sensing electrode 541 may be positioned at any suitable location such that the distance between x-sensing electrode 541 and anchoring post 503 is greater than the distance between electrode 313 and anchoring post 503, where both distances are measured on the xy-plane. Similarly, x-sensing electrode 542 may be positioned at any suitable location such that the distance between x-sensing electrode 542 and anchoring post 503 is greater than the distance between any one of the electrodes 313 and anchoring post 503, where both distances are measured on the xy-plane.

FIG. 5B is the side view of a xz-plane of an angular accelerometer comprising a proof mass 200, an anchoring post 503 and y-sensing electrodes 551 and 552, according to a non-limiting embodiment of the present application. FIG. 5B illustrates y-sensing electrodes 551 and 552 disposed on substrate 501, on opposite sides of anchoring post 503. In some embodiments, y-sensing electrodes 551 and 552 may be disposed at locations corresponding to the outer edge of proof mass 200, such as outer edge 202. In some embodiments, a capacitor $C_y^+$ having y-sensing electrode 552 and proof mass 200 as electrodes may be formed. In response to one or more torsions applied to proof mass 200 about the y-axis, proof mass 200 may pivot about the y-axis using anchoring post 503 as fulcrum. Consequently the distance between proof mass 200 and y-sensing electrode 552 may vary, thus causing a change in the capacitance associated with capacitance $C_y^+$. The change in the capacitance may be used to detect torsion(s) about the y-axis.

In some embodiments, a capacitor $C_y^-$ having y-sensing electrode 551 and proof mass 200 as electrodes may be formed. In response to one or more torsions applied to proof mass 200 about the y-axis, proof mass 200 may pivot about the y-axis using anchoring post 503 as fulcrum. Consequently the distance between proof mass 200 and y-sensing electrode 551 may vary, thus causing a change in the capacitance associated with capacitance $C_y^-$. The change in the capacitance may be used to detect torsion(s) about the y-axis.

In some embodiments, the change in the capacitance associated with capacitor $C_y^-$ may be configured to be the opposite of the change in the capacitance associated with capacitor $C_y^-$. For example, if $\Delta C_y$ is the change in capacitance associated with capacitor $C_y^-$, the change in capacitance associated with capacitor $C_y^+$ may be equal to $-\Delta C_y$. As a result, movements in the xz-plane may lead to the generation of detection signals that are differential.

FIG. 5B further illustrates an electrode 313, that may be part of a z-sensing element 300 as illustrated in FIG. 3. For simplicity, only one electrode 313 is illustrated in FIG. 5B. As discussed above, electrode 313 may be connected to substrate 501 through a post. Post 316 may be made of a conductive material in some embodiments. In some embodiments, z-sensing electrode 540 may be disposed on substrate 501, and may be in electrical contact with electrode 313 via post 316. In some embodiments, electrode 540 may be disposed under the top surface of substrate 501. In some embodiments, electrode 501 may comprise polysilicon or doped polysilicon.

In some embodiments, y-sensing electrode 551 may be positioned at any suitable location such that the distance between y-sensing electrode 551 and anchoring post 503 is greater than the distance between electrode 313 and anchoring post 503, where both distances are measured on the xy-plane. Similarly, y-sensing electrode 552 may be positioned at any suitable location such that the distance between y-sensing electrode 552 and anchoring post 503 is greater than the distance between any one of the electrode 313 and anchoring post 503, where both distances are measured on the xy-plane.

FIG. 5C is a top view of an angular accelerometer comprising x-sensing electrodes, y-sensing electrodes and z-sensing electrodes, according to a non-limiting embodiment of the present application. The dashed lines corresponding to curved beam 201's inner edge 204 and outer edge 202, curved beam 211's inner edge 214 and outer edge 212 may be disposed on an xy-plane corresponding to a surface of proof mass 200. While FIG. 5C illustrates two curved beams, any suitable number of curved beams may be used.

In some embodiments, x-sensing electrodes 541 and 542 may be disposed on substrate 501, at locations corresponding to curved beam 201. In some embodiments, x-sensing electrodes 541 and 542 may be disposed at locations corresponding to outer edge 202. In some embodiments, x-sensing electrodes 541 and 542 may be disposed at opposite sides of curved beam 201. X-sensing electrode 541 may be connected to metal pad $S_x^-$, which could be accessed via wire-bonding or through a probe. Similarly, x-sensing electrode 542 may be connected to metal pad $S_x^+$, which could be accessed via wire-bonding or through a probe. In some embodiments, metal pad ref may be connected to the anchoring post, and may be configured to provide a reference voltage.

In some embodiments, movements of proof mass 200 about the x-axis may cause the generation of a first voltage between metal pad $S_x^-$ and metal pad ref. In some embodiments, movements of proof mass 200 about the x-axis may cause the generation of a second voltage between metal pad $S_x^+$ and metal pad ref. In some embodiments, the two voltages may form two differential signals. Accordingly, as proof mass pivots about anchoring post 503, the portion of curved beam 201 corresponding to x-sensing electrode 541 may move toward (or away from) x-sensing element 541, while at the same time the portion of curved beam 201 corresponding to x-sensing electrode 542 may move or away from (or toward) x-sensing element 542.

In some embodiments, y-sensing electrodes 551 and 552 may be disposed on substrate 501, at locations corresponding to curved beam 201. In some embodiments, y-sensing electrodes 551 and 552 may be disposed at locations corresponding to outer edge 202. In some embodiments, y-sensing electrodes 551 and 552 may be disposed at opposite sides of curved beam 201. Y-sensing electrode 551 may be connected to metal pad $S_y^-$, which could be accessed via wire-bonding or through a probe. Similarly, y-sensing electrode 552 may be connected to metal pad $S_y^+$, which could be accessed via wire-bonding or through a probe. In some embodiments, movements of proof mass 200 about the y-axis may cause the generation of a first voltage between metal pad $S_y^-$ and metal pad ref. In some embodiments, movements of proof mass 200 about the y-axis may cause the generation of a second voltage between metal pad $S_y^+$ and metal pad ref. In some embodiments, the two voltages may form two differential signals. Accordingly, as proof mass pivots about anchoring post 503, the portion of curved beam 201 corresponding to y-sensing electrode 551 may move toward (or away from) y-sensing element 551, while at the same time the portion of curved beam 201 corresponding to y-sensing electrode 552 may move or away from (or toward) y-sensing element 552.

In some embodiments, a plurality of z-sensing elements, such as z-sensing element 300 described in connection with FIG. 3, may contact inner edge 204. While FIG. 5C illustrates four z-sensing elements, any suitable number of z-sensing elements may be used. In some embodiments, the z-sensing elements may comprise a beam 216 having an end fixed to inner edge 204. In some embodiments, the z-sensing elements may comprise electrodes 313 and 314 disposed on opposite sides of beam 216. Electrodes 313 and 314 may be connected to z-sensing electrodes (not shown in FIG. 5C) disposed on substrate 501 through post 316, and through post 318, respectively.

In some embodiments, all, or a portion of, the z-sensing electrodes coupled to electrodes 313 may be mutually connected as illustrated in FIG. 5C. Such z-sensing electrodes may be further connected to metal pad $S_z^-$. In some embodiments, all, or a portion of, the z-sensing electrodes coupled to electrodes 314 may be mutually connected as illustrated in FIG. 5C. Such z-sensing electrodes may be further connected to metal pad $S_z^+$. Metal pads $S_z^-$ and $S_z^+$ could be accessed via wire-bonding or through a probe. In some embodiments, movements of proof mass 200 about the z-axis may cause the generation of a first voltage between metal pad $S_z^-$ and metal pad ref. In some embodiments, movements of proof mass 200 about the z-axis may cause the generation of a second voltage between metal pad $S_z^+$ and metal pad ref. In some embodiments, the two voltages may form two differential signals. Accordingly, as beams 216 move toward and away from electrodes 313 and 314, the capacitances associated to capacitors $C_z^-$ and $C_z^+$ may vary thus causing the generation of differential signals, such as differential signals 402 and 404 as shown in FIG. 4.

The embodiment illustrated with respect to FIG. 5C may be configured to suppress, or mitigate, crosstalk arising between x-sensing elements and y-sensing elements. In some embodiments, in the presence of an acceleration about the x-axis, x-sensing electrodes 541 and 542 may sense two differential signals while y-sensing electrodes 551 and 552 may not sense any signal. In some embodiments, in the presence of an acceleration about the x-axis, x-sensing electrodes 541 and 542 may sense two differential signals while y-sensing electrodes 551 and 552 may sense a common mode signal. Common mode signals may be eliminated by subtracting the signal measured on metal pad $S_y^-$ from the signal measured on metal pad $S_y^+$, or vice versa. Similarly, in the presence of an acceleration about the y-axis, y-sensing electrodes 551 and 552 may sense two differential signals while x-sensing electrodes 541 and 542 may sense a common mode signal. Common mode signals may be eliminated by subtracting the signal measured on metal pad $S_x^-$ from the signal measured on metal pad $S_x^+$, or vice versa. The metal pad labeled gnd may be used as ground terminal. In some embodiments, the gnd metal pad may be biased at the same potential as the proof mass.

The embodiments described in connection with FIGS. 5A-5C illustrate a proof mass connected to the substrate through an anchoring post coupled near the center of the proof mass. In some circumstances, connecting the proof mass to the substrate through a single anchoring post may render the angular accelerometer susceptible to linear accelerations. For example, in response to linear accelerations along the x-axis, torsions of the proof mass about the y-axis may arise. This behavior may be undesirable, as the proof mass may give rise to detection signals even in the absence of angular accelerations. Using more than one anchoring post may reduce the occurrence of such undesired behavior. An example is now described.

Figure 5D:
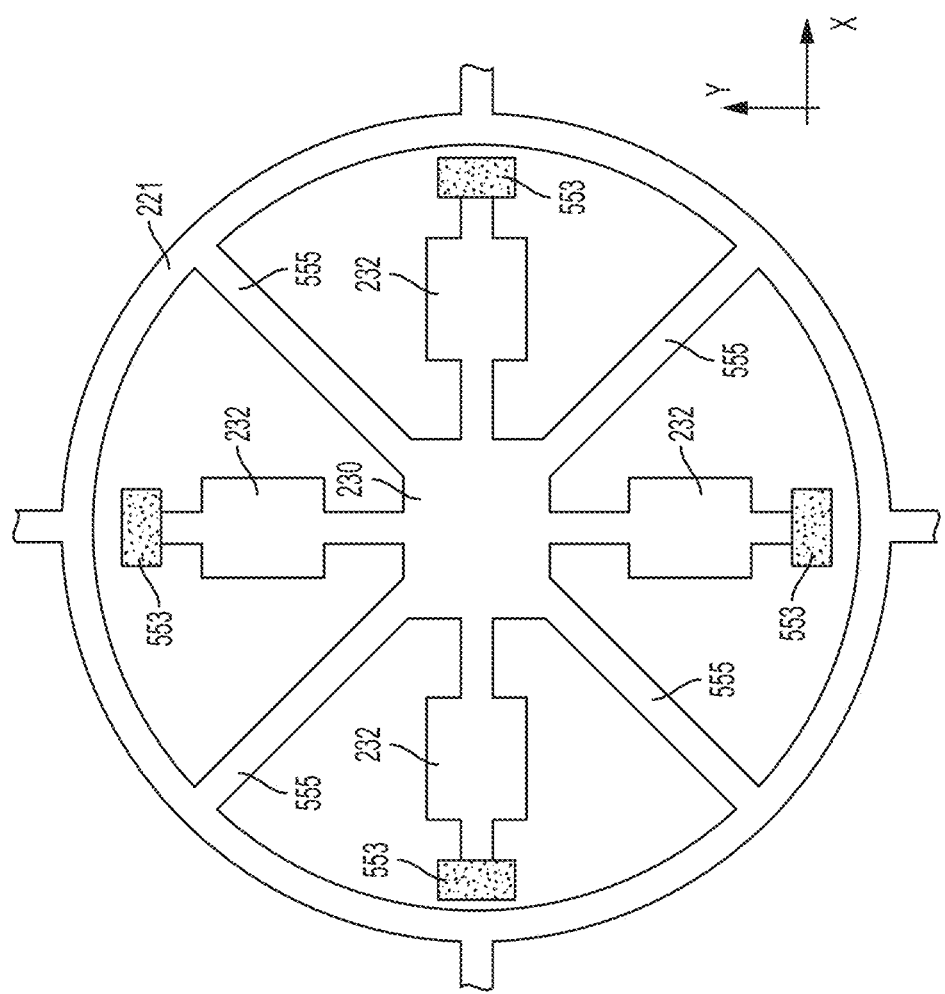
FIG. 5D is a top view illustrating a portion of an angular accelerometer having a plurality of anchoring posts, according to some non-limiting embodiments.

FIG. 5D is a top view illustrating a portion of an angular accelerometer having a plurality of anchoring posts, according to some non-limiting embodiments. As illustrated, the angular accelerometer may comprise a central portion 230, tethers 232, anchoring posts 553, and beams 555 connecting the curved beam 221, previously described in connection with FIGS. 2A-2B. While FIG. 5D illustrates an angular accelerometer having four anchoring posts, any other suitable number of anchoring posts may be used. The anchoring posts may be equally angularly offset with respect to one another. For example, when four anchoring posts are used, each anchoring post 553 may be angularly offset, with respect to the adjacent anchoring posts by approximately 90° (e.g., between 89° and 91°, or between 85° and 95°). The radial distance between the center of central portion 230 and the location of the anchoring posts may be chosen to provide a desired level of immunity to linear accelerations. For example, increasing such a radial distance may result in increased immunity to linear accelerations. However, larger radial distances may also cause a decrease in the sensitivity to angular accelerations due to an increase in the effective torsional stiffness of the proof mass.

In some embodiments, the anchoring posts may be coupled to the proof mass via beams 555. For example, anchoring posts 553 may be coupled to central portion 230 via tethers 232, and central portion 230 may be coupled to curved beam 221 via beams 555. Beams 555 may be stiffer than tethers 232 in some embodiments. In some embodiments, each beam 555 may be angularly offset, with respect to the adjacent anchoring posts, by approximately 45° (e.g., between 44° and 46°, or between 40° and 50°). When angular accelerations about the z-axis occur, tethers 232 may flex in the xy-plane thus allowing for motion of the proof mass. At the same time, beams 555 may rotate in the plane, thus causing rotations of the proof mass.

As described above, tethers 232 may exhibit an elastic constant configured to restore proof mass 200 to its unperturbed position. In some embodiments, tethers 232 may be further configured to absorb stress that may arise within proof mass 200. Accordingly, the tethers may be partially flexible, and may adjust their shapes based on the stress applied, thus reducing the stress received by the outer portions of the proof mass. In some embodiments, tethers may be further configured to suppress non-orthogonal modes, such as diagonal modes. Tethers 232 may be asymmetric or symmetric.

Figure 6A:
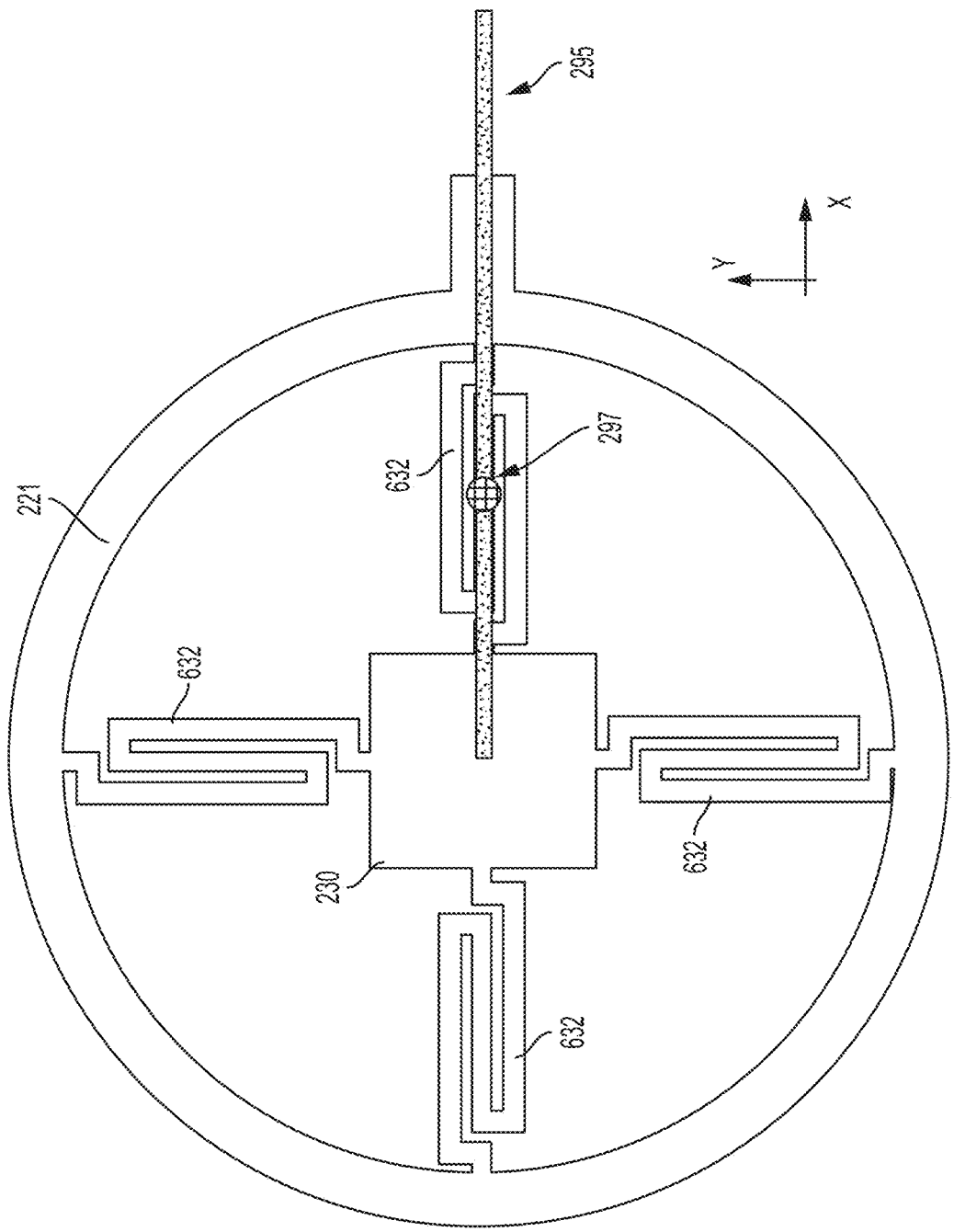
FIG. 6A is a top view of the proof mass of an angular accelerometer illustrating the tethers in greater detail, according to a non-limiting embodiment of the present application.

FIG. 6A is a top view of the proof mass of an angular accelerometer showing the center of proof mass 200 in greater detail. As illustrated, asymmetric tethers may be used. In some embodiments, proof mass 200 may comprise a central portion 230 connected to one or more anchoring posts, such as anchoring post 503. In other embodiments, central portion 230 may serve as anchoring post 503. The central portion may have a square shape, a circular shape, a rectangular shape, an elliptical shape, or any other suitable shape. The central portion may be connected to the inner edge of the innermost curved beam, such as curved beam 221, through one or more tethers 632. Tethers 632 may serve as tethers 232. In some embodiments, tethers 632 may have serpentine shapes. In some embodiments, tethers 632 may comprise elements having s-shapes. Tethers 632 may further comprise first beams connecting the s-shaped elements to central portion 230 and second beams connecting the s-shaped elements to curved beam 221. In some embodiments, tethers 632 may be asymmetric about an axis, such as axis 295, that is parallel to a radius passing through the tether and the center of the proof mass. In some embodiments, tethers 632 may have a 180-degree rotational symmetry about a point located between central portion 230 and curved beam 221, such as point 297. In some embodiments, point 297 may be a midpoint between an edge of central portion 230 and the inner edge of curved beam 221. In some embodiments, a tether 632 may be symmetric to the opposite tether with respect to an axis that passes through the center of the proof mass and is perpendicular to the axis of the tether. Such symmetry may be referred to as mirror symmetry.

Being asymmetric, tethers 632 may cause the proof mass to be responsive to linear accelerations in some circumstances. For example, in response to linear accelerations along the x-axis, torsions of the proof mass about the z-axis may arise. This behavior may be undesirable, as the proof mass may give rise to detection signals even in the absence of angular accelerations. Thus, in some embodiments, symmetric tethers may be utilized, which in some embodiments are less susceptible to undesired torsion. Unlike asymmetric tethers, symmetric tethers may prevent torsions of the proof mass in response to linear accelerations. FIG. 6B illustrates an example of a symmetric tether, according to some non-limiting embodiments. Tether 633 may serve as any one of tethers 232. As illustrated, tether 633 may be symmetric with respect to symmetry axis 285. Tether 633 may be configured to allow for rotations of the proof mass in response to angular accelerations while remaining substantially still in response to linear accelerations. In some embodiments, one or more holes 639 may be etched through a tether 633. For example, the hole(s) may be etched along symmetry axis 285, as illustrated in FIG. 6B. The shape and number of holes may be chosen to control the stiffness of tether 633 as desired. For example, increasing the size and/or the number of holes may decrease the stiffness of the tether in some embodiments.

In some instances, proof mass 200 may be subjected to accelerations having magnitudes large enough to cause damage to portions of the proof mass. For example, large accelerations about the z-axis may cause movements of the proof mass that are beyond the tethers' range of validity. Consequently, the tethers may exceed their elastic limit thus experiencing permanent damage. In some embodiments, to prevent damage to the tethers, movement stoppers, in the form of inner stoppers and/or outer stoppers, may be employed. However, any other suitable type of stopper may be used.

FIG. 7A is a top view illustrating a movement stopper disposed near an edge of proof mass 200, according to a non-limiting embodiment of the present application. As illustrated in FIG. 7A, an outer edge of proof mass 200, such as outer edge 202, may comprise one or more protrusions 750. In some embodiments, outer edge 202 may comprise a plurality of protrusions of the type of protrusion 750, disposed along its perimeter. Protrusion 750 may comprise an element fixed to outer edge 202 and sticking out of its perimeter. Such element may have a shape that is rectangular, circular, or have any other suitable shape. In some embodiments, an outer stopper 752 may be disposed on substrate 501 and may be adjacent outer edge 202. Outer stopper 752 may be disposed directly on substrate 501, or may be disposed on a plurality of posts contacting substrate 501. In some embodiments, outer edge 752 may comprise a protrusion in correspondence to protrusion 750. In some embodiments, outer stopper 752 may be disposed at a distance from outer edge 202 such that a gap 751 is formed. The gap may have a size that is between 500 nm and 5 µm, between 800 nm and 2 µm, between 1 µm and 1.4 µm, or between any suitable values or range of values. Other values are also possible.

Outer stopper 752 may be used to prevent excessive movements of proof mass 200 about the z-axis in response to accelerations having large magnitudes. In some embodiments, gap 751 may provide enough room for proof mass 200 to move about the z-axis in response to accelerations having magnitudes below a safety threshold. If accelerations having magnitudes exceeding the safety threshold are applied on proof mass 200 about the z-axis, a sidewall of protrusion 750 may hit a sidewall of the corresponding protrusion of outer stopper 752, thus limiting the movement of the proof mass. While FIG. 7A illustrates an outer stopper comprising a protrusion sticking outside the perimeter of an edge, other configurations are also possible. For example, outer edge 202 and the outer stopper may comprise dents disposed in correspondence to one another. The outer stopper may be disposed at a distance from the outer edge such that a gap may be formed in between. When accelerations exceeding the safety threshold are applied about the z-axis, a sidewall of the edge's dent may hit a sidewall of the corresponding dent of the outer stopper, thus limiting the movement of the proof mass.

FIG. 7B is a top view illustrating a movement stopper disposed near the center of a proof mass, according to a non-limiting embodiment of the present application. In some embodiments, a void may be formed in an area bounded by two successive tethers 232, central portion 230 and the inner edge of the innermost curved beam. In some embodiments, such void may be filled, at least in part, with an inner stopper, such as inner stopper 760. In some embodiments, inner stopper 760 may be disposed directly on substrate 501, or may be disposed on a plurality of posts contacting substrate 501. In some embodiments, inner stopper 760 may be disposed at a distance from the tethers 232 such that a gap 761 is formed. The gap may have a size that is between 500 nm and 5 µm, between 800 nm and 2 µm, between 1 µm and 1.4 µm, between 2 µm and 4 µm, or between any suitable values or range of values. Other values are also possible. In some embodiment, a gap may be formed between inner stopper 760 and the inner edge of the innermost curved beam. In some embodiments, the gap between the tethers and the inner stopper may be greater than the gap between the inner stopper and the innermost curved beam.

Inner stopper 760 may be used to prevent excessive movements of proof mass 200 about the z-axis in response to accelerations having large magnitudes. In some embodiments, gap 761 may provide enough room for proof mass 200 to move about the z-axis in response to accelerations having magnitudes below a safety threshold. If accelerations having magnitudes exceeding the safety threshold are applied on proof mass 200 about the z-axis, a tether 232 may hit a sidewall of the of inner stopper 760, thus limiting the movement of the proof mass. In some embodiments, multiple inner stoppers may be disposed within the multiple voids existing within the innermost curved beam. For example, the embodiment shown in FIG. 6A (or FIG. 6B) may comprise four inner stoppers disposed in the four voids shown.

In some instances accelerations about the x-axis and/or the y-axis may have magnitudes large enough to cause damage to portions of the proof mass. For example, the proof mass may experience over-rotation, and it may, in some cases, disconnect from the anchoring post. In some embodiments, to prevent over-rotations of the proof mass, cap stoppers positioned above the proof may be employed. FIG. 8 is a top view of an angular accelerometer comprising a proof mass 200 and a plurality of cap stoppers 801. While FIG. 8 illustrates eight cap stoppers, any other suitable number of cap stoppers may be used. The cap stoppers may be formed in a cap layer positioned at a distance, measured along the z-axis, from proof mass 200. Such distance may be between 100 nm and 100 µm in some embodiments, between 1 µm and 20 µm in some embodiments, between 1 µm and 10 µm in some embodiments, between 1 µm and 2 µm in some embodiments, or between any other suitable value or range of values. In some embodiments, the cap layer may be part of a cap wafer. In some embodiments, the cap wafer may be bonded to the wafer comprising the proof mass. The cap stoppers may comprise a beam in some embodiments. In some embodiments, the cap stoppers may comprise an element attached to one end of the beam. Such element may have a circular shape, an elliptical shape, a polygonal shape, or any other suitable shape. The cap stoppers may be configured to limit movements of the proof mass about the x-axis and/or y-axis in response to accelerations having magnitudes exceeding a safety threshold. If accelerations having magnitudes exceeding the safety threshold are applied on proof mass 200 about the x-axis and/or y-axis, proof mass 200 may hit one or more cap stoppers 801, thus limiting the movement of the proof mass and avoiding over-rotation.

In some instances, proof mass 200 may hit substrate 501 and/or one or more cap stoppers 801 as it move in response to accelerations about the x-axis and/or the y-axis. In some of those instances, the bottom surface of proof mass 200 may stick to substrate 501 and/or the top surface of proof mass 200 may stick to one or more cap stoppers 801. Such scenario is not desirable as adhesion of the proof mass to a surface, whether the substrate or a cap stopper, may impede the proof mass' ability to move freely in response to accelerations. To avoid adhesion, one or more bumps may be disposed on the top surface and/or the bottom surface of proof mass 200.

Figure 9:
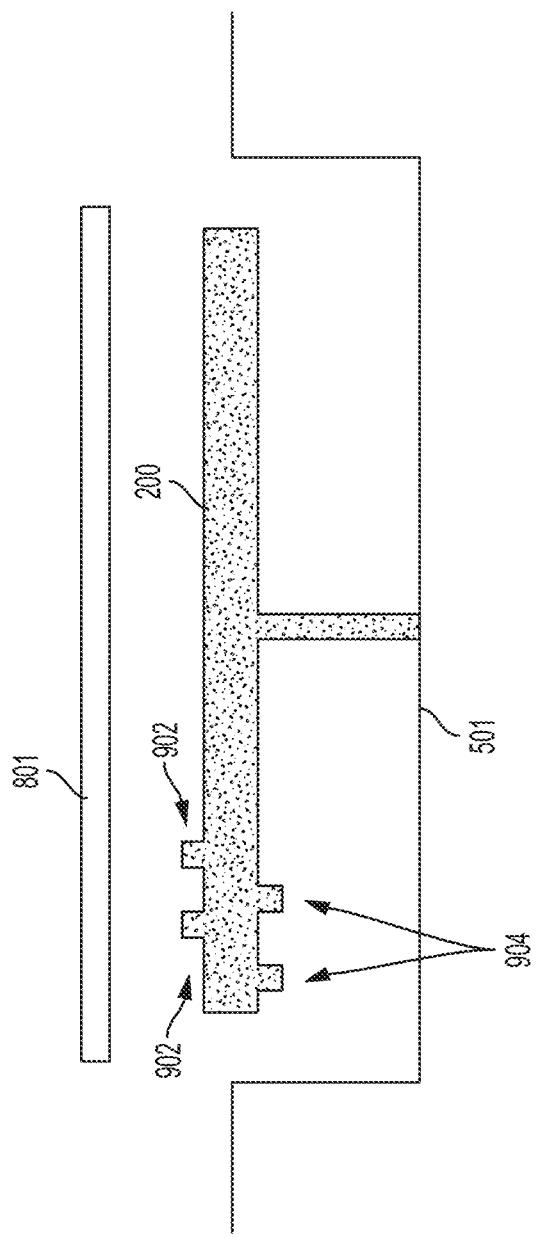
FIG. 9 is a side view of an angular accelerometer comprising a proof mass having a plurality of bumps disposed on the bottom side of the proof mass and a plurality of bumps disposed on the top side of the proof mass, according to a non-limiting embodiment of the present application.

FIG. 9 is a side view of an angular accelerometer comprising a proof mass 200 having one or more bottom side bumps 904 disposed on the bottom side of the proof mass and one or more top side bumps 902 disposed on the top side of the proof mass. The bottom side bumps may be configured to prevent the bottom side of the proof mass from sticking to substrate 501. The bottom side bumps may be disposed in any suitable location of the bottom side of proof mass 200. For example, bottom side bumps 904 may be disposed on the bottom side of curved beam 201. The top side bumps may be configured to prevent the top side of the proof mass from sticking to cap stopper 801. For example, top side bumps 902 may be disposed on the top side of curved beam 201, at locations on the xy-plane corresponding to the cap stoppers 801, as illustrated in FIG. 8.

The features and embodiments of FIGS. 3-9 are described in connection with proof mass 200. However, it should be appreciated that such features and embodiments may alternatively be used in connection with proof mass 250.

Aspects of the present application may provide one or more benefits, some of which have been previously described. Now described are some non-limiting examples of such benefits, although it should be appreciated that not all aspects and embodiments necessarily provide all of the benefits now described and that benefits in addition to those now described may be realized with some of the aspects.

Aspects of the present application allow for single proof mass 3-axis angular accelerometers exhibiting minimal signal offset. Signal offset may be caused by mechanical stress experienced by the acceleration-sensitive elements. Signal offset may be particularly severe in angular accelerometers having single anchoring posts. According to aspect of the present application, the amount of mechanical stress experienced by the sensing elements may be reduced by extending the sensing elements toward the center of the proof mass.

Aspects of the present application allow for single proof mass 3-axis angular accelerometers exhibiting high, and in at least some embodiments maximal, detection sensitivity. The detection sensitivity may be enhanced by positioning the elements sensing acceleration about the x-axis and/or y-axis at distances from the anchoring post that are greater than the distances between any one of the z-sensing elements and the anchoring post.

Aspects of the present application provide low power 3-axis angular accelerometers. The accelerometers may consume a power less than 100 microWatts in some embodiments, less than 20 microWatts, less than 10 microWatts, between 5 and 50 microWatts, or any value or range of values within such ranges. The accelerometer may consume less than 20 microAmps across the output data rates. Thus, the accelerometers may lend themselves to low power applications, such as use within battery-powered devices.

Angular accelerometers according to one or more aspects of the present application may provide various beneficial operating characteristics. In some embodiments, the accelerometers may provide detection of angular rates between 1,000 rad/s$^2$ and 20,000 rad/s$^2$, or any range within such ranges. Variable and multi-cell combs may increase and in some embodiments maximize lateral capacitance. Beneficial sizing may be provided. For example, the proof mass may be between 800 microns and 950 microns in radius in some embodiments. The device may be manufacturable using 16-micron MEMS processing techniques. In some embodiments, a temperature sensor may be integrated with the accelerometer. Three and four wire SPI may be provided.

The 3-axis angular accelerometers of the types described herein may form part of various systems with applications in a variety of fields, such as in sports, healthcare, and industrial settings (e.g., machine health monitoring), among others. The various systems may form part of, or be used, in an Internet of Things network. Examples of such systems and applications are now described.

Figure 10A:
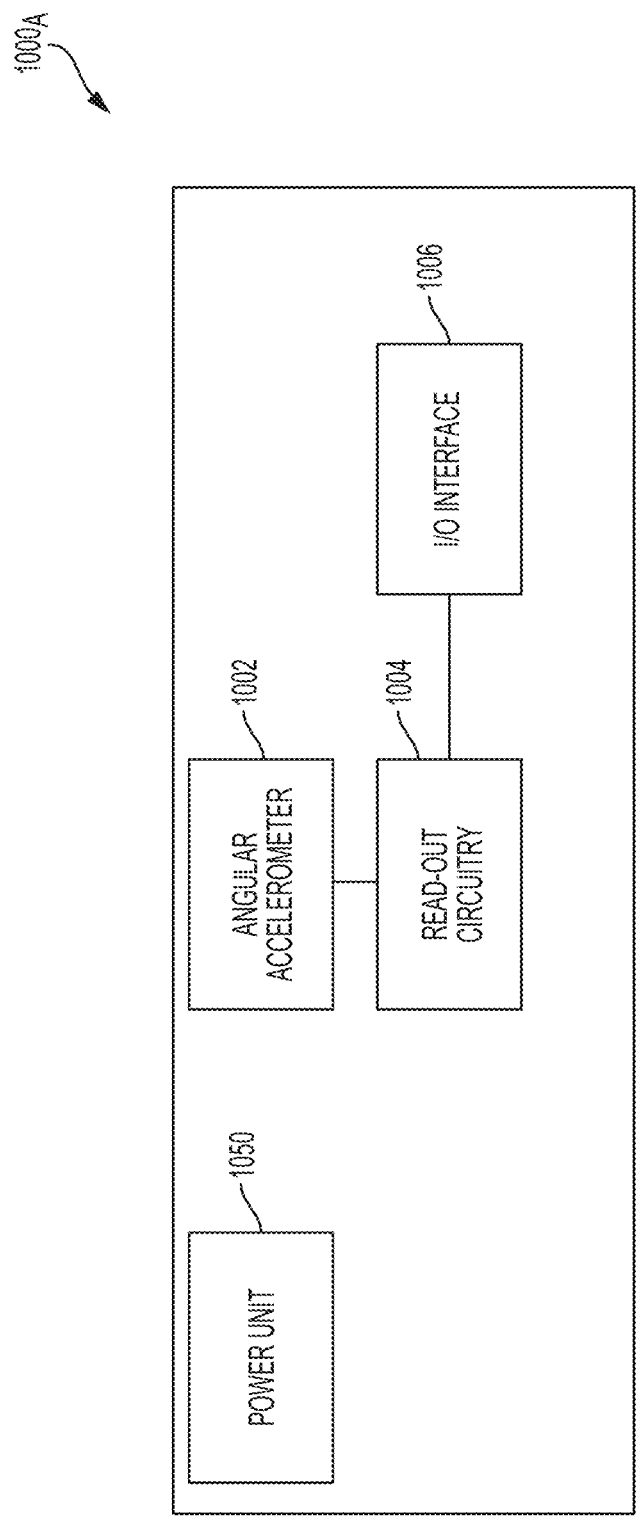
FIGS. 10A-10D illustrate in block diagram form a variety of systems incorporating an angular accelerometer of the types described herein.

FIG. 10A illustrates an example of one type of system incorporating an angular accelerometer as described herein, and which may be considered an angular acceleration sensor. The system $1000_A$ includes an angular accelerometer 1002, read-out circuitry 1004, input/output (I/O) interface 1006 and power unit 1050. Angular accelerometer 1002 may be of the type described in connection with FIGS. 1-3, 5A-5C, 6, 7A, 7B, 8, 9 or any suitable type described herein.

The read-out circuitry 1004 may be configured to provide signals proportional to the angular acceleration(s) sensed by angular accelerometer 1004. For example, the read-out circuitry 1004 may be connected to the metal pads shown in FIG. 5C to generate signals proportional to the sensed capacitances. For instance, the read-out circuitry 1004 may be connected to: (a) metal pads $S_x^-$ and $S_x^+$; and/or (b) metal pads $S_y^-$ and $S_y^+$; and/or (c) metal pads $S_z^-$ and $S_z^+$. From these connections, the read-out circuitry 1004 may generate respective signals proportional to the respective capacitances of capacitors $C_x^-$ and $C_x^+$, $C_y^-$ and $C_y^+$, and $C_z^-$ and $C_z^+$. In some embodiments the signal(s) produced may be single-ended, while in other embodiments they may be differential. The read-out circuitry may include any suitable components for performing such read-out functions, as well as circuitry for signal processing functions such as filtering, amplifying, and demodulating. The read-out circuitry may comprise a trans-impedance amplifier in some embodiments. The read-out circuitry may be an application specific integrated circuit (ASIC) in some embodiments, and may be formed on a different substrate from the angular accelerometer, or on the same substrate in some embodiments.

In the system of FIG. 10A, the read-out circuitry 1004 is connected to I/O interface 1006, which may serve as a communication interface through which the system $1000_A$ communicates with an external device, such as a remote computer or server. Thus, the I/O interface 1006 may transmit the angular acceleration(s) sensed by angular accelerometer 1002 outside system $1000_A$ for further processing and/or display. Additionally or alternatively, the I/O interface 1006 may receive communications from an external device such as control signals, wireless charging signals, or software updates.

The I/O interface 1006 may be wired or wireless. Suitable wired connections include Universal Serial Bus (USB) and Firewire connections, among others. In those embodiments in which a wired connection is used, the connection may be pluggable. Wired connections may be used in settings in which the system $1000_A$ is relatively immobile, for example when fixed on a substantially stationary object, or when the distance between system $1000_A$ and an external device with which it communicates remains relatively constant. In some embodiments, however, the I/O interface may be wireless, for example communicating via a flexible radio frequency (RF) antenna.

Figure 11:
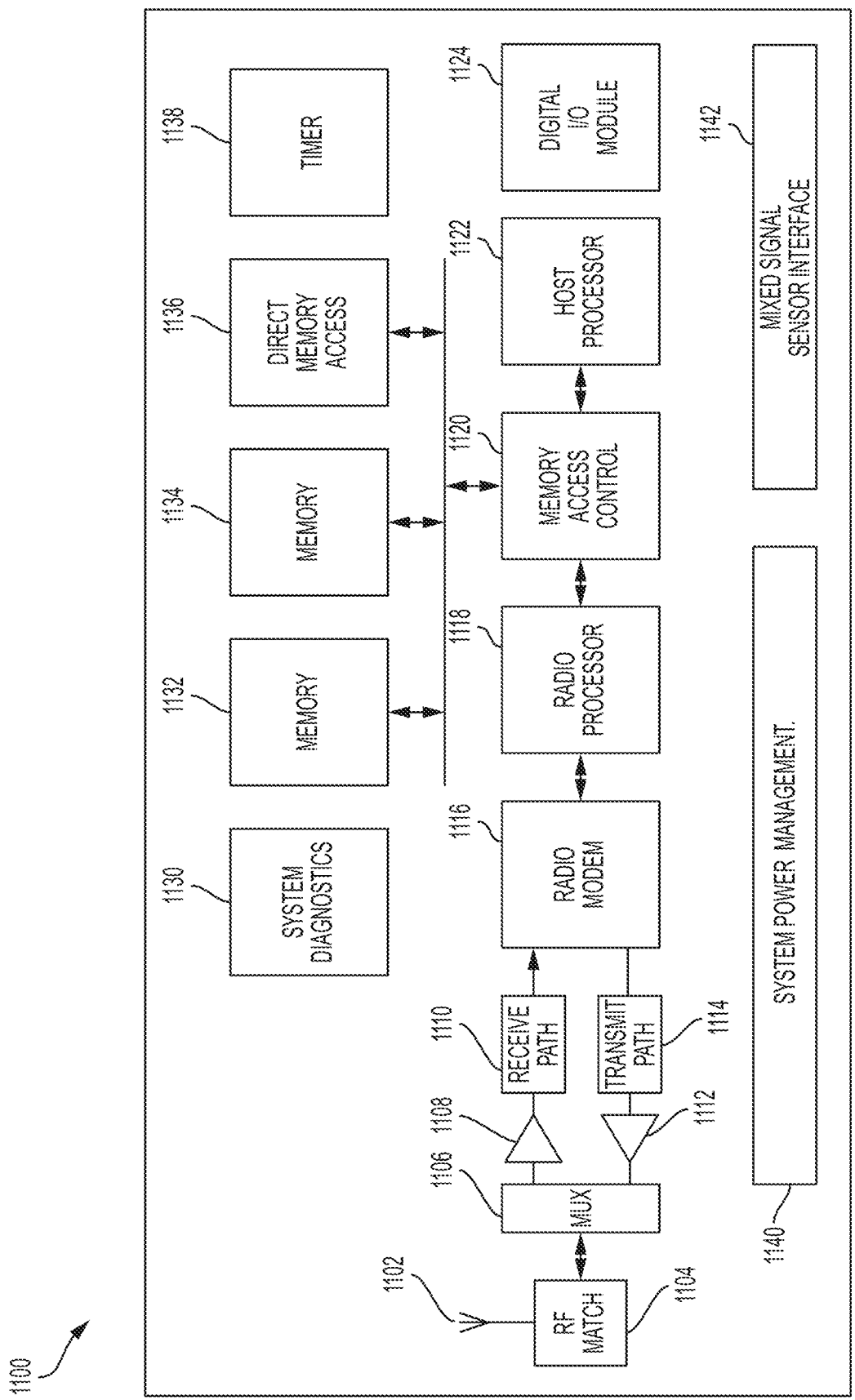
FIG. 11 illustrates a block diagram of an exemplary implementation of an input/output (I/O) interface as may be implemented in the systems of FIGS. 10A-10D.

FIG. 11 illustrates a block diagram of an exemplary implementation of an I/O interface 1006. Wireless I/O interface 1100 of FIG. 11 may serve as I/O interface 1006 of FIG. 10A. Wireless interface I/O 1100 may be configured to transmit and/or receive data via Wi-Fi, Bluetooth, Bluetooth Low Energy (BLE), Zigbee, Thread, ANT, ANT+, IEEE 802.15.4, IEEE 802.11.ah, or any other suitable wireless communication protocol. Alternatively, or additionally, wireless I/O interface may be configured to transmit and/or receive data using proprietary connectivity protocols. Wireless I/O interface 1100 may comprise an antenna 1102, an RF match 1104, a multiplexer (mix) 1106, amplifiers 1108 and 1112, receive path 1110, transmit path 1114, radio modem 1116, radio processor 1118, memory access control 1120, host processor 1122, digital I/O module 1124, system diagnostics 1130, memories 1132 and 1134, direct memory access 1136, timer 1138, system power management 1140, mixed signal sensor interface 1142, or any suitable combination thereof. Antenna 1102 may comprise a microstrip antenna, a loop antenna, a slot antenna, a serpentine-shaped antenna, or any other suitable type of antenna. In some embodiments, antenna 1102 may comprise one or more carbon nanotube antennas. RF match 1104 may be connected to antenna 1102, and may comprise circuitry configured to provide impedance matching, and/or to provide a desired impedance. Multiplexer (mux) 1106 may be configured to combine and/or separate communication channels in the time domain and/or in the frequency domain. Alternatively, or additionally, multiplexer 1106 may be configured to separate transmit signals directed to antenna 1102 from receive signals obtained by antenna 1102. Amplifier 1108 may be configured to amplify a signal received with antenna 1102. In some embodiments, a receive path 1110 may be provided and may be coupled to amplifier 1108. Receive path 1110 may comprise a filter in some embodiments. Similarly, transmit path 1114 may comprise a filter, and may be configured to provide a transmit signal to amplifier 1112. Radio modem 1116 may comprise circuitry configured to modulate a signal for transmission, and/or demodulate received signals.

Radio processor 1118 may be configured to select the type of communication protocol, the data rate, the communication channel, the type of data to be transmitted, or any other suitable transmission parameter. The data to be transmitted may be stored within memory 1132 or memory 1134. Radio processor 1118 may be configured to access the data stored in any of the memories of wireless I/O interface 1100. Memory access control 1120 and direct memory access 1136 may be configured to access any of the memories of wireless I/O interface 1100 independently of radio processor 1118. For example, host processor may request access to the memory using direct memory access 1136 without having to send an interrupt signal to radio processor 1118. Host processor 1122 may be configured to control the operations of wireless I/O interface 1100. For example, host processor may control system power management 1140 to place the wireless I/O interface in sleep mode, thus increasing battery's lifetime. The I/O interface may be placed in sleep mode at certain predetermined times. In some embodiments, a I/O interface may be placed in a sleep mode, and may wake up at regular intervals, such as once a second, to monitor if a device, such as ASIC 1010, has provided a wake up signal. ASIC 1010 may be configured to provide wake up signals when a sensor, such as accelerometer 1002 has detected a signal or a signal variation. In some embodiments, the sleep/awake duty cycle may be less than 50%, less than 20%, less than 1% or less than 0.1%.

In some embodiments, host processor 1122 may be configured to perform data compression on the data obtained by a sensor, such as angular accelerometer 1002. For example, the compression may comprise creating a data set representing the variations in an existing data set. The compression may be performed to decrease the size of the packet, or sequence, to be transmitted.

Timer 1138 may provide a time base to wireless I/O interface 1100. System diagnostics 1130 may be configured to perform tests to verify the integrity of any suitable combination of the components of wireless I/O interface 1100. Mixed signal sensor interface 1142 and digital I/O module 1124 may be configured to provide signals obtained with one or more sensors.

In some embodiments, wireless I/O interface 1100 may be configured to transmit a continuous flux of data. In such embodiments, data obtained by a sensor, such as angular accelerometer 1002 may be transmitted in a streaming mode. In other embodiments, data may be buffered within a memory of the I/O interface, for example memory 1132 or 1134. In such embodiments, a processor, such as radio processor 1118 or host processor 1122 may be configured to access the data buffered in the memory, and to provide the data to antenna 1102 for transmission. Antenna 1102 and/or any suitable component of wireless I/O interface 1100 may be disposed on a substrate in some embodiments, such as a flexible substrate.

Referring back to FIG. 10A, power unit 1050 may provide power to some or all the components of the system $1000_A$, and may take various forms. In some embodiments, power unit 1050 may comprise one or more batteries. As previously described, angular accelerometers of the types described herein may, in at least some embodiments, consume sufficiently little power to allow for their operation for extended periods based solely on battery power. The batteries may be rechargeable in some embodiments. Power unit 1050 may comprise one or more lithium-ion batteries, lithium polymer (LiPo) batteries, super-capacitor-based batteries, alkaline batteries, aluminum-ion batteries, mercury batteries, dry-cell batteries, zinc-carbon batteries, nickel-cadmium batteries, graphene batteries or any other suitable type of battery.

In some embodiments, power unit 1050 may comprise circuitry to convert AC power to DC power. For example, power unit 1050 may receive AC power from a power source external to system $1000_A$, such as via I/O interface 1006, and may provide DC power to some or all the components of system $1000_A$. In such instances, power unit 1050 may comprise a rectifier, a voltage regulator, a DC-DC converter, or any other suitable apparatus for power conversion.

Power unit 1050 may include energy harvesting components and/or energy storage components, in some embodiments. Energy may be harvested from the surrounding environment and stored for powering the system $1000_A$ when needed, which may include periodic, random, or continuous powering. The type of energy harvesting components implemented may be selected based on the anticipated environment of the system $1000_A$, for example based on the expected magnitude and frequency of motion the system $1000_A$ is likely to experience, the amount of stress the system is likely to experience, the amount of light exposure the system is likely to experience, and/or the temperature(s) to which the system is likely to be exposed, among other possible considerations. Examples of suitable energy harvesting technologies are shown and described with respect to FIGS. 12, 13A-13B, and 14, 15, 16, 17, 18 19, and 20A-20B.

Figure 12:
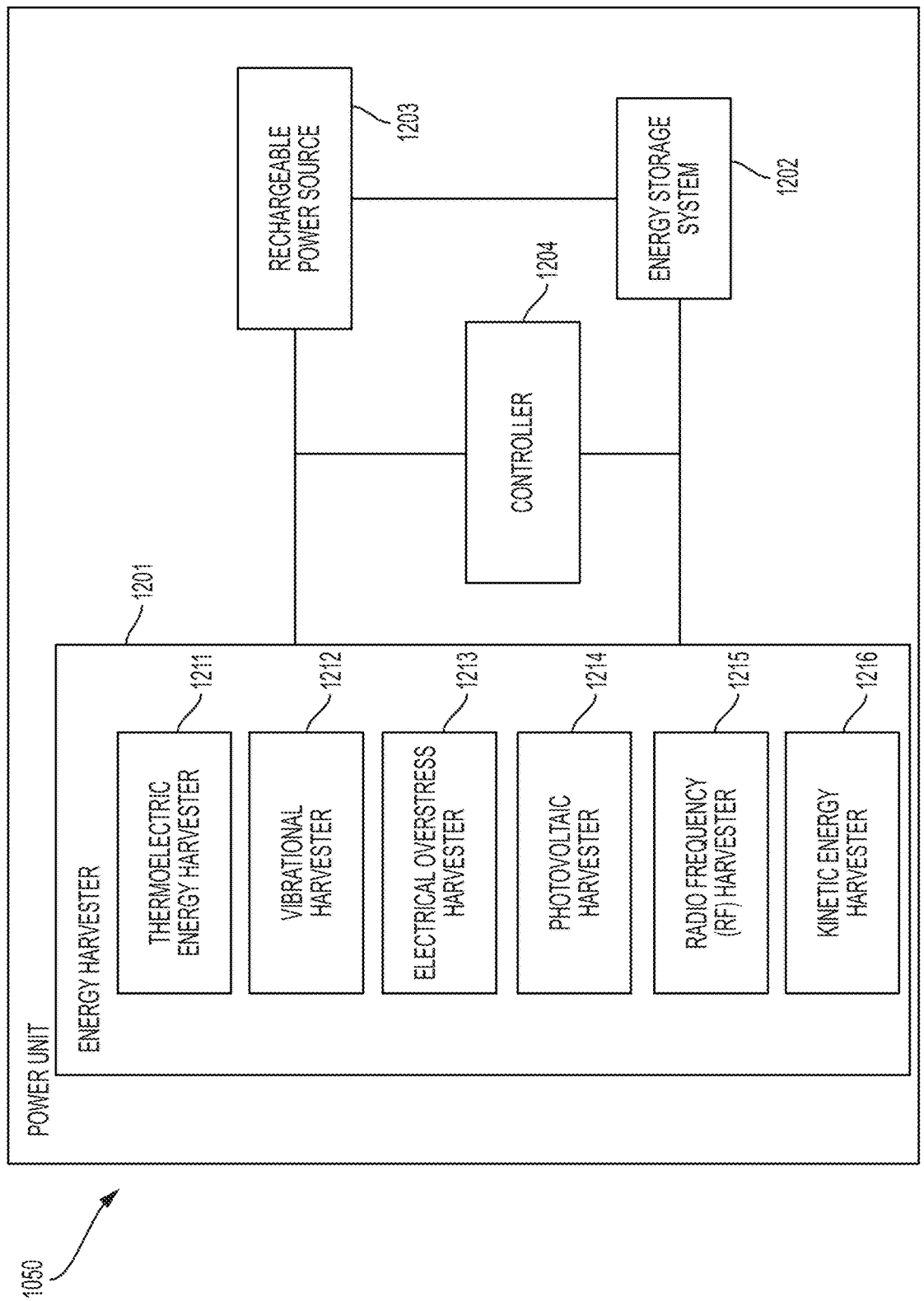
FIG. 12 illustrates in block diagram form a power unit of the type which may be employed in the systems of FIGS. 10A-10D, including an energy harvester, a rechargeable power source, and an energy storage system.

FIG. 12 illustrates a block diagram of an exemplary implementation of power unit 1050, according to some non-limiting embodiments. Power unit 1050 may comprise one or more energy harvesters 1201, one or more rechargeable power sources 1203, one or more energy storage systems 1202, and a controller 1204. Energy harvester 1201 may comprise one or more of thermoelectric energy harvester 1211, vibrational harvester 1212, electrical overstress harvester 1213, photovoltaic harvester 1214, radio frequency (RF) harvester 1215, kinetic energy harvester 1216, or any suitable combination thereof. Alternatively, or additionally, other suitable types of energy harvesters may be used. In some embodiments, power unit 1050 may comprise a controller 1204, which may comprise any suitable logic circuitry, such as a processor, an application specific integrated circuit (ASIC) or a field gate programmable array (FPGA). Controller 1204 may be connected to rechargeable power source 1203 and/or to energy storage system 1202 and/or to energy harvester 1201. Based on the requirements of the system being powered, controller 1204 may be configured to select the type of output power provided, such as alternate current (AC) or direct current (DC) power. In some embodiments, based on the availability of harvested power, controller 1204 may be configured to select whether to output power harvested through energy harvester 1201, stored in rechargeable power source 1203 or energy storage system 1202, or any suitable combination thereof.

Figure 13A:
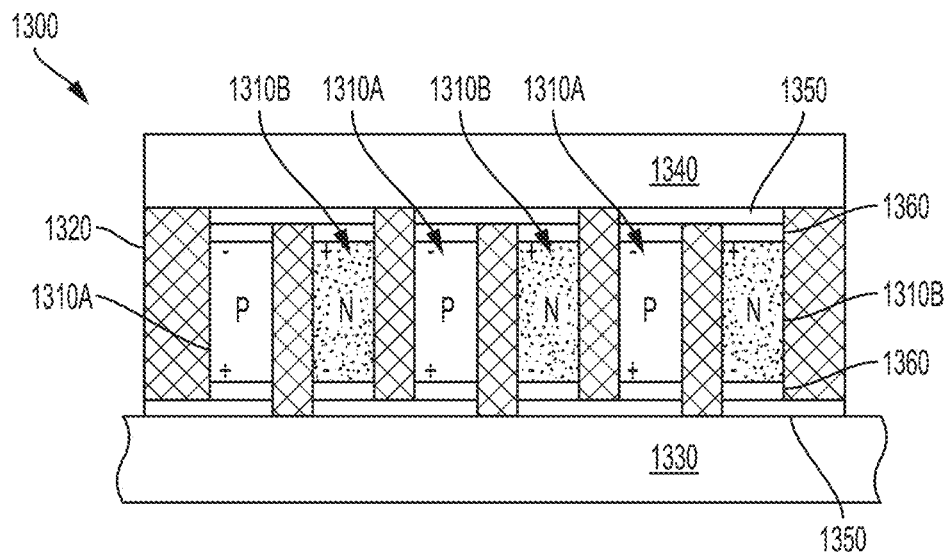
FIGS. 13A-13B illustrate photovoltaic energy harvesters of a type which may be employed in the power unit of FIG. 12.
Figure 13B:
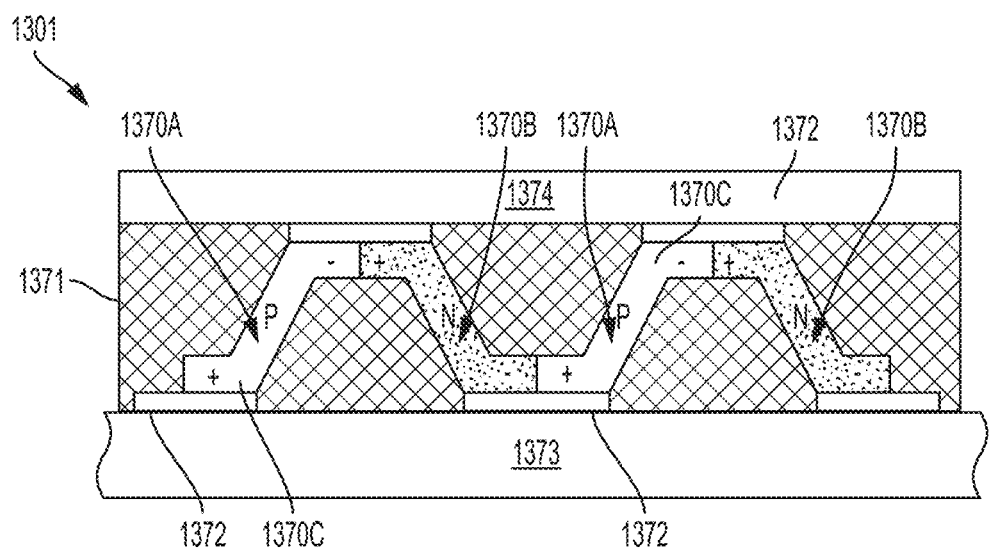

Non-limiting examples of thermoelectric energy harvesters which may be used as thermoelectric energy harvester 1211 are illustrated in FIGS. 13A-13B. The thermoelectric energy harvester 1300 of FIG. 13A may comprise a plurality of thermoelectric elements 1310A, 1310B, above a substrate layer 1330 and within a dielectric layer 1320. The thermoelectric elements 1310A, 1310B may include elements of different types of thermoelectric material (e.g., p-type and n-type). The thermoelectric elements 1310A, 1310B may be interconnected such that each thermoelectric element contributes to the overall energy provided by the thermoelectric energy harvester 1300 in response to a temperature gradient between a first side (e.g., hot side) and a second side (e.g., cold side). A thermal contact layer 1340 may be provided above the dielectric layer 1320 to support the temperature gradients between the first side and the second side. The thermal contact layer 1340 may be made of a material that is a good heat conductor.

As shown in FIG. 13A, the thermoelectric energy harvester 1300 may include a vertical structure provided with the dielectric layer 1320 and may be formed as a single wafer. The wafer scale structure of the thermoelectric energy harvester 1300 allows it to be integrated with other integrated circuit components (not shown in FIG. 13A) on or near the substrate 1330.

As described, the thermoelectric elements 1310A, 1310B may include different types of thermoelectric materials (e.g., p-type and n-type). The thermoelectric material of the thermoelectric elements 1310A, 1310B may be selected to generate a flow of charge carriers of different polarity from one end of the thermoelectric element to an opposite end, in response to a temperature difference between the two ends. In a thermoelectric element 1310A including p-type material, the positive charge carriers may flow from a hot end to an opposite cold end. In contrast, in a thermoelectric element 1310B including n-type material, the electrons may flow from an end having the heat source to the opposite end which is cooler.

The plurality of the thermoelectric elements 1310A, 1310B may be connected in an array while alternating the type of material (e.g., between n-type and p-type) in the adjacent thermoelectric elements 1310A and 1310B. In this manner, the voltages and/or currents that are developed across the thermoelectric elements 1310A and 1310B may be summed together to generate a larger aggregate voltage and/or current than the thermoelectric elements 1310A and 1310B do individually. For example, thermoelectric elements 1310A having p-type material may be connected in series with thermoelectric elements 1310B having n-type material. The thermoelectric elements 1310A, 1310B may be arranged such that all of the adjacent thermoelectric elements to a given thermoelectric element include a type of material that is different than the material of the given thermoelectric element. Outputs of the arrays of the thermoelectric elements 1310A and 1310B may be connected in parallel to provide the energy required in a particular application.

Interconnects 1350 may connect the thermoelectric elements 1310A and 1310B to adjacent thermoelectric elements 1310A and 1310B. While each thermoelectric element 1310A, 1310B may provide a small amount of energy, connecting the thermoelectric elements 1310A, 1310B in an array may provide the higher energy needed for a particular application. When heat is applied to one side of the thermoelectric energy harvester 1300, electrons in the thermoelectric elements 1310A having p-type material may flow from the cold side to the hot side of the thermoelectric elements 1310A and the electrons in the thermoelectric elements 1310B having n-type material may flow from the hot side to the cold side of the thermoelectric elements 1310B. Thus, if the thermoelectric elements 1310A are connected in series with the thermoelectric elements 1310B, forming a thermoelectric couple, the electrons may flow from a cold side of the p-type material, to a hot side of the p-type material, into the hot side of the n-type material via the interconnect 1350, and into the cold side of the n-type material. The energy generated in each of the thermoelectric elements 1310A, 1310B may be combined and provided at the output terminals of the thermoelectric energy harvester 1300.

The thermoelectric elements 1310A, 1310B may have a shape that maximizes the surface of the thermoelectric element 1310A, 1310B that is adjacent to the dielectric layer 1320. The thermoelectric elements 1310A, 1310B may have a rectangular shape with the sides having a longer end being adjacent to the dielectric layer 1320 and the shorter sides being adjacent to the interconnects 1350. In another embodiment, at least one side of the thermoelectric elements 1310A, 1310B may be a square.

The material of the thermoelectric elements 1310A, 1310B may be selected such that the thermal resistance of the thermoelectric elements 1310A, 1310B is smaller than the thermal resistance of the dielectric layer 1320 so that the dielectric layer will not cause too much thermal shunting. A high thermal resistance of the thermoelectric elements 1310A, 1310B may ensure that a sufficient temperature difference is maintained between a hot side and a cold side of the thermoelectric elements 1310A, 1310B. The thermal resistance of the thermoelectric elements 1310A, 1310B may be increased by controlling the doping level of the thermoelectric elements 1310A, 1310B or by introducing scattering elements to increase the photon scattering in the thermoelectric elements 1310A, 1310B without affecting significantly their electric conduction. The concentration of the doping level or the scattering elements may be increased or decreased at one end of the thermoelectric elements 1310A, 1310B as compared to an opposite end of the thermoelectric element 1310A, 1310B.

For example, thermoelectric elements 1310A can be p-type $Bi_xSb_{(2-x)}Te_3$, p-type $Bi_2Te_3/Sb_2Te_3$ superlattices or p-type $Si/Si_{(1-x)}Ge_x$ superlattices and thermoelectric elements 110B can be n-type $Bi_2Te_{(3-x)}Se_x$, n-type $Bi_2T_3/Bi_2Te_{(3-x)}Se_x$ superlattices or n-type $Si/Si_{(1-x)}Ge_x$ superlattices. The dielectric layer 1320 may be a polyimide, as it has low thermal conductivity and it may help on processing of the thermoelectric elements. The thermal contact layer 1340 may be any electrically insulating but thermally conductive layer. In one embodiment, the thermal contact layer 1340 may be made of multiple layers. For example, the thermal contact layer 1340 may include a thin non-conductive layer such as oxide or nitride and one or more thicker metal layers on top to enhance thermal conduction. The thermal contact layer 1340 may provide insulation at the interface to electric interconnection layer 1350 to prevent electric short of electric interconnection layers 1350. The substrate 1330 can be any semiconducting substrate with enough thickness to promote thermal conduction at the bottom side. While the configuration of the substrate 1330 as cold side and the top thermal contact layer 1340 as the hot side is shown, the device can also function with the substrate 1330 as the hot side and top thermal contact layer 1340 as the cold side.

In the exemplary embodiments, the dielectric layer 1320 may comprise one or more high dielectric breakdown materials, such as polyimide, silicon dioxide, silicon nitride, or any other suitable type of dielectric. The dielectric layer 1320 may electrically insulate the thermoelectric elements 1310A, 1310B. The dielectric layer 1320 may suppress the conduction of heat away from the thermoelectric elements 1310A, 1310B. The dielectric layer 1320 may have a lower thermal conductivity than the substrate 1330 and/or the thermoelectric elements 1310A, 1310B. The dielectric layer 1320 may surround the thermoelectric elements 1310A, 1310B at four sides to thermally shunt the thermoelectric elements 1310A, 1310B and allow the thermal gradient be developed across the thermoelectric elements 1310A, 1310B and to allow most heat to travel to the sides of the thermoelectric energy harvester 1300. Higher thermal resistance of the thermoelectric elements 1310A, 1310B as compared to the thermal resistance of the substrate 1330 and/or thermal contact layer 1340, may allow the available thermal gradient to drop across the thermoelectric elements rather than the thermal contact layer or the substrate 1330. Thus, a temperature difference, which in some embodiments may be a maximum temperature difference, may be maintained between the hot side and the cool side of the thermoelectric elements 1310A, 1310B.

Barrier metals 1360 may be included between the thermoelectric elements 1310A, 1310B and the interconnects 1350 to isolate the semiconductor materials of the thermoelectric elements 1310A, 1310B from the metal interconnects 1350, while maintaining an electrical connection between the thermoelectric elements 1310A, 1310B and the interconnects 1350. The barrier metals 1360 may be included to prevent diffusion of the interconnects 1350 into the semiconductor materials of the thermoelectric elements 1310A, 1310B.

When heat is applied to one side (e.g., hot side) of the thermoelectric energy harvester 1300, electrons may flow in one direction in the thermoelectric elements 1310A having the p-type material and in another direction in the thermoelectric elements 1310B having the n-type material. Because the thermoelectric elements 1310A, 1310B are connected in series, the energy generated in each of the thermoelectric elements 1310A, 1310B may be combined to provide the combined energy at the outputs of the thermoelectric energy harvester 1300. The incoming heat may be distributed by the thermal contact layer 1340 to the hot side of the thermoelectric elements 1310A, 1310B while the substrate 1330 may cool the cool side of the thermoelectric elements 1310A, 1310B.

FIG. 13B illustrates an exemplary configuration of a thermoelectric energy harvester 1301, according to another non-limiting embodiment, and which may serve as the thermoelectric energy harvester 1211 of FIG. 12. The thermoelectric energy harvester 1301 may include a plurality of thermoelectric elements 1370A, 1370B above the substrate layer 1373 and within a dielectric layer 1371 above the substrate layer 1373. The thermoelectric elements 1370A, 1370B may be arranged in an array while alternating the type of material (e.g., between n-type and p-type) in the adjacent thermoelectric elements 1370A and 1370B. The plurality of thermoelectric elements 1370A, 1370B may be connected in series via interconnects 1372. A thermal contact layer 1374 may be provided above the thermoelectric elements 1370A, 1370B to dissipate the heat applied to the thermoelectric energy harvester 1201.

As shown in FIG. 13B, the thermoelectric elements 1370A and 1370B may be slanted. In addition, the thermoelectric elements 1370A and 1370B may include connecting portions 1370C on one or both ends of the thermoelectric elements 1370A and 1370B that connect to the interconnects 1372. The dielectric layer 1371 may allow for the thermoelectric elements 1370A and 1370B to include various shapes and orientations. The orientation and/or shape of the thermoelectric elements 1370A and 1370B may be changed based on available space for the thermoelectric energy harvester 1301 and/or on system performance requirements. The various shapes of the thermoelectric elements 1370A, 1370B may allow for the thermoelectric energy harvester 1301 to have a semi-vertical or quasi-lateral structure. These shapes of the thermoelectric elements 1370A, 1370B may allow for the thickness of the thermoelectric energy harvester 1301 to be reduced as compared to the vertical thermoelectric elements shown in FIG. 13A. The use of longer length, provided by the slanted configuration, may provide enhanced device thermal impedance. In a case where 1370A and 1370B are superlattices, device performance may be improved with thermal and electrical conduction along the slanted length, or along quantum wells of the device, by depositing superlattices 1370A and 1370B along the slanted surface. Changing the orientation of the thermoelectric elements 1370A and 1370B may reduce the space available (e.g., vertical space), while increasing, and in some embodiments maximizing, the surface area of the thermoelectric element 1370A and 1370B that is adjacent to the dielectric layer 1371.

The thermoelectric energy harvester 1211, whether embodied in the form of FIG. 13A, FIG. 13B, or some other form, may be beneficial for uses of the systems of FIGS. 10A-10D described herein when a temperature gradient is anticipated. For example, in the context of an industrial applications in which the system 1000A is to be positioned on a machine operating at high temperature with an external cooling air flow, a thermoelectric energy harvester may provide sufficient power to operate the system 1000A. Alternatively, when the system 1000A is to form a wearable device, whether for fitness or medical applications, one side of the device may be pressed against a user's skin or clothes, and the other side may be exposed to air. In such a configurations, a thermoelectric energy harvester 1111 may be employed to harvest energy as described in connection with FIGS. 13A-13B.

Figure 14:
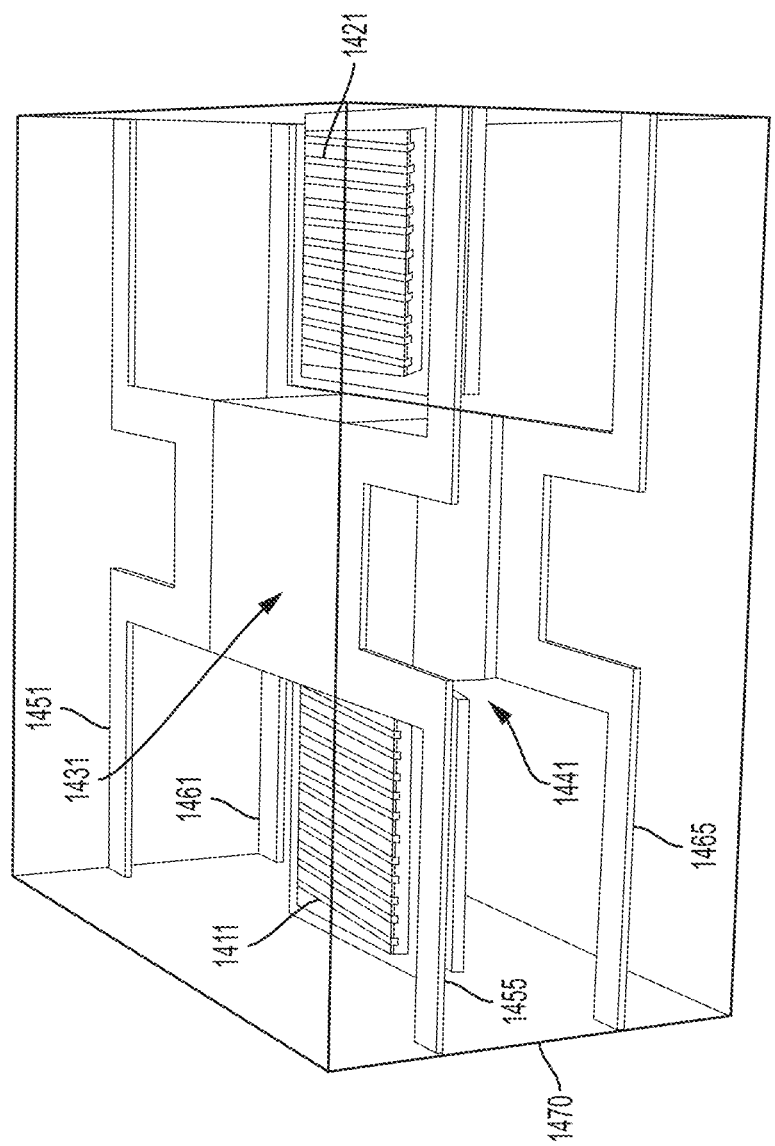
FIG. 14 illustrates a vibrational energy harvester of the type which may be employed in the power unit of FIG. 12.

As illustrated in FIG. 12, energy harvester 1201 may comprise one or more vibrational harvesters 1212. Vibrational harvesters may be configured to harvest, at least in part, energy associated with mechanically vibrating bodies. In some embodiments, vibrational harvesters may employ magnets and coils to electromagnetically harvest vibration energy. FIG. 14 illustrates an exemplary electromagnetic vibrational harvester, according to some non-limiting embodiments. The electromagnetic energy harvester may comprise coils 1411, 1421 with magnetic cores, and magnets 1431, 1441. The magnets may be provided on MEMS springs 1451, 1455, 1461, 1465. In some embodiments, the coils 1411, 1421 may be mounted on a stationary frame 1470, represented by the bounding box in FIG. 14. The magnets 1431, 1441 may be coupled to the frame 1470 via the MEMS springs 1451, 1465. This configuration may allow vibrational energy to cause the magnets 1431, 1441 to move in a predetermined direction with respect to the coils 1411, 1421 with a predetermined range of motion. Relative motion between the magnets 1431, 1441 and the coils 1411, 1421 may cause changes in the magnitude and orientation of magnetic flux that passes through the coils' cores, which may induce variations in currents through the coils.

The energy harvester of FIG. 14 may be fabricated using microelectronic semiconductor techniques. In some embodiments, the magnets 1431, 1441 and MEMS springs 1451, 1465 may be manufactured on a first integrated circuit substrate using micro-manufacturing techniques and the coils 1411, 1421 may be manufactured on a second integrated circuit also using micro-manufacturing techniques. The first integrated circuit substrate also would define the stationary frame 1470. The harvester assembly may be completed by mounting the coils 1411, 1421 within the frame 1470 in a permanent manner. In other embodiments, the coils 1411, 1421, the magnets 1431, 1441, and the MEMS springs 1451, 1465 may be manufactured within a single integrated circuit substrate.

The vibrational harvester 1212, whether embodied in the form of FIG. 14 or some other form, may be beneficial for uses of the systems of FIGS. 10A-10D described herein when vibrations are anticipated. For example, in the context of systems configured to detect vibrations suffered by bridges, buildings, overpasses, pylons or towers using accelerometers of the type described herein, a vibrational harvester 1212 may be employed to harvest vibrational energy. Alternatively, in the context of systems for the detection of accelerations associated with doors or windows on which they are mounted, a vibrational harvester 1212 may be employed to harvest vibrational energy. Alternatively, in the context of system for detecting accelerations associated with bicycle pedals, bicycle wheels, foot pod, helmets, rackets, clubs, bats or balls on which they are mounted, a vibrational harvester 1212 may be employed to harvest vibrational energy.

As illustrated in FIG. 12, energy harvester 1201 may comprise one or more electrical overstress harvesters 1213. Electrical overstress harvester 1213 may be configured to harvest energy from electrical overstress events. Overstress events include current and/or voltages that are beyond the specified limits of the electronic device. For example, an electronic device can experience a transient signal event, or an electrical signal of short duration having rapidly changing voltage or high power. Transient events can include, for example, electrostatic discharge (ESD) events arising from the abrupt release of charge from an object or person to an electronic system, or a voltage/current spike from the electronic device's power source.

In some embodiments, the energy released by an electrical overstress event may be harvested, and may be stored in the form of electrical charges in one or more energy storing elements, such as capacitor or batteries. In situations where temporary/transient charge harvested from, for example, an ESD event is sufficient to carry out a task, an electronic device may carry out the task using the harvested charge. When harvesting energy, voltage on a capacitor in the storage element can be monitored. Responsive to detecting that sufficient charge is stored on the capacitor, an interrupt may be provided to inform the system that sufficient energy is available to transmit a signal from the electronic system.

Figure 15A:
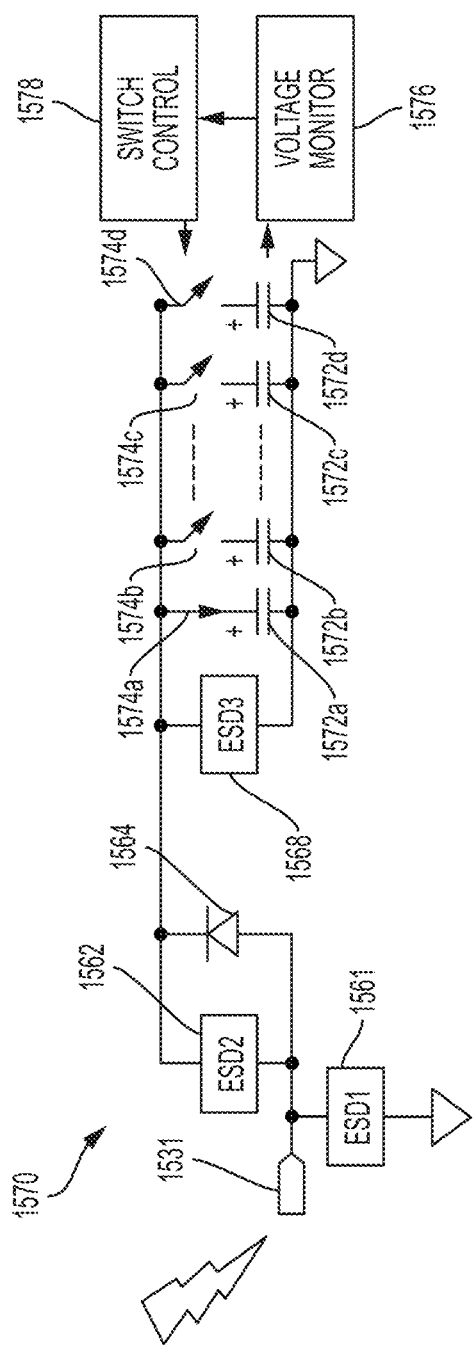
FIG. 15A illustrates an electrical overstress energy harvester of a type which may be employed in the power unit of FIG. 12.

An exemplary electrical overstress harvester is illustrated in FIG. 15A, according to some non-limiting embodiments. Electrical overstress harvester 1570 may be configured to store charge associated with an electrostatic discharge event in a bank of storage elements. In some instances, multiple electrostatic discharge events may occur. Such events may have different magnitudes. Having a bank of storage elements may enable charge associated with different events to be efficiently stored. A plurality of switches $1574_a$, $1574_b$, $1574_c$ and $1574_d$ may each be arranged in series with a respective capacitor $1572_a$, $1572_b$, $1572_c$ and $1572_d$. In some embodiments, the switches may be selectively turned on to connect respective capacitors to diode 1564. Energy associated with a electrostatic discharge event at pin 31 may be steered by diode 1564 to one of the capacitors $1572_a$, $1572_b$, $1572_c$ and $1572_d$. A voltage monitoring circuit 1576 may monitor the charge stored by the capacitors. The voltage monitoring circuit may determine which capacitor has the least amount of charge stored therein and/or which capacitors have charges below a predefined threshold. A switch control circuit 1578 may turn on a selected switch to connect the diode to the capacitor having the least amount of charge, or alternatively, to a capacitor having an amount of charge that is less than a predefined threshold. The ESD protection device 1561 may provide clamping for electrostatic discharge events that exceed the capacity of the system. In some embodiments, ESD protection device 1562 is disposed in parallel with diode 1564, thus protecting it from ESD events. In some embodiments, ESD protection device 1568 is disposed in parallel with the bank of capacitors, thus protecting them from ESD events.

Figure 15B:
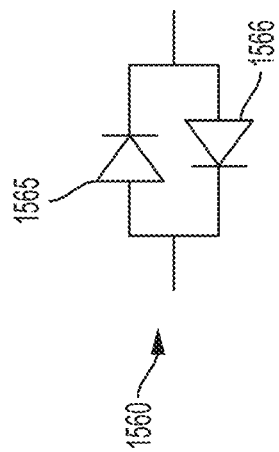
FIG. 15B illustrates an electrostatic discharge protection device of a type which may be employed in the electrical overstress energy harvester of FIG. 15A.

A non-limiting example of an ESD protection device is illustrated in FIG. 15B, according to some embodiments. Electrical overstress protection device 1560 may serve as ESD protection device 1561, 1562 and/or 1568. Electrical overstress protection device 1560 may comprise diode 1565 disposed in an anti-parallel configuration with diode 1566, such that the cathode of diode 1565 is connected with the anode of diode 1566, and vice versa. Other configurations are also possible. For example, in another embodiment, an electrostatic discharge protection device may comprise two diodes disposed in series, such that the anode of the first diode is coupled to the anode of the second diode or the cathode of the first diode is coupled to the cathode of the second diode. In yet another embodiment, an electrical overstress protection device may comprise at least one transistor, such as a bipolar transistor, as a blocking component.

As illustrated in FIG. 12, energy harvester 1201 may comprise one or more photovoltaic harvesters 1214. Photovoltaic harvester 1214 may be configured to absorb and convert light, such as sunlight, to electricity. Photovoltaic harvester 1214 may harvest photovoltaic energy in any suitable way. For example, photovoltaic harvester 1214 may comprise one or more crystalline photovoltaic cells, one or more thin film photovoltaic cells, one or more amorphous silicon photovoltaic cells, or any other suitable type of photovoltaic cell.

Figure 16:
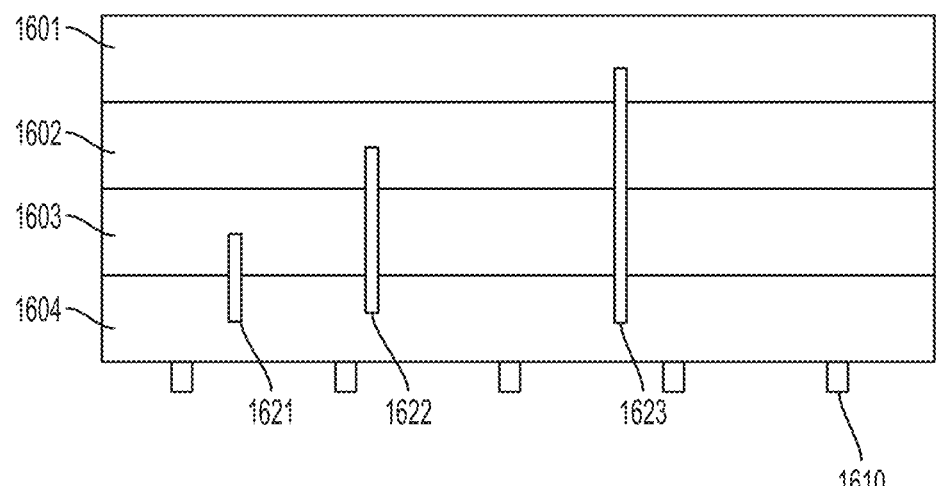
FIG. 16 illustrates an integrated system comprising one or more angular accelerometers of the types described herein and one or more photovoltaic harvesters.

In some embodiments, photovoltaic harvester 1214 may be co-integrated with one or more MEMS angular accelerometer of the type described herein on the same die. For example, the harvester and the accelerometer may be disposed side-by-side on the same layer of an integrated circuit. In some embodiments, the photovoltaic harvester and the accelerometer may be vertically integrated. FIG. 16 illustrates an integrated system comprising one or more angular accelerometers and one or more photovoltaic harvesters, according to some non-limiting embodiments.

Integrated system 1600 may comprise a plurality of stacked layers, formed using microfabrication processing techniques or other suitable methods. Integrated system 1600 may comprise harvester layer 1601, energy storage layer 1602, MEMS layer 1603, and conditioning/processing circuit layer 1604. The layers may be ordered in any suitable way. Integrated system 1600 may further comprise interconnections 1621, 1622 and 1623 and one or more interconnection 1610. Harvester layer 1601 may comprise one or more photovoltaic harvesters 1214 and/or other types of energy harvesters, such as the harvesters described in connection with FIGS. 13A-13B, 14. Energy storage layer 1602 may comprise one or more energy storage elements, such as capacitors and/or supercapacitors. Supercapacitors are described further below. The energy storage element(s) may be configured to store the energy harvested by the harvester(s) of harvester layer 1601, for example in the form of electric charges.

MEMS layer 1603 may comprise one or more angular accelerometers of the type described in connection with FIGS. 1-3, 5A-5C, 6, 7A, 7B, 8, 9 or any suitable combination thereof. In some embodiments, MEMS layer 1603 may comprise one or more linear accelerometers, such as 1-axis, 2-axis and/or 3-axis linear accelerometers. Conditioning/processing circuit layer 1604 may comprise circuitry for processing and conditioning signals and/or controlling the other components of integrated system 1600. The stacks may be interconnected through metal interconnections, such as thru silicon vias (TSVs). However, other types of interconnections may be used. For example, interconnection 1621 may be configured to route signals from conditioning/processing circuit layer 1604 to MEMS layer 1603 and/or vice versa. Interconnection 1622 may be configured to route signals from conditioning/processing circuit layer 1604 to energy storage layer 1602 or MEMS layer 1603, and/or vice versa. Interconnection 1623 may be configured to route signals from any of the layers of integrated system 1600 to any other layer. Interconnection 1610 may comprise a metallic pillar, bump, ball, pin or any other suitable type of interconnection configured to be connected to a circuit board.

The photovoltaic harvester 1214, whether embodied in the form of FIG. 16 or some other form, may be beneficial for uses of the systems of FIGS. 10A-10D described herein when exposure to light, such as sunlight, is anticipated. For example, in the context of systems using accelerometers of the type described herein for detecting vibrations suffered by bridges, buildings, overpasses, pylons or towers, photovoltaic harvester 1214 may be used, and may be disposed to capture light, such as sunlight, at least for a portion of the day. Alternatively, in the context of wearable devices for medical or fitness application, a system for detecting accelerations of the type described herein may comprise a photovoltaic harvester 1214. The system may be disposed in a way to capture light, at least temporarily.

As illustrated in FIG. 12, energy harvester 1201 may comprise one or more radio frequency (RF) harvesters 1215. Radio frequency (RF) harvester 1215 may comprise one or more antennas, such as a microstrip antenna, a loop antenna or a slot antenna, configured to capture electromagnetic energy. In some embodiments, RF harvester 1215 may be disposed on a substrate, such as a flexible substrate. RF harvester 1215 may be configured to harvest energy from electromagnetic radiation having frequencies between 1 GHz and 10 GHz in some embodiments, between 2 GHz and 3 GHz, in some embodiments, or between any other suitable frequency range. In some embodiments, RF harvester 1215 may comprise an RF transmitter and an RF receiver. The RF transmitter may be configured to emit electromagnetic radiation, and the RF receiver may be configured to harvest at least a portion of the electromagnetic radiation emitted by the RF transmitter.

As illustrated in FIG. 12, energy harvester 1201 may comprise one or more kinetic energy harvesters 1216. The kinetic energy harvester may be configured to capture the kinetic energy generated by low frequency motion directed in random directions. For example, a kinetic energy harvester may be configured to capture the kinetic energy associated with motions of an object or a person (e.g., a person jogging). In some embodiments, kinetic energy harvester 1216 may comprise a housing forming an internal chamber with an internal wall and a movable element contained within the internal chamber. The movable element may be configured to move freely. Within the internal chamber, the kinetic energy harvester may comprise a plurality of piezoelectric charge conversion elements positioned along the internal wall. The plurality of piezoelectric charge conversion elements may be positioned side-by-side to contact the movable element when the movable element moves within the internal chamber. In some embodiments, the movable element may be configured to simultaneously contact at least two of the plurality of side-by-side piezoelectric charge conversion elements. During use, the movable element may freely move within the internal chamber in response to movement of the entire housing (e.g., due to gravity or inertia).

Figure 17:
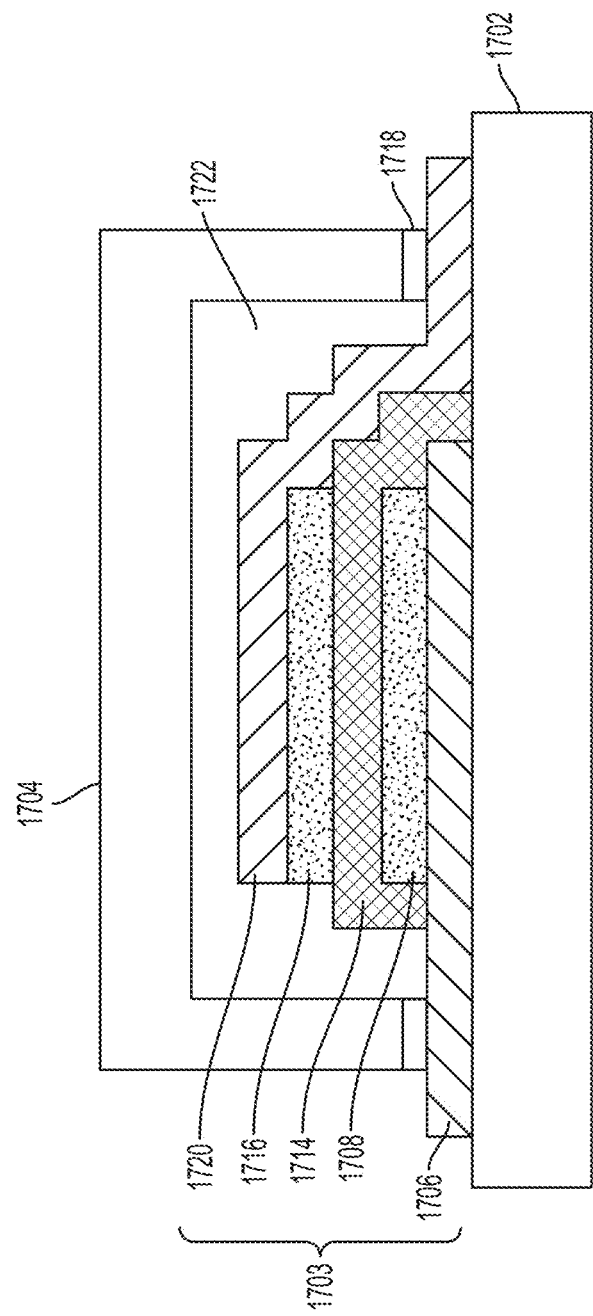
FIG. 17 illustrates a cross-section of an exemplary wafer-capped rechargeable power source which may be employed in the power unit of FIG. 12.

Power unit 1050 may comprise rechargeable power source 1203. The rechargeable power source may be configured to be recharged through power provided externally and/or energy provided through one or more harvesters. A non-limiting example of rechargeable power source is a wafer-capped rechargeable power source. The wafer-capped rechargeable power source may comprise a device wafer, a rechargeable power source disposed on a surface of the device wafer, and a capping wafer to encapsulate the rechargeable power source. The rechargeable power source may comprise an anode component, a cathode component, and an electrolyte component. FIG. 17 illustrates a cross-section of an exemplary wafer-capped rechargeable power source which may be employed as rechargeable power source 1203, according to some embodiments. The wafer-capped power source may comprise a device wafer 1702, a rechargeable power source 1703, and a capping wafer 1704. The device wafer 1702 may have an active surface and a back surface. The rechargeable power source 1703 may include a cathode current collector 1706, a cathode component 1708, an electrolyte component 1714, an anode component 1716, and an anode current collector 1720.

The electrolyte component 1714 may be an organic material or an ionic liquid material. When the electrolyte component is formed from an organic material such as propylene carbonate, ethylene carbonate or dimethyl carbonate, the cathode current collector 1706, the cathode component 1708, the anode component 1716 and the anode current collector 1720 may be formed from metals of good conductivity such as aluminum, copper or gold. When the electrolyte component 1714 is formed from an ionic liquid material such as 1-butyl-3-methylimidazolium, trioctylmethylammonium bis(trifluoromethylsulfonyl)imide, or triethylsulfonium bis(trifluoromethylsulfonyl)imide, the cathode current collector 1706, the cathode component 1708, the anode component 1716 and the anode current collector 1720 may be formed from porous carbon, graphene, or carbon nanotube.

To prevent the electrolyte component 1714 from degrading, exploding, or being damaged during the manufacturing process of the wafer-capped rechargeable power source, the capping wafer 1704 may be attached to the device wafer 1702 to encapsulate the rechargeable power source 1703 at low temperature, for example below 20° C. As illustrated in FIG. 17, the capping wafer 1704 may be attached over the rechargeable power source 1703 with a bonding material 1718, which may be made of bismuth-tin alloys.

Moreover, attaching the capping wafer 1704 over the rechargeable power source 1703 in a vacuum chamber or a chamber containing an inert gas such as nitrogen, may form a vacuum or inert gas cavity 1722. The vacuum or inert gas cavity 1722 may further reduce the risk of explosion of the rechargeable power source 1703. Encapsulating the rechargeable power source with the capping wafer may also create a moisture barrier, which may prevent external moisture from entering the cavity 1722, thus preventing corrosion of the different components of rechargeable power source 1703. As shown in FIG. 17, the cathode current collector 1706 and the anode current collector 1720 may extend outside of the capping wafer 1704 to allow connection to the other devices (not shown in FIG. 17) for charging and discharging of the rechargeable power source 1703.

Referring again to FIG. 12, the power unit 1050 may include energy storage system 1202, to store energy harvested by the energy harvesting components. The energy storage components may include one or more supercapacitors. Supercapacitors may provide the benefit of allowing for quick deployment of energy to power the system $1000_A$ on demand, compared to an operating situation in which continuous powering is needed. For example, if the system $1000_A$ is periodically woken up from a sleep state or other power-saving mode, a supercapacitor may be beneficial to provide the needed burst of power. The supercapacitor(s) may exhibit capacitances, as measured at 100 Hz, that are greater than 10 mF is some embodiments, more than 100 mF in some embodiments, more than 1 F in some embodiments, more than 10 F in some embodiments, or within any other suitable range.

An exemplary supercapacitor may comprise a substrate with a pair of electrodes on each side of an electrolyte material. The electrolyte material may be configured to store an electrical charge therein. Each electrode may be connected to a respective current collector, which may be formed from a conductive material such as gold, or a highly doped semiconductor, such as polysilicon. The electrodes may be formed from conventional materials known in the super-capacitor art, such as a porous solid material. For example, the electrodes may be formed from graphene, which is known to be a porous material with tortuous interior and exterior surfaces. The electrolyte material may be formed from any of a wide variety of materials. For example, it may be formed from an aqueous salt, such as sodium chloride, or a gel such as a polyvinyl alcohol polymer soaked in a salt. Some embodiments may use an ionic liquid, in which ions are in the liquid state at room temperature.

Figure 18:
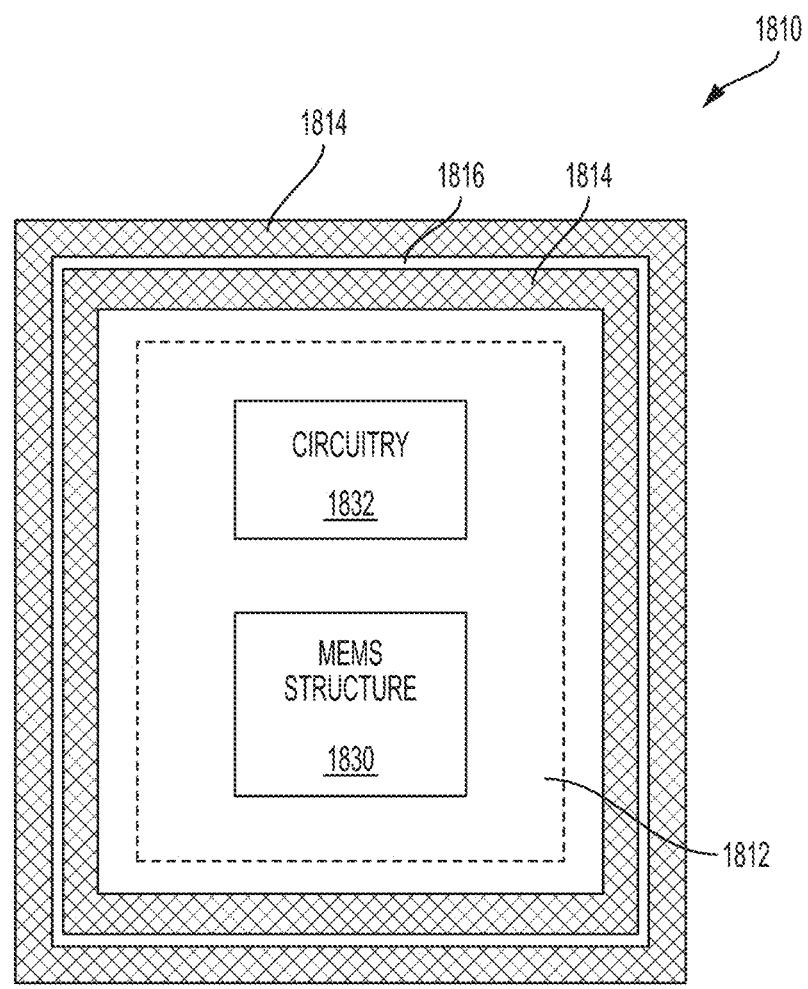
FIG. 18 illustrates a supercapacitor which may be employed in the power unit of FIG. 12 integrated with a MEMS device, such as an angular accelerometer of the types described herein.

As illustrated in FIG. 18, a supercapacitor of the type described herein may be integrated on the same die with one or more electronics components. For example, it may be integrated with a MEMS structure 1830 and/or circuitry 1832. The supercapacitor may comprise electrodes 1814, and an electrolyte material 1816 disposed between the electrodes. MEMS structure 1830 may comprise at least one angular accelerometer of the type described herein and/or at least one linear accelerometer. Circuitry 1832 may comprise ASIC 1010, I/O interface 1012, sensor(s) 1014, memory 1016, ADC 1008, read-out circuitry 1004, or any suitable combination thereof. In some embodiments, MEMS structure 1830 and/or circuitry 1832 may be disposed on a die 1812 and may surrounded by a supercapacitor 10. In other embodiments, the supercapacitor may be disposed on an opposite side on die 1812 with respect to MEMS structure 1830.

Figure 19:
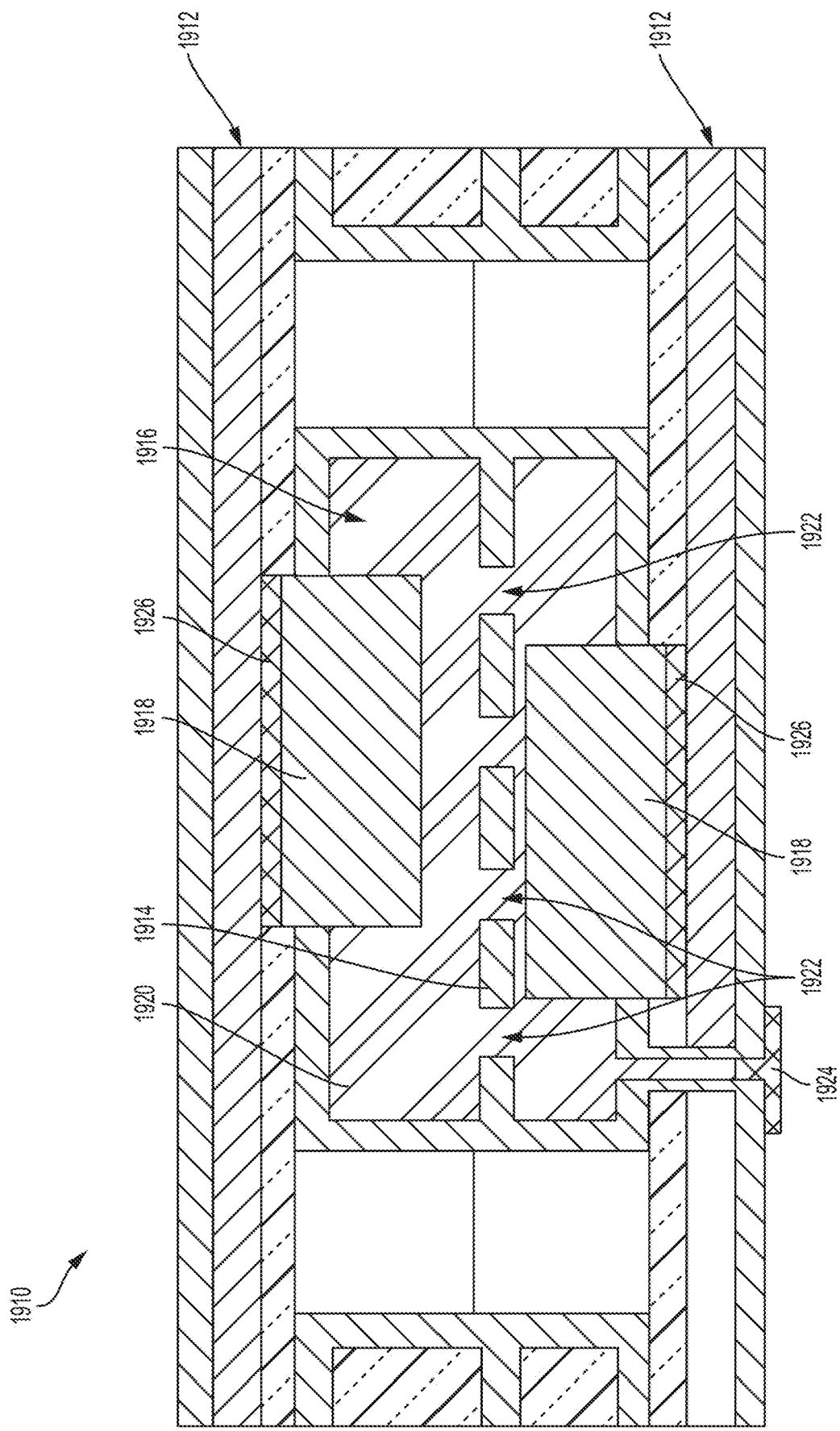
FIG. 19 illustrates a supercapacitor of a type which may employed in the power unit of FIG. 12.

FIG. 19 illustrates a supercapacitor 1910, according to another embodiment. Super-capacitor 1910 may comprise a pair of multilayer substrates 1912 bonded together to form an interior chamber 1916. Interior chamber 1916 may comprise a pair of stacked electrodes 1918 and electrolyte material 1920. To prevent electrical contact between the electrodes 1918, the chamber 1916 may comprise a separator 1914 configured to physically separate the two electrodes 1918. Separator 1914 may substantially prevent the electrodes 1918 from making electrical contact. Separator 1914 may be formed from a material that is commonly used in micromachining, such as nitride, parylene, or an oxide. As such, the separator material is generally impermeable by the ions of the electrolyte material 1920.

Holes 1922 may be configured to permit transmission of the ions within the electrolyte material 1920. For example, the holes 1922 may be 1-5 microns wide, or even as small as 2 nanometers. Ions within the electrolyte material 1920 thus can pass freely through the holes 1922 in the separator 1914 to optimize storage capability of the super-capacitor 1910. Other materials may be used to form the electrode 1918, such as activated carbon, carbon aerogel or carbon nanotubes. Electrolyte 1920 can be formed from any of a wide variety of other corresponding materials. For example, electrolyte 1920 can be formed from an aqueous salt such as sodium chloride, or a get such as a polyvinyl alcohol polymer soaked in a salt. Some embodiments may use an ionic liquid, in which ions are in the liquid state at room temperature. The electrodes 1918 may be formed from conventional materials known in the art, such as a porous solid material. For example, the electrodes 1918 may be formed from graphene, which is known to be a porous material with tortuous interior and exterior surfaces. To provide access to the electrodes, current collectors 1926 may be used. In some embodiments, a plug 1924 may be used to hermetically seal the electrolyte in the chamber 1916.

In some embodiments a supercapacitor may be configured to share an electrode with a battery. Depending on the design, the common electrode can form either a common anode or a common cathode. FIG. 20A illustrates an integrated device having a supercapacitor and a battery sharing an electrode, according to some embodiments. Integrated circuit 2010 may comprise a substrate 2014, such as a multilayer substrate, supporting a cap 2016 to form an interior chamber 2018. Interior chamber 2018 may comprise a plurality of electrodes 2022A-2022C and electrolyte material(s) 2024. The interior chamber 2018 may have internal circuitry 2020, which may comprise any of a wide variety of different devices commonly formed on an integrated circuit, such some or all the components of systems 1000A, 1000B, 1000C or 1000D. Electrode 2022A may be configured to operate as the first electrode of a supercapacitor, while electrode 2022B may be configured to operate as the first electrode of a battery. Electrode 2022C may be configured to operate as the second electrode of the battery as well as the second electrode of the supercapacitor. In some embodiments electrode 2022C may be sandwiched between the battery electrode 2022B and the super-capacitor electrode 2022A.

To improve conductivity and provide exterior access to the electrodes 2022A-2022C, current collector layers 2030 may be provided. Each current collector layer 2030 may be in electrical contact with one of the electrodes 2022A-2022C. In addition, the current collector layers 2030 may be in electrical communication with conductive contacts 2031 on the exterior of the integrated circuit 2010. In some embodiments, conductive contacts 2031 may be obtained by elongating the current collector layers 2030 to the outside of the interior chamber 2018. The current collector layers 2030 may be formed from a highly conductive metal such as gold, or a highly doped semiconductor, such as polysilicon. However, any other suitable conductive material may be used. In some embodiments, the battery electrode 2022B and the supercapacitor electrode 2022A may be maintained at the same potential through a connection represented schematically by reference number 2030A. In some embodiments, the super-capacitor electrode 2022A may be formed from graphene, which is known to be a porous material with tortuous interior and exterior surfaces. In some embodiments, the supercapacitor electrode 2022B may be formed from graphite or lithium. In some embodiments, the supercapacitor electrode 2022C may be formed from lithium cobalt oxide (LiCoO2). Electrolyte 2024 may be formed from an aqueous salt, such as sodium chloride, or a gel such as a polyvinyl alcohol polymer soaked in a salt. Additional examples include lithium tetrafluoroborate (LiBF4) or lithium hexafluorophosphate (LiPF6) plus polypyrrole. Some embodiments may use an ionic liquid, in which ions are in the liquid state at room temperature.

FIG. 20B is a diagram illustrating a power circuit 2037 comprising a battery 2028 and a supercapacitor 2026, according to some embodiments. In some embodiments, supercapacitor 2026 and battery 2028 may share an electrode, as described in connection with FIG. 20A. Power circuit 2037 may comprise terminals 2032, that may serve as output ports. Power circuit 2037 may comprise one or more switches 2034 and a controller 2036. Controller 2036 may be configured to connect/disconnect battery 2028 supercapacitor 2026 to a terminal 2032 using switches 2034.

In some embodiments, system 1000A may be disposed within a substrate or a board configured to host some or all the components of the systems. In some embodiments, the system may be disposed within one or more printed circuit boards (PCB). The components mounted on the substrate or the board may be connected through conductive paths. In some embodiments, the system may be disposed within more than one substrates or boards, and interconnects between the substrates or boards may be provided. In some embodiments, system 1000A may be disposed on a flexible substrate. The substrate may be a flexible substrate that can be bent or folded into various geometrical configurations. The substrate may comprise many internal conductive traces that provide electrical communication between multiple device dies mounted to the substrate and between the package and an external system substrate (such as a system motherboard). Mounting multiple device dies to a flexible substrate may provide electrical communication between and among all the components in the package. The package housing may comprise a carrier having at least two walls angled relative to one another to provide structure for the package. In other arrangements, however, the carrier may be a stiffener with only one wall. To provide a high level of device integration, the substrate may be bent or folded one or more times, and multiple integrated device dies (e.g., sensor and/or processor dies) may be mounted on both sides of the substrate. In some arrangements, for example, the bends formed in the substrate may be disposed within the housing defined by the at least two walls. By bending or folding the substrate, the package may achieve a high degree of three-dimensional (3D) integration. The carrier described herein may have any suitable number of walls. For example, the carrier can have at least two walls in various embodiments, and at least three walls in some. The carrier can generally be configured to provide structural support for a substrate and device dies mounted to the substrate. In some embodiments, the walls can be angled relative to one another, by an angle that is between 80° and 100°, such as by a 90° angle. In some embodiments, the walls can be angled relative to one another, by an angle that is between 1700 and 1900, such as by a 180° angle. However, any other suitable angle may be used.

Figure 21A:
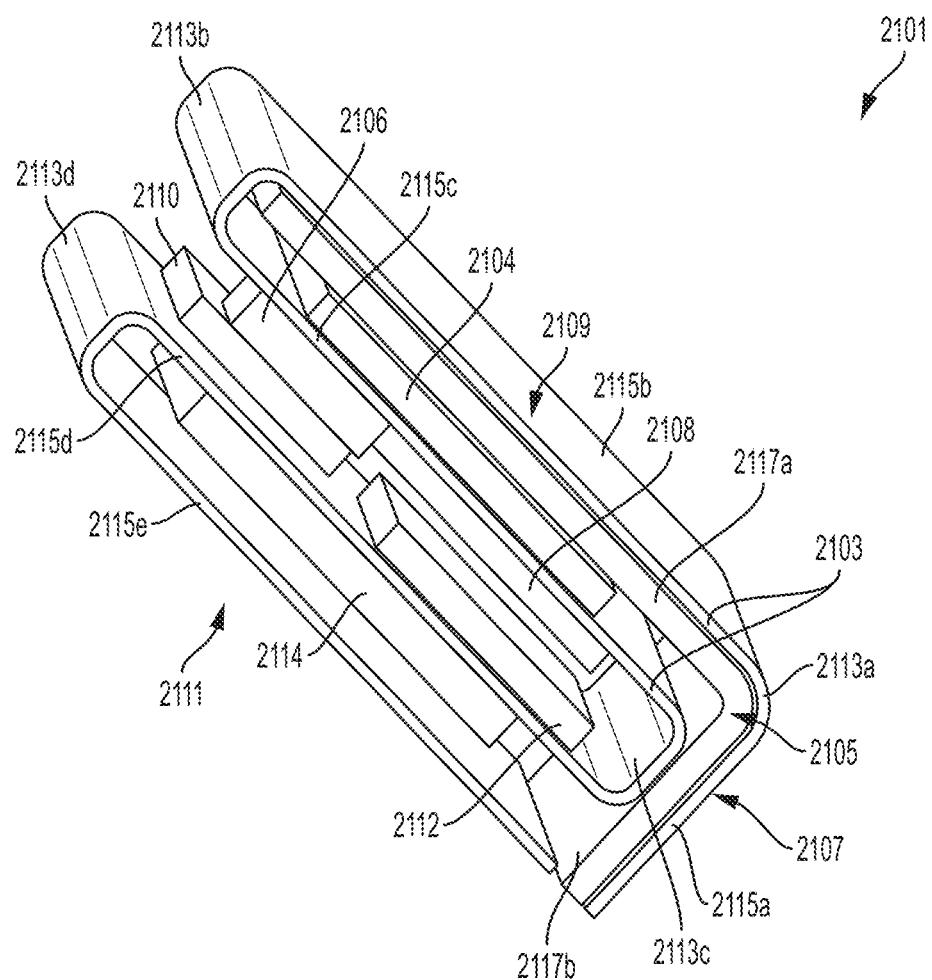
FIG. 21A is a perspective view of an assembled device package having a flexible substrate with a number of components on it, such as the components of the systems of FIGS. 10A-10D.
Figure 21B:
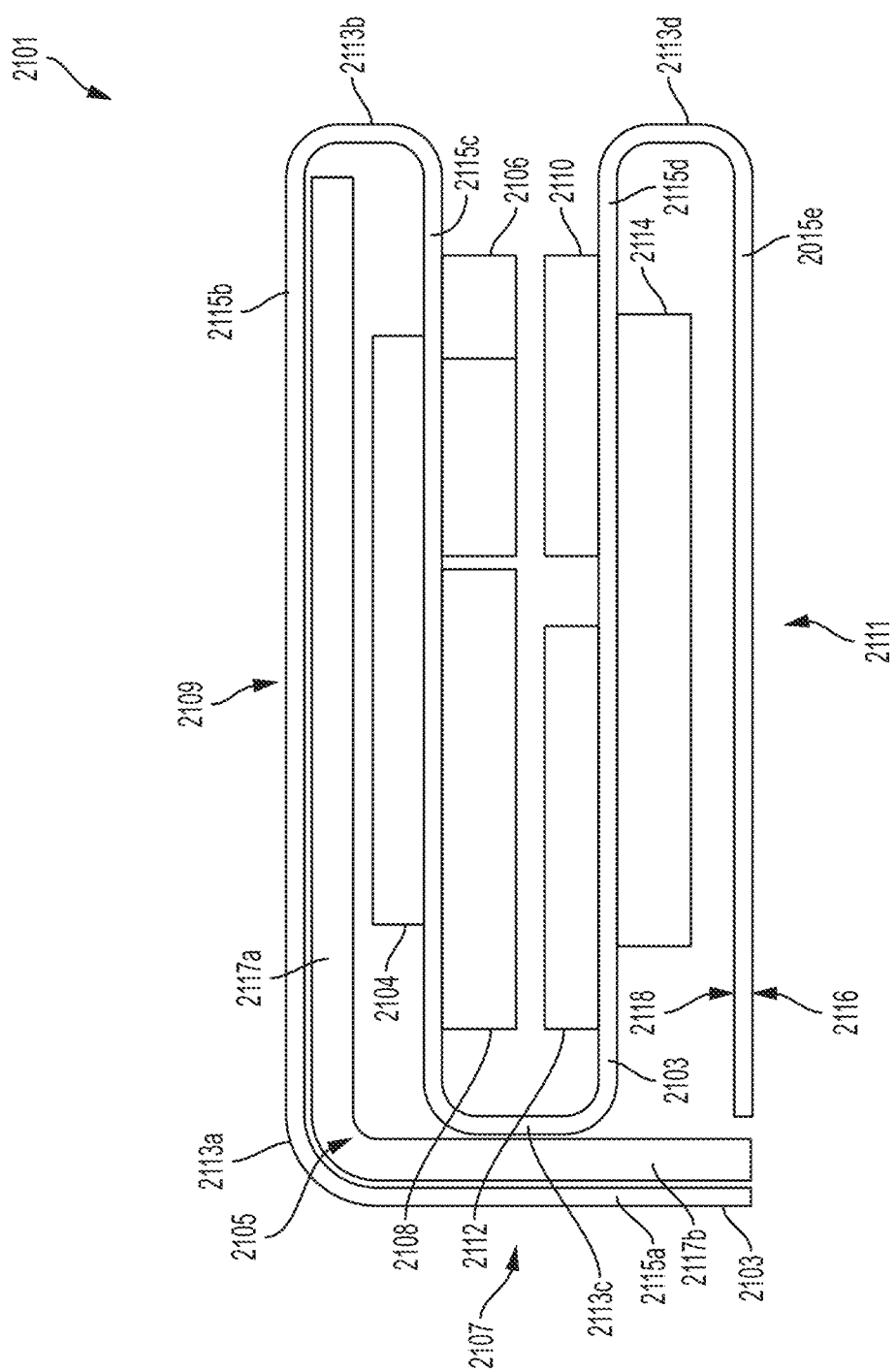
FIG. 21B is a side view of the device package of FIG. 21A.

FIG. 21A is a three-dimensional perspective view of an assembled compact device package 2101 illustrating a flexible substrate 2103 coupled to a carrier 2105, according to one embodiment. FIG. 21B is a side view of the assembled compact device package of FIG. 21A. The embodiment shown in FIGS. 21A-21B comprises a carrier 2105 having walls 2117a and 2117b angled relative to one another, e.g., at 90° angle to provide structure and support for the package 2101. However, the application is not limited in this respect and the angle between the walls may be between 10° and 190° in some embodiments, between 45° and 135° in some embodiments, between 75° and 115° in some embodiments, between 80° and 100° in some embodiments, or between any other suitable range. The carrier 2105 may be made of any suitable material that provides structural support for the package. For example, in some embodiments, the carrier 2105 can be formed from a plastic material. In other embodiments, the carrier 2105 may be formed from a metal, such as aluminum.

The package 2101 of FIG. 21A-21B may comprise multiple device dies coupled to the substrate 2103, in addition to various interfacing features integrated with portions of the substrate 2103 that define exterior surfaces of the package 2101. For example, the package may comprise a communications die 2104 serving as I/O interface 1006 of FIG. 10A, a MEMS die 2108 serving as angular accelerometer 1002, a signal processing die 2106 serving as read-out circuitry 1004, a memory die 2112 serving as a memory unit, a power die 2110 serving, at least in part, as power unit 1050 of FIG. 12, a driver die 2114 serving, for example, as a motor driver and an antenna 2109 serving as antenna 1102 of FIG. 11. Antenna 2109 may be disposed on segment 2115b, and may comprise a microstrip antenna, a serpentine-shaped antenna, or any other suitable type of antenna. The substrate 2103 may be a flexible substrate capable of being bent or folded in various geometric configurations and including numerous internal conductive traces, bond pads, etc. The entire substrate 2103 may be flexible or flexibility may be confined to regions of bends 2113a-2113d. Flexible substrates of the type described herein may be made of a flexible plastic material, such as polyimide or PEEK and may comprise integrated bond pads, traces and leads similar to those used in conventional PCB substrate technologies.

Segment 2115a can be coupled to wall 2117b of the carrier 2105, and segment 2115b can be coupled to wall 2117a of the carrier 2105. As illustrated, segments 2115a and 2115b can define at least part of an exterior surface of the package 2101, and bend 2113a can be formed between segments 2115a and 2115b. For example, the bend 2113a may be formed at an angle of between about 80° and about 100°, e.g., about 90°. Interfacing features can be integrated with the exterior segments 2115a and 2115b and can communicate from exterior surfaces of the package 2101. For example, a capacitive touch sensor 2107 may be formed in segment 2115a, and an antenna 2109 may be formed in segment 2115b, or vice versa. In addition, electrical contacts 2111 can be defined on segment 2115e and can be configured to provide electrical communication between the package 2101 and an external device, such as a system motherboard of a larger electronic device (e.g., a hearing aid).

Bend 2113a can be formed along the outer surface of the carrier 2105. Within the housing formed by the two walls 2117a and 2117b, the substrate 2103 may comprise multiple bends. For example, bend 2113b may be defined between segments 2115b and 2115c. Bend 2113c may be formed between segments 2115c and 2115d of the substrate 2103. Bend 2113d may be defined between segments 2115d and 2115e. The illustrated bends 2113b-2113d may be formed at an angle between about 170° and 190°, e.g., at about 180°. As shown, bend 2113c may be bent in a direction opposite the direction in which bends 2113d and 2113e are formed.

In FIGS. 21A-21B, the communications die 2104, MEMS die 2108 and signal processing die 2106 may be mounted to the substrate 2103 between bend 2113b and bend 2113c, on the same segment 1215c. For example, the communications die 2104 may be mounted to a second side 2118 of the substrate 2103, and the MEMS die 2108 and the signal processing die 2106 may be mounted to a first side 2116 of the substrate 2103, e.g., opposite the dies mounted to the second side 2118 of the substrate 2103.

Further, memory die 2112, power die 2110 and driver die 2114 may be mounted to the substrate 2103 between bend 2113c and bend 2113d on the same segment 2115d. As illustrated in FIGS. 21A-21B, power die 2110 and memory die 2112 may be mounted, for example, on the first side 2116 of the substrate 2103, and driver die 2114 may be mounted on the second side 2118 of the substrate 2103. The illustrated positions of the device dies is for illustrative purposes only, as the device dies may instead be disposed in other suitable positions. The dies may be mounted on and electrically coupled to both the first and second sides of the substrate 2103, using any suitable electrically conductive adhesive. For example, in some arrangements, solder, anisotropic conductive film (ACF) or non-conductive paste (NCP) technologies may be used to electrically couple device dies to the substrate 2103.

Referring again to FIG. 10A, the system $1000_A$ may be deployed in various applications to detect angular acceleration, including sports, healthcare, military, and industrial applications, among others. Some non-limiting examples are now described. A system $1000_A$ may be a wearable sensor deployed in monitoring sports-related physical activity and performance, patient health, military personal activity, or other applications of interest of a user.

As an example, system 1000$_A$ may be deployed on a bicycle to monitor angular accelerations associated to any suitable part of a bicycle, such as a wheel or a pedal, and/or pedaling power. In such situations, system 1000$_A$ may be a wireless sensor positioned on a bicycle's wheel, a pedal, or any other suitable rotating part. Alternatively, or additionally, system 1000$_A$ may be configured to be attached, fastened or clipped to a biker's leg or foot. The wireless sensor may be configured to detect angular acceleration of the wheel and/or the pedal, thus providing an indication of the rotations per minute (rpm) and/or the pedaling power. The I/O interface 1006 may be one of the types of I/O wireless interfaces described above. The system may periodically transmit detected angular acceleration to an external monitoring system, such as a computer, a smartphone, a tablet, a smartwatch, smartglasses, or any other suitable device. Read-out circuitry 1004 may be configured to convert angular acceleration to pedaling power and/or rotations per minute. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or the electrical overstress harvester described in connection with FIG. 15A. Other types of energy harvesters may also be used. In some embodiments, the wireless sensor may comprise energy storage components, such as one or more supercapacitors, to store some or all the energy harvested with the energy harvester.

As another example, the system 1000$_A$ may be deployed to monitor the condition of a machine having a rotor. In such situations, the system 1000$_A$ may be a wireless sensor positioned on the rotor to detect rotations per minute (rpm), thus giving an indication, for example, of whether the rotor is rotating according to the specifications. Being a wireless sensor, the I/O interface 1006 may be one of the types of wireless interfaces described above. The system may periodically transmit detected angular acceleration to an external monitoring system, such as a computer. Read-out circuitry 1004 may be configured to convert angular acceleration to rotations per minute. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or the electrical overstress harvester described in connection with FIG. 15A. Other types of energy harvesters may also be used. In some embodiments, the wireless sensor may comprise energy storage components, such as one or more supercapacitors of the types described herein, to store some or all the energy harvested with the energy harvester.

As another example, system 1000$_A$ may be deployed on an ultrasound probe to monitor the angle of the probe with respect to the target being probed. The target may be a patient or a particular part of a patient, such as an organ of interest. Such a configuration may be used to improve the quality of ultrasound images captured through ultrasound probes. System 1000$_A$ may be used to measure angular accelerations experienced by an ultrasound probe. In such situations, system 1000$_C$ may be a wired or wireless sensor attached to the probe. The sensor may be configured to detect angular acceleration through angular accelerometer 1002. The I/O interface 1006 may be one of the types of wired or wireless interfaces described above. The system may periodically transmit detected angular acceleration to an external monitoring system, such as a computer. Read-out circuitry 1004 may be configured to convert angular accelerations to angles. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A. Other types of energy harvesters may also be used. In some embodiments, the wireless sensor may comprise energy storage components, such as one or more supercapacitors, to store some or all the energy harvested with the energy harvester.

Figure 10B:
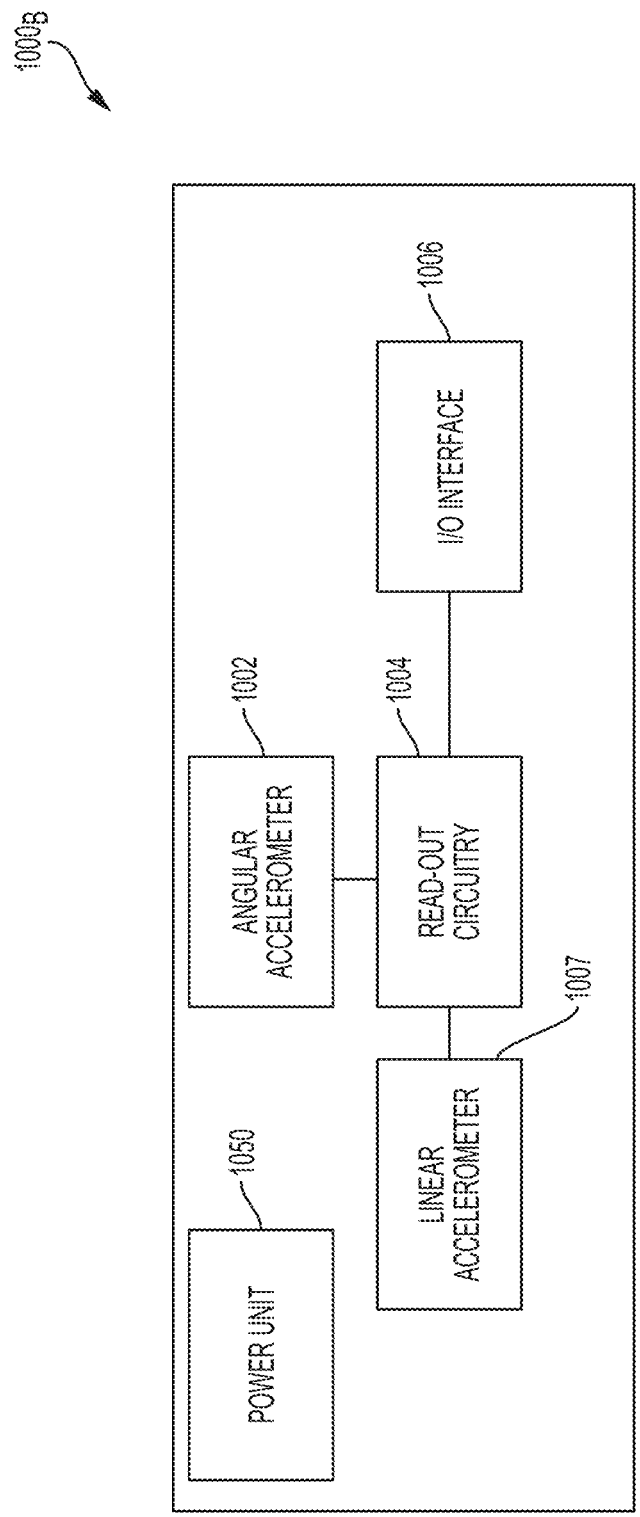

While FIG. 10A represents one example of a system employing an angular accelerometer of the types described herein, alternatives are possible. Some systems may be configured to detect angular acceleration as well as linear acceleration, thus providing additional degrees of motion. In this manner, up to six degrees of freedom may be sensed, which may be useful in a variety of applications, some of which are described below. FIG. 10B illustrates an example of such a system.

As shown, FIG. 10B is a block diagram illustrating a system 1000$_B$ for detecting angular acceleration comprising one or more angular accelerometers of the types described herein and one or more linear accelerometers, according to a non-limiting embodiments of the present application. That is, system 1000$_B$ may be like the system 1000$_A$ with the addition of a linear accelerometer 1007. Linear accelerometer 1007 may be configured to sense linear accelerations along one, two or three axes, and may be any suitable type of accelerometer for doing so. In some embodiments, linear accelerometer 1007 may be a MEMS sensor. Linear accelerometer 1007 may be disposed on the same die with angular accelerometer 1002 or on a separate die. Linear accelerometer 1007 may be connected to read-out circuitry 1004, which may be configured to, in response to detection of linear accelerations(s), generate one or more signals proportional to the detected acceleration(s). Some or all the components of system 1000$_B$ may be disposed on a substrate, such as flexible substrate. In some embodiments, some or all the components of system 1000$_B$ may be disposed on a flexible substrate according to the arrangement illustrated in FIGS. 21A-21B.

As with the system 1000$_A$ of FIG. 10A, the system 1000$_B$ of FIG. 10B may be deployed in various applications relating to sports, healthcare, military, and industrial applications. For example, system 1000$_B$ may be used as inertial measurement unit (IMU) for measuring two to six degrees of freedom; up to three angular and three linear. Some examples are now described.

As an example, system 1000$_B$ may be deployed on a foot pod to monitor distance traveled, stride length, number of steps and/or foot angle. Such a configuration may be used to analyze the movements of an athlete, such as a runner, or to analyze the gait of an person having suffered an injury. In such situations, system 1000$_B$ may be a wireless sensor to be disposed or attached to a person's foot or ankle. For example, the wireless sensor may be fastened or clipped to a shoe. Alternatively, system 1000$_B$ may be deployed on a band to be tied around the person's ankle. The wireless sensor may be configured to detect angular accelerations with angular accelerometer 1002 and linear accelerations with linear accelerometer 1007, thus providing an indication of the rate of the distance traveled, stride length, number of steps and/or foot angle. Being a wireless sensor, the I/O interface 1006 may be one of the types of wireless interfaces described above. The system may periodically transmit detected angular and linear acceleration to an external monitoring system, such as a computer, a smartphone, a tablet, a smartwatch, smartglasses, or any other suitable device. Read-out circuitry 1004 may be configured to convert angular and linear acceleration to distance, stride length, or other performance metrics of interest which can be derived from angular and linear acceleration. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A. Other types of energy harvesters may also be used. In some embodiments, the wireless sensor may comprise energy storage components, such as one or more supercapacitors of the types described herein, to store some or all the energy harvested with the energy harvester.

As another example, system $1000_B$ may be used to detect the absence of angular and/or linear acceleration. Some devices may be designed to operate at steady state. Some of these devices may not be designed to tolerate accelerations above a certain level. System $1000_B$ may be deployed on such devices to monitor accelerations, thus providing an indication of the deterioration of the devices. One example of such an application is with respect to a roller bearing. Some roller bearings may experience deterioration in response to accelerations. System $1000_B$ may be configured to detect angular acceleration through angular accelerometer 1002 and/or linear acceleration with linear accelerometer 1007. The I/O interface 1006 may be one of the types of wireless interfaces described above. The system may periodically transmit detected angular and linear acceleration to an external monitoring system, such as a computer. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A. Other types of energy harvesters may also be used. In some embodiments, the wireless sensor may comprise energy storage components, such as one or more supercapacitors, to store some or all the energy harvested with the energy harvester. System $1000_B$ may be disposed on any suitable part of the device to be monitored.

As another example, system $1000_B$ may be used to detect vibrations suffered by bridges, buildings, overpasses, pylons or towers. System $1000_B$ may be deployed on any of such structures to monitor accelerations, thus providing an indication of the condition of the structure. System $1000_B$ may be configured to detect angular accelerations with angular accelerometer 1002 and linear accelerations with linear accelerometer 1007. The I/O interface 1006 may be one of the types of wireless interfaces described above. The system may periodically transmit detected angular and linear acceleration to an external monitoring system, such as a computer. Based on the information provided by the accelerometers, an analysis of the condition of the structure may be performed. Based on such analysis, it may be determined that certain parts have worn out and/or need replacement. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A and/or the photovoltaic harvester described in connection with FIG. 16. Other types of energy harvesters may also be used. In some embodiments, the wireless sensor may comprise energy storage components, such as one or more supercapacitors, to store some or all the energy harvested with the energy harvester. System $1000_B$ may be disposed on any suitable part of the structure to be monitored.

Figure 22:
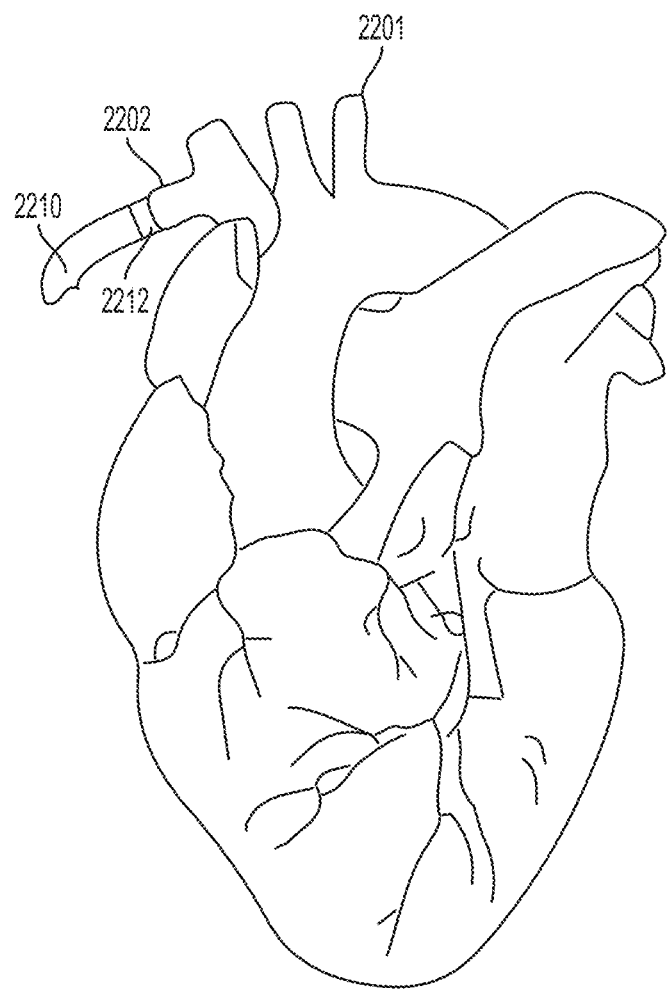
FIG. 22 illustrates a catheter comprising a device configured to measure angular acceleration.

As another example, system $1000_B$ may be used in catheters. The system $1000_B$ may be disposed near an end of the catheter. As the catheter is inserted or removed from a subject, angular and linear acceleration may be detected by the angular accelerometer 1002 and the linear accelerometer 1007. This information may provide an indication of the amount of force being used, and whether damage to the patient is going to result, as an example. The read-out circuitry 1004 may provide the detected accelerations out of the catheter via a wired I/O interface 1006. FIG. 22 illustrates a catheter 2210 for use in connection with a patient's heart 2201. Catheter 2210 may comprise a device 2212, which may comprise system $1000_B$. In some embodiments, device 2212 may be disposed at one end of catheter 2210. In some embodiments, catheter 2210 may be placed in contact with heart 2201, and may be configured to sense heart motion and/or heart rate, using angular accelerometer 1002 and/or linear accelerometer 1007 of device 2212. In some embodiments, catheter 2210 may be inserted in a vessel leading to heart 2201, such as vessel 2202. While FIG. 22 illustrates a catheter 2210 for use in connection with a heart, motions of any other suitable organ may be sensed using catheter 2210.

Figure 10C:
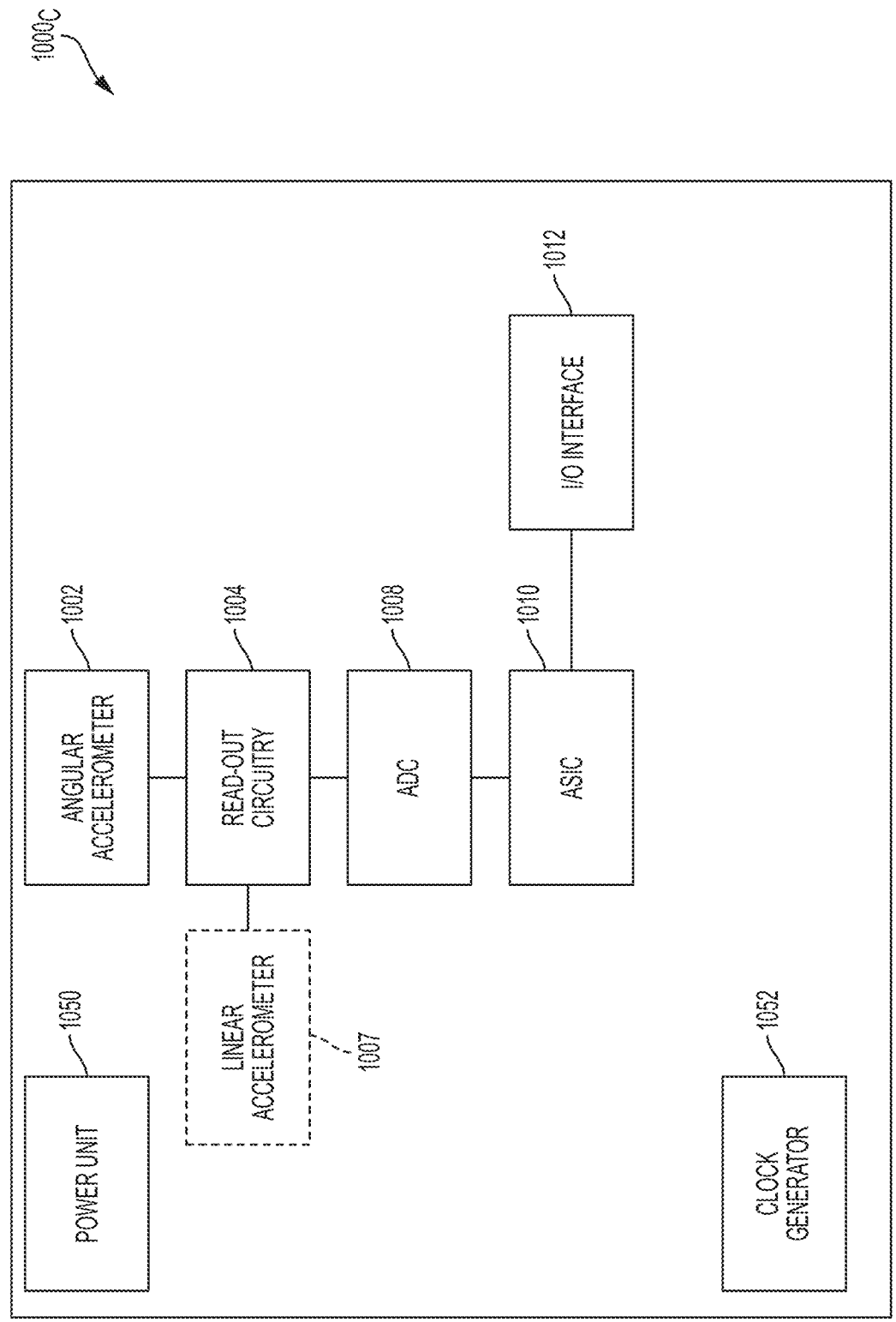

As shown, FIG. 10C is a block diagram illustrating a system $1000_C$ for detecting angular acceleration comprising one or more angular accelerometers of the types described herein and an application-specific integrated circuit (ASIC), according to a non-limiting embodiments of the present application. That is, system $1000_C$ may be like the system $1000_B$ with the addition of an analog-to-digital converter 1008, a clock generator 1052 and an ASIC 1010. In some embodiments, ADC 1008 may be configured to convert signal(s) representing detected angular acceleration(s) to the digital domain. In some embodiments, ADC 1008 may be configured to convert signal(s) representing detected linear acceleration(s) to the digital domain. ADC 1008 may comprise any suitable type of circuitry for analog-to-digital conversion, such as flash ADC, successive approximation ADC, ramp-compare ADC, integrating ADC, delta-encoded ADC, or sigma-delta ADC.

In some embodiments, ASIC 1010 may be connected to ADC 1008, and may receive the digitize signals representing the detected linear acceleration(s) and/or angular acceleration(s). ASIC 1010 may comprise a one or more microprocessors, microcontrollers, system-on-chip, field-programmable gate array (FPGA), or any other suitable type of logic circuit. ASIC 1010 may process the detected signals in any suitable fashion. In some embodiments, ASIC 1010 may be connected to I/O interface 1012, which may be of the same type as I/O interface 1012 of FIG. 10A. ASIC 1010 may be timed by a clock signal generated by clock generator 1052. ADC 1008 may be timed by a clock signal generated by clock generator 1052. Clock generator 1052 may be configured to output periodic waveforms, such as square waves.

Clock generator 1052 may comprise an oscillator in some embodiments. I/O interface may be of the same type as I/O interface 1006 of FIG. 10A, and may be connected to ASIC 1010. Some or all the components of system 1000$_C$ may be disposed on a substrate, such as flexible substrate. In some embodiments, some or all the components of system 1000$_C$ may be disposed on a flexible substrate according to the arrangement illustrated in FIGS. 21A-21B.

As with the system 1000$_A$ of FIG. 10A, the system 1000$_C$ of FIG. 10C may be deployed in various applications relating to sports, healthcare, military, and industrial applications.

As an example, system 1000$_C$ may be deployed on an athlete's helmet, such as a football player's helmet, to monitor impacts. Such a configuration may be used to analyze concussions experienced by a player. System 1000$_C$ may be used to measure angular and/or linear accelerations associated with the player's head caused by hits with other players. The information provided by the sensor may be used the evaluate the risk of brain damage. System 1000C may alternatively be deployed on a soldier's helmet to measure angular and/or linear accelerations associated with the soldier's head. In this way, the strength of impacts caused by hits in the battlefield may be monitored or simulated. In any of such situations, system 1000$_C$ may be a wireless sensor attached to a helmet. For example, the wireless sensor may be disposed on the front side of the helmet, on the rear side of a helmet, or attached to the helmet's inner and/or outer surface. Alternatively, or additionally, the accelerometer may be disposed on a head band. The accelerometer may alternatively be disposed in a mouth guard. The wireless sensor may be configured to detect angular accelerations with angular accelerometer 1002 and/or linear accelerations with linear accelerometer 1007, thus providing an indication of the strength of an impact. The I/O interface 1012 may be one of the types of wireless interfaces described above. The system may periodically transmit detected angular and/or linear acceleration to an external monitoring system, such as a computer, a smartphone, or a tablet. ASIC 1010 may be configured to compute impact strength based on the detected angular and/or linear acceleration. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A and/or the photovoltaic harvester described in connection with FIG. 16. Other types of energy harvesters may also be used. In some embodiments, the wireless sensor may comprise energy storage components, such as one or more supercapacitors, to store some or all the energy harvested with the energy harvester. In some embodiments, the system for monitoring impacts may comprise an output device, such as an LED or a sound emitting device, to alert the player or soldier when an impact with a strength exceeding a threshold has been experienced. In such a configuration, ASIC 1010 may be further configured to compare the strength of the impact to a predefined threshold, and to control the output device.

As another example, system 1000$_C$ may be deployed on a racket, a bat, a stick or a club. Such a configuration may be used to analyze the swing performed by an athlete, such as a tennis player, a baseball player, a golf player, a hockey player or any other type of athlete. System 1000$_C$ may be used to measure angular and/or linear accelerations. The information provided by the system may be used to improve a particular player's ability, such as the ability to hit a ball in a particular way. In such situations, system 1000$_C$ may be a wireless sensor attached to a racket, bat or club. For example, the wireless sensor may be disposed on a racket's beam, string, butt, grip or bumper guard, on a bat's knob, taper, grip or barrel, or on a club's grip, shaft of head. Alternatively, or additionally, the accelerometer may be disposed on a wrist band. The wireless sensor may be configured to detect angular accelerations with angular accelerometer 1002 and/or linear accelerations with linear accelerometer 1007, thus providing an indication of the strength and/or the angle of an impact. The I/O interface 1012 may be one of the types of wireless interfaces described above. The system may periodically transmit detected angular and/or linear acceleration to an external monitoring system, such as a computer, a smartphone, a tablet. ASIC 1010 may be configured to convert angular and/or linear acceleration to swing angle and/or strength. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A and/or the photovoltaic harvester described in connection with FIG. 16. Other types of energy harvesters may also be used. In some embodiments, the wireless sensor may comprise energy storage components, such as one or more supercapacitors, to store some or all the energy harvested with the energy harvester.

Figure 23:
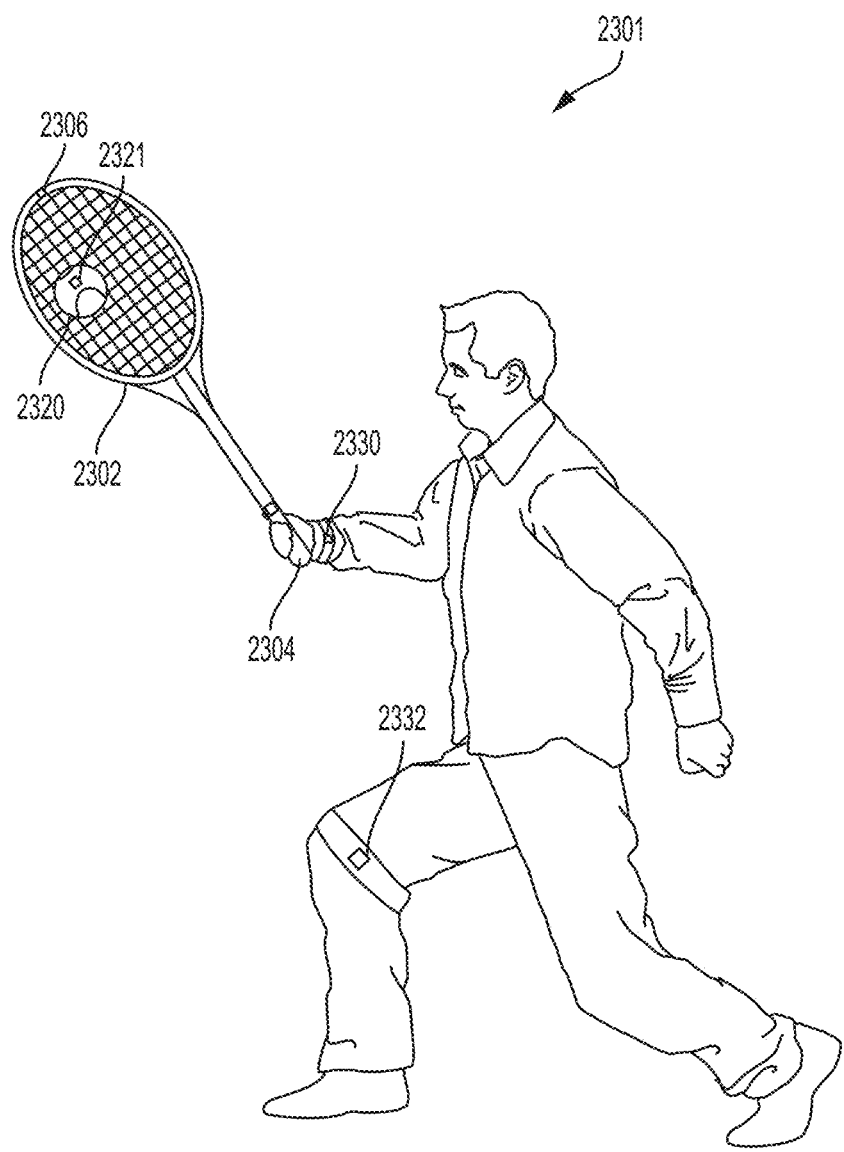
FIG. 23 illustrates a tennis player holding a racket in one hand, the racket comprising a sensor configured to measure angular acceleration.

FIG. 23 illustrates a non-limiting example of system 1000$_C$ for use in connection with a tennis racket. In the example illustrated, player 2301 may be playing tennis, and may hold racket 2302 in one hand. Racket 2302 may comprise a plurality of devices attached thereon, such as devices 2304 and 2306. Such devices may each comprise a system 1000$_C$, and may be configured to detect angular accelerations and/or linear accelerations. For example, device 2304, mounted on the grip of racket 2302, may be configured to sense accelerations associated with the racket's handle. Device 2306, mounted on the racket's head, may be configured to sense accelerations associated with the any suitable part of the racket's head, such as the racket's tip. The devices 2304 and 2306 may be embedded within the racket frame or body in some embodiments. In some embodiments, data associated with accelerations experienced by racket 2302 may provide an indication of the player's ability to play tennis. For example, information regarding a forehand motion, or a backhand motion, may be obtained. Player 2301 may wear one or more wearable devices, such as a wrist band or a leg band. Such wearable devices may each be equipped with a system 1000$_C$, and may be configured to sense angular and/or linear accelerations. For example, device 2330, positioned on a wrist band, may be configured to provide information on the motion of the player's arm. Device 2332, positioned on a leg band, may be configured to provide information on the motion of the player's leg.

As another example, system 1000$_C$ may be configured as a wireless sensor deployed on or in a ball to monitor the ball's speed, rotation, trajectory, or other performance metrics of interest which can be derived from angular and linear acceleration. For example, the system 1000$_C$ may form part of a flexible patch disposed within a portion of the rubber shell of a ball. The flexible patch may be of the types of flexible substrate previously described herein, such as in connection with FIGS. 21A and 21B. In the non-limiting example of FIG. 23, a wireless sensor 2321 may be disposed on a tennis ball 2320. The wireless sensor may be configured to detect angular accelerations with angular accelerometer 1002 and/or linear accelerations with linear accelerometer 1007, thus providing an indication of the speed and/or the rotation of a ball. The I/O interface 1012 may be one of the types of wireless interfaces described above. The system may periodically transmit detected angular and/or linear acceleration to an external monitoring system, such as a computer, a smartphone, a tablet. ASIC 1010 may be configured to convert angular and/or linear acceleration to ball's trajectory, for example by performing integration routines. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or the electrical overstress harvester described in connection with FIG. 15A. Other types of energy harvesters may also be used. In some embodiments, the wireless sensor may comprise energy storage components, such as one or more supercapacitors of the types described herein, to store some or all the energy harvested with the energy harvester.

As another example, system $1000_C$ may be deployed on an inhaler. Such a configuration may be used to analyze the angle of the inhaler with respect to a person's mouth and/or the dose. Such an inhaler may be used, for example, by persons with asthma. System $1000_C$ may be used to measure angular and/or linear accelerations associated with the inhaler. The information provided by the system may be used to find an optimal inhaling angle and/or to monitor the amount of oxygen inhaled. In such situations, system $1000_C$ may be a wireless sensor attached to the inhaler. For example, the wireless sensor may be disposed on the front side or the rear side of the inhaler. The wireless sensor may be configured to detect angular accelerations with angular accelerometer 1002 and/or linear accelerations with linear accelerometer 1007, thus providing an indication of the angle of the inhaler and/or the dose. The I/O interface 1012 may be one of the types of wireless interfaces described above. The system may periodically transmit detected angular and/or linear acceleration to an external monitoring system, such as a computer, a smartphone, a tablet. ASIC 1010 may be configured to convert angular and/or linear acceleration to inhaler angle and/or dose. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A and/or the photovoltaic harvester described in connection with FIG. 16. Other types of energy harvesters may also be used. In some embodiments, the wireless sensor may comprise energy storage components, such as one or more supercapacitors, to store some or all the energy harvested with the energy harvester.

As another example, system $1000_C$ may be deployed on a patient's prosthesis. Such a configuration may be used to analyze the movements of a patient having a prosthesis replacing a missing body part, such as a leg, a foot, an arm, a hand, or any other part of a human body. Such system may be used, for example, to train a patient to control the prosthesis and to perform proper movements. System $1000_C$ may be used to measure angular and/or linear accelerations associated with the prosthesis. In such situations, system $1000_C$ may be a wired or wireless sensor attached to the prosthesis. For example, the sensor may be disposed on the surface of a prosthesis or inside a prosthesis. Alternatively, or additionally, the sensor may be disposed on a band configured to be deployed around a portion of a prosthesis. The sensor may be configured to detect angular accelerations with angular accelerometer 1002 and/or linear accelerations with linear accelerometer 1007, thus providing an indication of speed, angle, stride length, or other performance metrics of interest which can be derived from angular and linear acceleration. The I/O interface 1012 may be one of the types of wired or wireless interfaces described above. The system may periodically transmit detected angular and/or linear acceleration to an external monitoring system, such as a computer. ASIC 1010 may be configured to convert angular and/or linear acceleration to angle, speed, stride length, or other performance metrics of interest which can be derived from angular and linear acceleration. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A and/or the photovoltaic harvester described in connection with FIG. 16. Other types of energy harvesters may also be used. In some embodiments, the wireless sensor may comprise energy storage components, such as one or more supercapacitors, to store some or all the energy harvested with the energy harvester.

As another example, system $1000_C$ may be deployed on any suitable part of a patient's body for physiotherapeutic purposes. Such a configuration may be used to analyze the movements of an injured patient and may be used to train a patient to perform proper movements. System $1000_C$ may be used to measure angular and/or linear accelerations associated with any suitable part of a patient's body, such as a leg, an arm. In such situations, system $1000_C$ may be a wired or wireless sensor and may be deployed on a band or patch to be worn by the patient. The sensor may be configured to detect angular accelerations with angular accelerometer 1002 and/or linear accelerations with linear accelerometer 1007, thus providing an indication of speed, angle, stride length, or other performance metrics of interest which can be derived from angular and linear acceleration. The I/O interface 1012 may be one of the types of wired or wireless interfaces described above. The system may periodically transmit detected angular and/or linear acceleration to an external monitoring system, such as a computer. ASIC 1010 may be configured to convert angular and/or linear acceleration to angle, speed, stride length, or other performance metrics of interest which can be derived from angular and linear acceleration. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A and/or the photovoltaic harvester described in connection with FIG. 16. Other types of energy harvesters may also be used. In some embodiments, the wireless sensor may comprise energy storage components, such as one or more supercapacitors, to store some or all the energy harvested with the energy harvester.

As another example, system $1000_C$ may be deployed in implantable devices to monitor the status of the device. Implantable devices are man-made devices configured to replace a missing biological structure, support a damaged biological structure, or enhance an existing biological structure. For example, orthopedic implants may be used to treat bone fractures, osteoarthritis, scoliosis, spinal stenosis, or chronic pain and may include pins, rods, screws, or plates used to anchor fractured bones while they heal. As another example, cardiovascular implantable devices may be implanted in cases where the heart, its valves, or the rest of the circulatory system is in disorder. Cardiovascular implantable devices may be used to treatment conditions such as heart failure, cardiac arrhythmia, ventricular tachycardia, valvular heart disease, angina pectoris, and atherosclerosis and may include artificial hearts, artificial heart valves, implantable cardioverter-defibrillators, cardiac pacemaker, or coronary stents. As yet another example, sensory and neurological implants may be used for disorders affecting the major senses and the brain, or other neurological disorders. Sensory and neurological implants may be used in the treatment of conditions such as cataracts, glaucoma, keratoconus, and other visual impairments; otosclerosis and other hearing loss issues, or middle ear diseases such as otitis media; or neurological diseases such as epilepsy, Parkinson's disease. System $1000_C$ may be deployed on any of such implantable devices, and may be used to monitor the condition of the device, such as the device's wear. In such situations, system $1000_C$ may be configured to detect angular accelerations with angular accelerometer 1002 and/or linear accelerations with linear accelerometer 1007, thus providing, for example, an indication of cardiac activity or the movements of a an orthopedic implant through ASIC 1010. The I/O interface 1012 may be one of the types of wireless interfaces described above. The system may periodically transmit detected angular and/or linear acceleration to an external monitoring system, such as a computer. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or the electrical overstress harvester described in connection with FIG. 15A. Other types of energy harvesters may also be used. In some embodiments, the wireless sensor may comprise energy storage components, such as one or more supercapacitors, to store some or all the energy harvested with the energy harvester.

Figure 24:
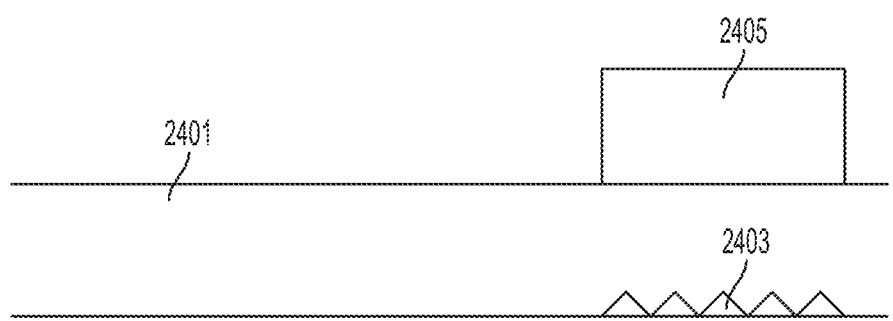
FIG. 24 is a side view of a microfluidic channel configured to sense the viscosity of a fluid using an angular accelerometer.

As another example, system $1000_C$ may be used to provide an indication of the viscosity of a fluid. For example, system $1000_C$ may be placed adjacent a microfluidic channel. FIG. 24 illustrates a system for sensing the viscosity of a fluid, according to some embodiments. In some embodiments, microfluidic channel 2401 may comprise a region 2403 configured to create turbulence in the fluid. For example, such region may comprise a corrugated portion. In such embodiments, device 2405 may comprise a system $1000_C$, and may be disposed in proximity to region 2403. When a fluid moves in proximity to such region, it may experience turbulence. Device 2405 may be configured to detect such turbulence with angular accelerometer 1002 and/or linear acceleration with linear accelerometer 1007. ASIC 1010 may be configured to provide an indication of the viscosity of the fluid based on the detected turbulence. The I/O interface 1012 may be one of the types of wired or wireless interfaces described above. The system may periodically transmit detected angular and/or linear acceleration to an external monitoring system, such as a computer. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A and/or the photovoltaic harvester described in connection with FIG. 16. Other types of energy harvesters may also be used. In some embodiments, the wireless sensor may comprise energy storage components, such as one or more supercapacitors of the types described herein, to store some or all the energy harvested with the energy harvester.

Figure 10D:
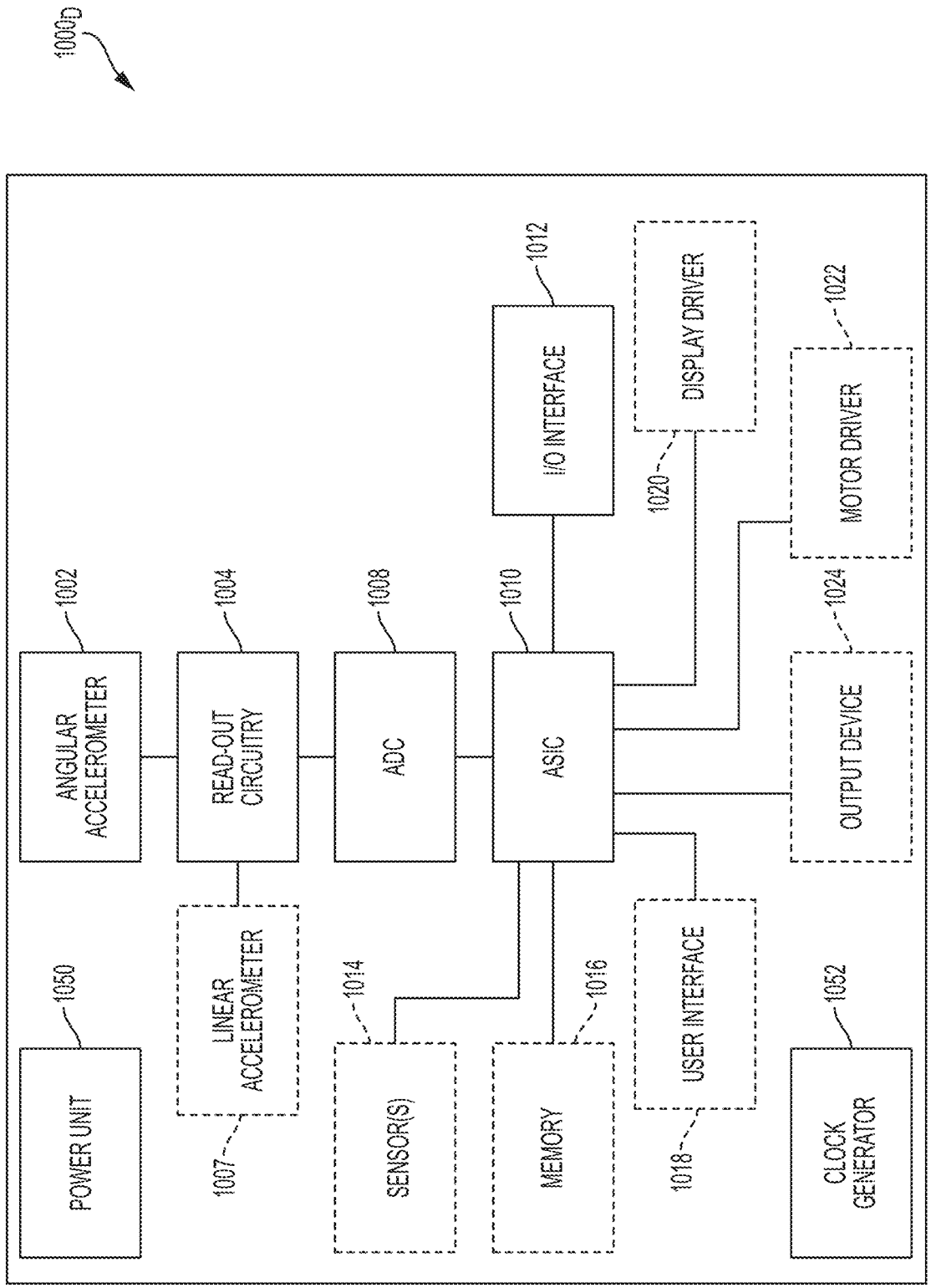

In some embodiments, the angular accelerometers described herein may be used in systems having various types of circuitry disposed thereon, such as sensors other than accelerometers, user interfaces, output devices, circuit controllers, display drivers, or any suitable combination thereof. FIG. 10D is a block diagram illustrating a system $1000_D$ for detecting angular acceleration comprising an angular accelerometer of the type described herein and one or more other types of circuits or components, according to some non-limiting embodiments of the present application. That is, system $1000_D$ may be like the system $1000_C$ with the addition of memory 1016, sensor(s) 1014, user interface 1018, output device 1024, motor driver 1022, display driver 1020, or any suitable combination thereof. The components illustrated in FIG. 10D with dashed outlines are optional, and may be used only in certain embodiments.

Sensor(s) 1014 may comprise any suitable type of sensors, such as one or more temperature sensor(s), pressure sensor(s), heart rate sensor(s), acoustic sensor(s), ultrasound sensor(s), light sensor(s), infrared sensor(s), speed sensor(s), carbon dioxide sensor(s), nitrogen oxide sensor(s), pH sensor(s), flow sensor(s), gas sensor(s), altimeter(s), air speed sensor(s), depth sensor(s), impact sensor(s), free fall sensor(s), odometer(s), piezoelectric sensor(s), position sensor(s), GPS sensor(s), laser sensor(s), or proximity sensor(s).

Memory 1016 may comprise one or more memory cells. For example memory 1016 may comprise a read-only memory (ROM), a programmable read-only memory (PROM), a random access memory (RAM), a flash memory, a magnetic memory, or any other suitable type of memory. In some embodiments, memory 1016 may store a computer code comprising one or more computer-executable instructions. ASIC 1010 may be configured to access and execute the instructions. In some embodiments, memory 1016 may store data. For example, memory 1016 may store reference values for the angular accelerometers and/or linear accelerometer. ASIC 1010 may be configured to access the reference values from memory 1016, and compare the reference values with signals generated by linear accelerometer 1007 and/or angular accelerometer 1002.

User interface 1018 may be configured to receive input(s) from a user. For example, user interface 1018 may be connected to a keyboard, a keypad, a mouse, a touchscreen, a touchpad, a camera, a microphone, or any other suitable type of input peripheral. In some embodiments, ASIC 1010 may be configured to process the detected signals in response to input(s) provided via user interface 1018.

Display driver 1020 may be configured to receive data associated with signals sensed by angular accelerometer 1002 and/or linear accelerometer 1007. In response to receiving such signals, display driver may be configured to drive a display device to display visual information representing the signals.

Output device 1024 may comprise an LED, a vibrating device, a sound emitting device, or any suitable combination thereof. Output device 1024 may be used to alert a user when a predefined condition is met.

Motor driver 1022 may comprise circuitry to drive one or more motors, such as DC motors.

Some or all the components of system $1000_D$ may be disposed on a substrate, such as flexible substrate. In some embodiments, some or all the components of system $1000_D$ may be disposed on a flexible substrate according to the arrangement illustrated in FIGS. 21A-21B.

As with the system $1000_A$ of FIG. 10A, the system $1000_D$ of FIG. 10D may be deployed in various applications relating to sports, healthcare, military, and industrial applications.

As an example, system $1000_D$ may be deployed on tools and/or utensils designed for persons suffering Parkinson disease, or in general, for persons experiencing tremor. For example, system $1000_D$ may be deployed on a spoon or a fork. Such a configuration may be used to compensate for tremor. System $1000_D$ may be used to measure angular and/or linear accelerations associated with the user's tremor. The information provided by the sensor may be used to drive a motor configured to compensate for the tremor. Stabilizing the utensil, or tool, may help at least some persons with hand tremor use the utensil, or tool, more easily. The sensor may be configured to detect angular accelerations with angular accelerometer 1002 and/or linear accelerations with linear accelerometer 1007. ASIC 1010 may be configured to process the detected angular and/or linear acceleration and to control motor driver 1022. Motor driver 1022 may drive one or more motors to compensate for tremor. The power unit 1050 may comprise one or more rechargeable batteries in some embodiments.

As another example, system $1000_D$ may be used to monitor a person's sleep, and may be deployed on a head band, a neck band, a wrist band, a pod or a patch to be disposed on any suitable part of the body. Such system may be used, for example, to monitor the respiration of a patient experiencing sleep apnea. System $1000_D$ may be used to measure angular and/or linear accelerations associated with the person's respiration. In such situations, system $1000_D$ may be a wired or wireless sensor and may be configured to detect angular accelerations with angular accelerometer 1002 and/or linear accelerations with linear accelerometer 1007, thus providing, for example, an indication of the angle of the patient's head with respect to the body and/or the respiration rate or amplitude. The I/O interface 1012 may be one of the types of wired or wireless interfaces described above. The system may periodically transmit detected angular and/or linear acceleration to an external monitoring system, such as a computer. ASIC 1010 may be configured to convert angular and/or linear acceleration to respiration rate, amplitude, or head-body angle. In some embodiments, the system for monitoring respiration may comprise an output device 1024, such as a sound emitting device or a vibrating device, configured to provide an alarm signal when certain conditions are met. For example, ASIC 1010 may be configured to output a wake-up signal, through the output device 1024, when the person is in a state of apnea for more than a predefined number of seconds (e.g., fifteen seconds).

The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A and/or the photovoltaic harvester described in connection with FIG. 16. Other types of energy harvesters may also be used. In some embodiments, the wireless sensor may comprise energy storage components, such as one or more supercapacitors, to store some or all the energy harvested with the energy harvester.

As another example, system $1000_D$ may be used in surgical robotics to aid surgeons in surgical procedures. System $1000_D$ may be used to measure angular and/or linear accelerations associated with the surgeon's hand movements. Such systems may be used, for example, to sense the surgeon's hand movements, and to filter out hand tremors or other unintended motions so that they are not inadvertently reproduced robotically. Alternatively, the detected angular and/or linear acceleration information may be used to proactively guide the surgeon. In such situations, system $1000_D$ may be a wired or wireless sensor and may be configured to detect angular accelerations with angular accelerometer 1002 and/or linear accelerations with linear accelerometer 1007, thus providing, for example, an indication of tremor. The I/O interface 1012 may be one of the types of wired or wireless interfaces described above. The system may periodically transmit detected angular and/or linear acceleration to an external monitoring system, such as a computer. ASIC 1010 may be configured to convert angular and/or linear acceleration to tremor. ASIC 1010 may be configured to control motor driver 1022. Motor driver 1022 may drive one or more motors to compensate for tremor.

As another example, system $1000_D$ may be used in hearing aid devices. In some instances, hearing aid devices operate in an omnidirectional mode, in which the microphone captures sounds originating from all directions. In other instances, hearing aid devices operate in a directional mode, in which the microphone primarily captures sounds originating from a particular direction. This configuration is particularly useful when speech is originated from the direction the user is facing.

Figure 25:
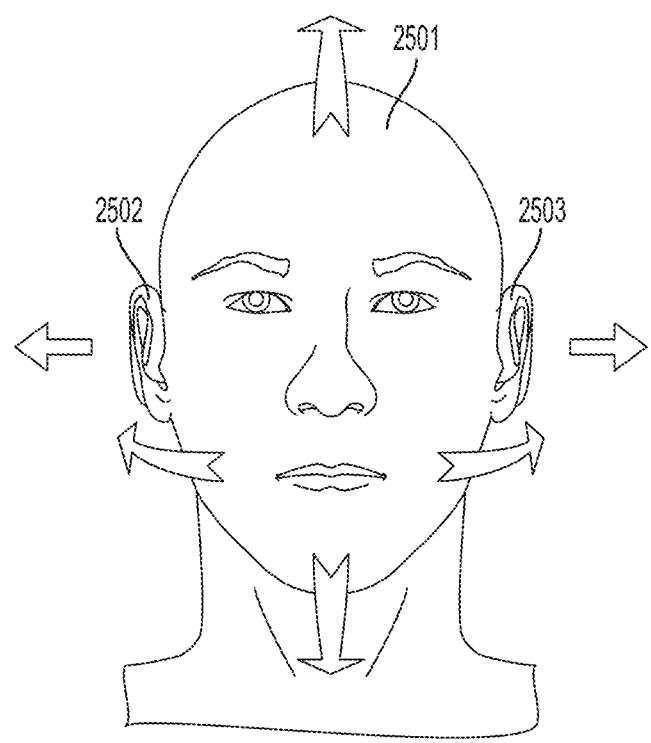
FIG. 25 is a front view of a person's head, the person wearing hearing aid devices configured to sense angular acceleration.

FIG. 25 illustrates a person 2501 wearing hearing aid devices 2502 and 2503. The hearing devices may be disposed on the person's ears in any suitable way, and may each comprise a system $1000_D$. System $1000_D$ may have an angular accelerometer 1002 configured to sense motion of the user's body. For example, the angular accelerometer may be configured to detect movements of the neck and/or the head in three dimensions (e.g., left-right flexion of the neck, front-back flexion of the neck, or left-right rotation of the neck) by detecting angular acceleration. Based on the detected angular acceleration, ASIC 1010 may be configured to provide a signal representing the position of the user's head with respect to the direction from which a sound is originated. Sensor 1014 may comprise one or more microphones, such as a microphone for the left ear hearing aid device and a microphone for the right-ear hearing aid device. The microphone(s) may be connected to an amplifier(s) in some embodiments. In some embodiments, in response to sensing the position of the user's head, ASIC 1010 may control each microphone to adjust the direction of maximum amplification toward the direction from which the sound is originated. In some embodiments, in response to sensing the position of the user's head, ASIC 1010 may control an adaptive filter to filter, at least in part, sounds originated from outside a particular direction (e.g., background noise).

In the embodiment of FIG. 25, output device 1024 may comprise one or more speakers, such as speaker for the left-ear hearing aid device and a speaker for the right-ear hearing aid device. ASIC 1010 may be configured to drive the speakers with signals representing sounds originated from the direction of maximum amplification. In some embodiments, ASIC 1010 may be configured to select one between the omnidirectional mode and the directional mode based, at least in part, of the detected position of the person's head with respect to the direction from which sound is originated.

The system $1000_D$ described herein may be used in personal sound amplifier products (PSAP), ear buds, headsets, behind-the-ear aids, on-the-ear aids, in-the-ear-aids, invisible in canal hearing aids, open-fir aids, or any other suitable devices configured to amplify sound for the hearer. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or kinetic energy harvester 1216. Other types of energy harvesters may also be used. In some embodiments, the hearing aid device may comprise energy storage components, such as one or more supercapacitors of the types described herein, to store some or all the energy harvested with the energy harvester.

Figure 26:
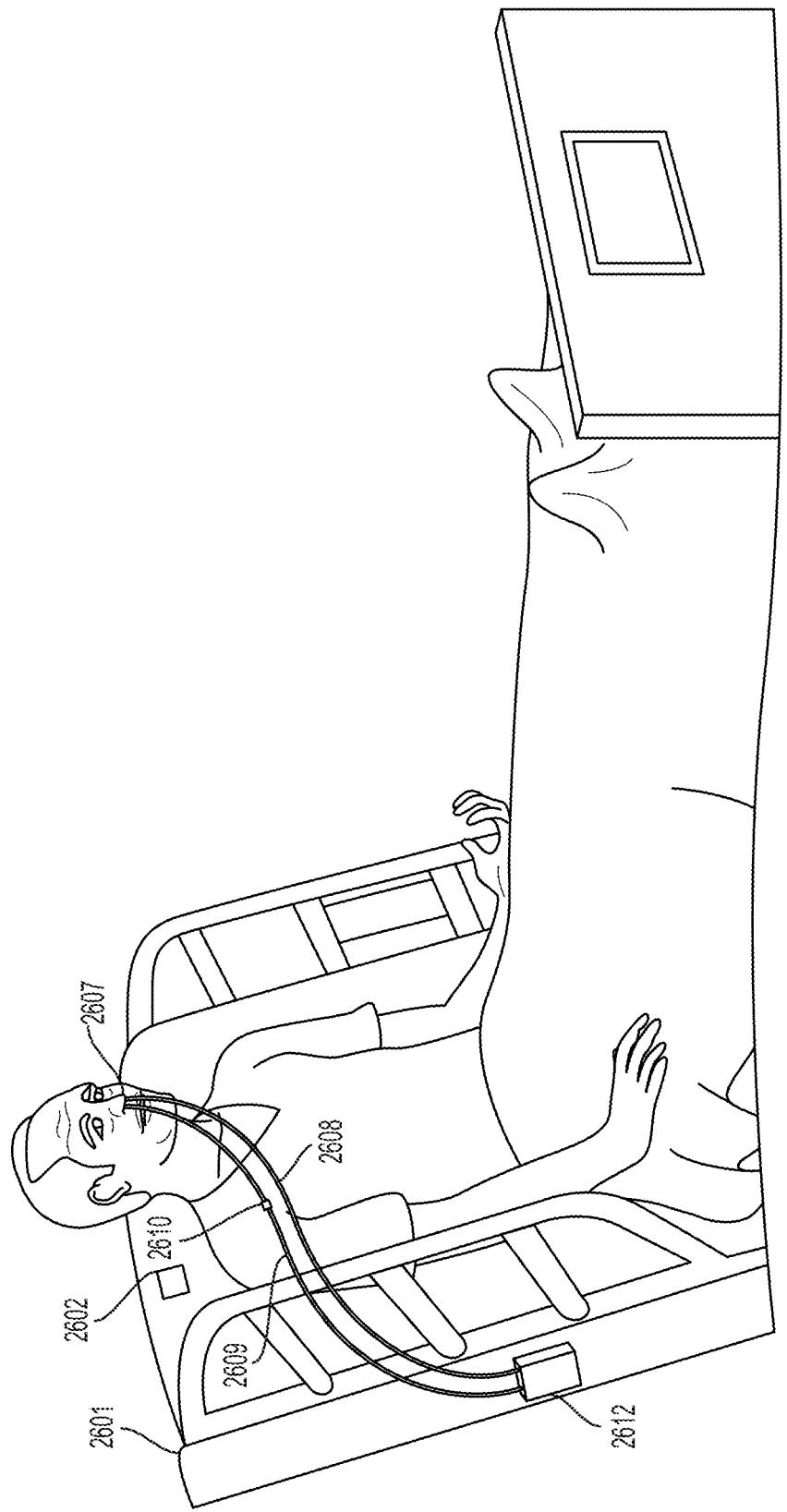
FIG. 26 illustrates a patient lying on a bed and having a pair of feeding tubes passing through the nose.

As another example, system $1000_D$ may be used in beds, such as hospital beds. System $1000_B$ may be deployed on a bed's backrest or headrest, and angular accelerometer 1002 may be configured to sense angular accelerations associated with the bed's backrest or headrest. FIG. 26 illustrates a hospital bed, according to some non-limiting embodiments. A device 2602 may be disposed on the backrest of a bed 2601. Device 2602 may comprise a system $1000_D$. Detected angular acceleration may be stored in memory 1016. ASIC 1010 may be configured to access memory 1016 to retrieve the detected angular acceleration, and to provide a signal representing the position of the backrest or headrest based, at least in part, by integrating the retrieved angular acceleration. In some embodiments, ASIC 1010 may be connected to motor driver 1022, which may control the position of the bed. In some embodiments, system $1000_D$ may form a feedback circuit configured to place the bed's backrest or headrest in a position in a desired position. The desired position may be entered by a user through user interface 1018. In some embodiments, system $1000_D$ may be disposed on a bed sheet or cover. In some embodiments, a plurality of systems $1000_D$ may be disposed on different parts of a bed sheet or cover. In such a configuration, angular accelerometer 1002 and/or linear accelerometer may be configured to sense angular and/or linear accelerations associated with a particular portion of a sheet or cover. The detected accelerations may be stored in memory 1016. ASIC 1010 may be configured to access memory 1016 to retrieve the detected accelerations, and to provide a signal representing the position of the different portions of the bed's sheet or cover, at least in part, by integrating the retrieved angular accelerations.

As another example, system $1000_D$ may be used with feeding tubes. Feeding tubes are medical devices used to provide nutrition to patients who cannot obtain nutrition by mouth, are unable to swallow safely, or need nutritional supplementation. In particular, nasogastric feeding tubes are passed through the nares, down the esophagus and into the stomach. Nasogastric feeding tubes are often used in the intensive care unit (ICU) to provide nutrition to critically ill patients while their medical conditions are addressed. System $1000_D$ may be used to monitor the position of the feeding tube with respect to the patient's nose to prevent asphyxiation. System $1000_D$ may be disposed on any suitable location along the feeding tubes, and may use angular accelerometer 1002 and/or linear accelerometer 1007 to detect angular and/or linear accelerations associated with one or more portions of the feeding tube.

Referring again to FIG. 26, a patient may be fed using feeding tubes 2608 and 2609. The feeding tubes may be passed through the nares of the patient's nose 2607. The opposite end of the tubes may be connected to a device 2612, which may be configured to provide nutrients to the patient. In some embodiments, a sensor 2610 may be disposed on a feeding tube, such as feeding tube 2609. Sensor 2610 may be configured to detect accelerations associated with the feeding tube. The detected accelerations may be stored in memory 1016. ASIC 1010 may be configured to retrieve the accelerations from memory 1016, and to provide signals representing the position of the feeding tubes with respect to the patient based, at least in part, by integrating the retrieved accelerations. ASIC 1010 may be connected to an output device 1024, which may comprise an alarm system, such as sound-emitting device. If ASIC 1010 determines that the position of the feeding tubes is dangerous, ASIC 1010 may control output device 1024 to emit an alarm signal.

As another example, system $1000_D$ may be used in cardiopulmonary resuscitation (CPR) systems to ensure that the CPR is performed correctly. Such system may be used, for example, to provide real-time feedback to the rescuer, by detecting rate, depth and angle of compression. The system may be deployed in a handheld device to be placed directly on the chest of the person suffering cardiac arrest. The rescuer may perform CPR on top of the handheld device. System $1000_D$ may be used to measure angular and/or linear accelerations associated with the compression. In such situations, system $1000_D$ may be configured to detect angular accelerations with angular accelerometer 1002 and/or linear accelerations with linear accelerometer 1007, thus providing, for example, an indication of rate, depth and angle of compression through ASIC 1010. ASIC 1010 may be configured to control output device 1024, such as a speaker configured to play a prerecorded voice, and/or display driver 1020. The output device and/or the display may be configured to provide real-time feedback to the rescuer to correct the compression to a proper rate, depth and angle.

As another example, system $1000_D$ may be used to monitor whether a person is standing up and/or to detect if, and when, a person has fallen down. In such a configuration system $1000_D$ may be disposed on a patch, a head band, an arm band, a wrist band, a leg band, or any suitable device configured to be applied on any suitable part of a human body. The system may be configured to detect angular and/or linear accelerations associated with the part of the body on which the system is disposed. For example, the system may be disposed on a path configured to be applied to a person's chest, and it may detect angular and/or linear accelerations associated with the person's chest with angular accelerometer 1002 and linear accelerometer 1007 respectively. Based on the detected accelerations, ASIC 1010 may be configured to determine whether the person is sitting, standing, sleeping or has fallen down. The I/O interface 1006 may be one of the types of wireless interfaces described above. The system may periodically transmit detected angular and/or linear acceleration to an external monitoring system, such as a computer, a tablet or a smartphone. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or kinetic energy harvester 1216. Other types of energy harvesters may also be used. In some embodiments, the wireless sensor may comprise energy storage components, such as one or more supercapacitors, to store some or all the energy harvested with the energy harvester.

As another example, system $1000_D$ may be deployed in pill cameras to monitor the position of the pill once it has been implanted in a person's body. In such situations, system $1000_D$ may be configured to detect angular accelerations with angular accelerometer 1002 and/or linear accelerations with linear accelerometer 1007, thus providing, for example, an indication of the position of the pill within the body. The detected acceleration may be stored in memory 1016. ASIC 1010 may be configured to provide information regarding the position of the pill based on the detected acceleration, for example by performing integration routines. The I/O interface 1012 may be one of the types of wireless interfaces described above. The system may periodically transmit detected angular and/or linear acceleration to an external monitoring system, such as a computer. Sensor 1014 may comprise a camera. Images captured be the camera may be transmitted periodically via I/O interface 1012. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or the electrical overstress harvester described in connection with FIG. 15A. Other types of energy harvesters may also be used. In some embodiments, the wireless sensor may comprise energy storage components, such as one or more supercapacitors, to store some or all the energy harvested with the energy harvester.

As another example, system $1000_D$ may be deployed on doors or windows to detect the angular position of the door or window. It is often important, for home security, to determine if a door or window is open or closed, as an opening may indicate an attempted burglary. In such situations, system $1000_D$ may be configured to detect angular accelerations with angular accelerometer 1002 thus providing an indication of the angular position of the door or window. ASIC 1010 may be configured to provide the angular position of the door or window, for example by performing integration routines. The I/O interface 1012 may be one of the types of wireless interfaces described above. The system may periodically transmit detected angular and/or linear acceleration to an external monitoring system, such as a computer, tablet or smartphone. System $1000_D$ may comprise an output device 1024, such as a sound emitting device, configured to emit an alarm signal when a door or window is violated. The power unit 1050 may comprise one or more rechargeable batteries in some embodiments. Alternatively, or additionally, power unit 1050 may comprise an energy harvesting system, such as the thermoelectric energy harvester described in connection with FIG. 13A or FIG. 13B and/or the electromagnetic vibrational harvester described in connection with FIG. 14 and/or the electrical overstress harvester described in connection with FIG. 15A. Other types of energy harvesters may also be used. In some embodiments, the system may comprise energy storage components, such as one or more supercapacitors, to store some or all the energy harvested with the energy harvester.

As an example, system $1000_D$ may be used to analyze the effects that a vehicle impact may have on a human body. In this case, system $1000_D$ may be deployed on a crash test dummy. Crash test dummies are full-scale anthropomorphic test devices (ATD) that simulates the dimensions, weight proportions and articulation of the human body. Crash test dummies are typically equipped with instruments to record data about the dynamic behavior of the ATD in simulated vehicle impacts. A system $1000_D$ of the type described herein may be disposed on any suitable portion of a crash test dummy, such as a leg, an arm, the chest, the head or a shoulder. The system may be configured to detect angular and/or linear accelerations associated with the portion of the dummy on which the system is disposed in response to an impact. The angular acceleration may be detected with angular accelerometer 1002 and the linear acceleration with linear accelerometer 1007, respectively. In some embodiments, the detected accelerations may be stored in memory 1016. In some embodiments, ASIC 1010 may be configured to provide signals representing velocity of impact, crushing force, bending, folding or torque of the body, deceleration rate, or any suitable combination thereof, based, at least in part, on the detected acceleration. The I/O interface 1012 may be one of the types of wireless interfaces described above. The system may periodically transmit detected angular and/or linear acceleration to an external monitoring system, such as a computer, tablet or smartphone.

Figure 27:
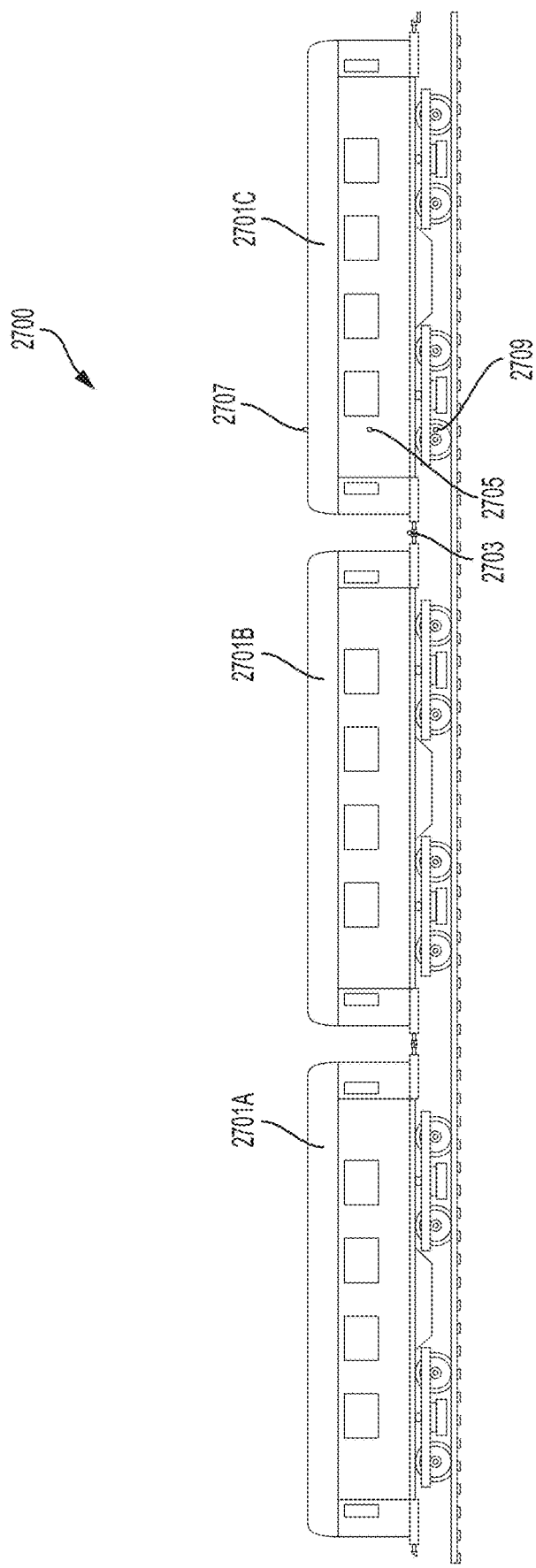
FIG. 27 is a side view of a train having a plurality of sensors configured to sense swaying motion.

As another example, system $1000_D$ may be used to monitor oscillations, such as a swaying motion of a railway vehicle, some types of which are referred to as hunting oscillations. When a train is traveling at a speed that is greater than a critical speed, some of the train's cars may oscillate. In some circumstances the amplitude of the oscillation may be large enough to damage the track and/or cause derailment. FIG. 27 illustrates a train 2700 having a plurality of cars $2701_A$, $2701_E$ and $2701_C$. A system $1000_D$ may be deployed to monitor a train's oscillations. For example, a device 2703 may comprise a system $1000_D$ and may be disposed on the coupler connecting consecutive cars, or on any suitable portion of a car, such as a side, a top or a wheelset. Alternatively, or additionally, a device 2705 may comprise a system $1000_D$ and may be disposed on a side of a car, such as car $2701_C$. Alternatively, or additionally, a device 2707 may comprise a system $1000_D$ and may be disposed on the top side of a car, such as car $2701_C$. Alternatively, or additionally, a device 2709 may comprise a system $1000_D$ and may be disposed on the wheel set of a car, such as car $2701_C$.

System $1000_D$ may be configured to detect angular accelerations and linear accelerations arising on a car in response to oscillations, such as hunting oscillations. The angular acceleration may be detected with angular accelerometer 1002 and the linear acceleration with linear accelerometer 1007, respectively. In some embodiments, ASIC 1010 may convert the detected acceleration to a quantity representing the amplitude of the oscillation. In some embodiments, ASIC 1010 may compare the computed amplitude of the oscillation with a threshold value stored in memory 1016. If the amplitude of the oscillation has an amplitude that is greater than the threshold, ASIC 1010 may be configured to control an output device 1024 to provide an alarm signal. Output device 1024 may comprise, for example, a display or an indicator placed in the driver's compartment of the locomotive. I/O interface 1012 may comprise a wired or wireless interface connecting ASIC 1010 to output device 1024. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or the electrical overstress harvester described in connection with FIG. 15A and/or the kinetic energy harvester 1216. Other types of energy harvesters may also be used. In some embodiments, the system may comprise energy storage components, such as one or more supercapacitors, to store some or all the energy harvested with the energy harvester.

As another example, system 1000$_D$ may be used in connection with video games. For example, system 1000$_D$ may be disposed on a joypad, joystick, game pad or any other suitable type of game controller. Alternatively, or additionally, system 1000$_D$ may be disposed on a wearable device, such as a virtual reality (VR) headset, goggles, glove, wrist band, head band, leg band or a foot pod. In some circumstances, a video game may be controlled by movements performed by a player. System 1000$_D$ may be configured to detect angular and/or linear accelerations associated with the part of the player's body on which the system is disposed. Angular acceleration may be detected with angular accelerometer 1002 and linear accelerations may be detected with linear accelerometer 1007. ASIC 1010 may be configured to, in response to receiving the detected acceleration, control the dynamic of the video game. By way of example and not limitation, ASIC 1010 may control the movements of a vehicle, such as a virtual car, bicycle, motorbike, airplane, helicopter, drone, boat, train, or the movements of an avatar, such as a virtual athlete, warrior or a soldier.

As another example, system 1000$_D$ may be used to detect motion of a vehicle, such as a train or a car. In such a configuration, system 1000$_D$ may be disposed on any part of the vehicle configured to rotate, such as a wheel or a drive shaft. Angular accelerometer 1002 may be configured to detect angular accelerations associated with the vehicle's part on which system 1000$_D$ is disposed. In some embodiments, ASIC 1010 may be configured to receive the detected angular acceleration, and may be configured to transmit a signal, via I/O interface 1012, to an output device 1024. The output device may comprise a screen or an indicator disposed, for example, in a train station, and may signal whether a train is moving and/or how fast is traveling. Alternatively, or additionally, ASIC 1010 may be configured to transmit, via I/O interface 1012, a signal representing the detected angular acceleration to an external monitoring system, such as a computer. The I/O interface 1012 may be one of the types of wireless interfaces described above. The power unit 1050 may comprise one or more rechargeable batteries in some embodiments. Alternatively, or additionally, power unit 1050 may comprise an energy harvesting system, such as the electromagnetic vibrational harvester described in connection with FIG. 14 and/or the kinetic energy harvester 1216. Other types of energy harvesters may also be used. In some embodiments, the system may comprise energy storage components, such as one or more supercapacitors, to store some or all the energy harvested with the energy harvester.

The systems 1000$_A$-1000$_D$ may be used in machine health monitoring applications. For example, the performance and/or state of machinery may be monitored using systems of the types described herein to assess whether the machinery is operating appropriately, whether maintenance is needed, how efficiently the machinery is operating, or for other reasons. Some machinery or industrial equipment may be subject to flexure during use or simply over time, for example as a part deforms. The flexure may be ascertained from changes in angular acceleration. For example turbines (e.g., wind turbine blades), airplane wings, and oil and gas equipment, including drilling, boring and pumping equipment, may be subject to flexure. Systems 1000$_A$-1000$_D$ may be affixed or embedded within such equipment at a suitable location to detect changes in rotation or degrees of flexure as may be assessed from angular acceleration. In some instance, such information may be used to assess deformation of the equipment, and may therefore be used to assess the existence or possibility of equipment failure.

The types of industrial equipment described above may also include one or more components which may rotate. For example, oil and gas drilling and pumping equipment may include various rotating components. The systems 1000$_A$-1000$_D$ may be used to assess the rotation, or lack thereof, to provide an indication of the equipment performance.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A fluidic sensor comprising:
   a channel that is part of the fluidic sensor;
   a corrugated region formed in the channel and configured to create turbulence in a fluid flowing in the channel;
   an inertial sensor disposed in proximity to the corrugated region and configured to detect motion of the fluid caused by the turbulence; and
   read-out circuitry configured to determine a viscosity of the fluid based on the detected motion.

2. The fluidic sensor of claim 1, wherein the inertial sensor comprises an angular accelerometer configured to detect angular motion of the fluid caused by the turbulence, and wherein the read-out circuitry is configured to determine the viscosity of the fluid based on the detected angular motion.

3. The fluidic sensor of claim 1, wherein the inertial sensor comprises a linear accelerometer configured to detect linear motion of the fluid caused by the turbulence, and wherein the read-out circuitry is configured to determine the viscosity of the fluid based on the detected linear motion.

4. The fluidic sensor of claim 1, further comprising an energy harvester configured to power the read-out circuitry.

5. The fluidic sensor of claim 1, further comprising a wireless input/output (I/O) interface configured to transmit data indicative of the viscosity of the fluid to an external device.

6. A fluidic sensor comprising:
   a channel that is part of the fluidic sensor;
   a corrugated region formed in the channel and configured to create turbulence in a fluid flowing in the channel;
   an angular accelerometer disposed in proximity to the corrugated region, the angular accelerometer being configured to detect angular motion of the fluid flowing in the channel, and
   read-out circuitry configured to determine a viscosity of the fluid based on the detected angular motion.

7. The fluidic sensor of claim 6, further comprising a linear accelerometer disposed in proximity to the channel, the linear accelerometer being configured to detect linear motion of the fluid, wherein the read-out circuitry is configured to determine the viscosity of the fluid based on both the detected angular motion and the detected linear motion.

8. The fluidic sensor of claim 6, wherein the angular accelerometer comprises:
   a substrate;
   an anchor mounted to the substrate and extending substantially along a first axis; and
   a proof mass connected to the anchor via one or more hinges and configured to rotate about the first axis in response to the angular motion of the fluid.

9. The fluidic sensor of claim 6, further comprising an energy harvester configured to power the read-out circuitry.

10. The fluidic sensor of claim 6, further comprising a wireless input/output (I/O) interface configured to transmit data indicative of the viscosity of the fluid to an external device.

11. A fluidic sensor comprising:
   a channel that is part of the fluidic sensor;
   a corrugated region formed in the channel and configured to create turbulence in a fluid flowing in the channel;
   an inertial sensor disposed in proximity to the corrugated region and configured to detect motion of the fluid caused by the turbulence;
   read-out circuitry configured to determine a viscosity of the fluid based on the detected motion; and
   a wireless input/output (I/O) interface configured to transmit data indicative of the viscosity to an external device.

12. The fluidic sensor of claim 11, wherein the inertial sensor comprises an angular accelerometer configured to detect angular motion of the fluid caused by the turbulence about one or more axes, and wherein the read-out circuitry is configured to determine the viscosity of the fluid based on the detected angular motion.

13. The fluidic sensor of claim 11, wherein the inertial sensor comprises a linear accelerometer configured to detect linear motion of the fluid caused by the turbulence along one or more axes, and wherein the read-out circuitry is configured to determine the viscosity of the fluid based on the detected linear motion.

14. The fluidic sensor of claim 11, further comprising an energy harvester configured to power the wireless I/O interface.

15. The fluidic sensor of claim 14, further comprising an energy storage system configured to store energy captured with the energy harvester, wherein the wireless I/O interface is configured to transmit the data to the external device periodically using the stored energy.

* * * * *